US011947391B2

(12) United States Patent
Borloz et al.

(10) Patent No.: US 11,947,391 B2
(45) Date of Patent: Apr. 2, 2024

(54) TABLET SUPPORT ARM STRUCTURES

(71) Applicant: GCX Corporation, Petaluma, CA (US)

(72) Inventors: Paul Rene Borloz, Petaluma, CA (US); Joshua Kawarii Littlefield, Santa Rosa, CA (US); Robert Peter Glaser, Corte Madera, CA (US)

(73) Assignee: GCX Corporation, Petaluma, CA (US)

( * ) Notice: Subject to any disclaimer, the term of this patent is extended or adjusted under 35 U.S.C. 154(b) by 0 days.

(21) Appl. No.: 17/807,992

(22) Filed: Jun. 21, 2022

(65) Prior Publication Data
US 2022/0317727 A1    Oct. 6, 2022

Related U.S. Application Data

(63) Continuation of application No. 17/112,454, filed on Dec. 4, 2020, now Pat. No. 11,397,450, which is a
(Continued)

(51) Int. Cl.
*F16M 11/08* (2006.01)
*F16M 11/04* (2006.01)
(Continued)

(52) U.S. Cl.
CPC ......... *G06F 1/1633* (2013.01); *F16M 11/046* (2013.01); *F16M 11/08* (2013.01);
(Continued)

(58) Field of Classification Search
CPC ............... F16M 11/2092; F16M 11/24; F16M 2200/063; F16M 2200/041; F16M 2200/044

See application file for complete search history.

(56) References Cited

U.S. PATENT DOCUMENTS 4,304,385 A    12/1981   Farouche et al.
4,880,193 A *  11/1989   Warshawsky ........... F21V 21/26
                                                    362/427
(Continued)

FOREIGN PATENT DOCUMENTS

CN    206055117 U    3/2017
CN    206234573 U    6/2017
(Continued)

OTHER PUBLICATIONS

European Search Report dated Feb. 15, 2021 for EP Application No. 20202716.5-1009, 9 pages.

*Primary Examiner* — Bradley Duckworth
(74) *Attorney, Agent, or Firm* — Perkins Coie LLP; Colin Fowler

(57) ABSTRACT

Structures and systems are disclosed for supporting tablets or displays. A core arm that is configured to have a range of rotation based on angle length of a track or tunnel, an angle length of a joint rotation stop structure, and an angle length of a floating stop key. The core extends from a rear end to a front end of the structure. The core arm can also include a floating stop key that is movable with the track or tunnel of the core arm structure. The structures and systems can thus be readily configured for light or heavy configurations, with or without the use of an extension arm, and can conceal cable routing, which is accessible, via snap fit covers, for easy installation and maintenance.

19 Claims, 73 Drawing Sheets

Related U.S. Application Data continuation of application No. 16/292,803, filed on Mar. 5, 2019, now Pat. No. 10,948,946.

(60) Provisional application No. 62/812,893, filed on Mar. 1, 2019, provisional application No. 62/639,358, filed on Mar. 6, 2018.

(51) Int. Cl.
  *F16M 11/10* (2006.01)
  *F16M 11/20* (2006.01)
  *F16M 11/38* (2006.01)
  *F16M 13/02* (2006.01)
  *G06F 1/16* (2006.01)
  *H05K 5/02* (2006.01)

(52) U.S. Cl.
  CPC ......... *F16M 11/10* (2013.01); *F16M 11/2014* (2013.01); *F16M 11/2021* (2013.01); *F16M 11/2064* (2013.01); *F16M 11/38* (2013.01); *F16M 13/02* (2013.01); *H05K 5/0204* (2013.01); *F16M 2200/063* (2013.01)

(56) References Cited

U.S. PATENT DOCUMENTS

| | | | |
|---|---|---|---|
| 5,123,621 A * | 6/1992 | Gates | F16M 11/2014 248/920 |
| 5,743,503 A | 4/1998 | Voeller et al. | |
| 5,975,472 A | 11/1999 | Hung | |
| 6,409,134 B1 | 6/2002 | Oddsen | |
| 6,478,274 B1 | 11/2002 | Oddsen | |
| 6,478,275 B1 | 11/2002 | Huang | |
| 6,609,691 B2 * | 8/2003 | Oddsen, Jr. | F16M 13/02 248/278.1 |
| 7,264,212 B2 | 9/2007 | Hung | |
| 7,395,995 B2 | 7/2008 | Chen | |
| 7,997,211 B2 | 8/2011 | Peterson et al. | |
| 8,469,323 B1 | 6/2013 | Deros et al. | |
| 8,794,579 B2 | 8/2014 | Sturman et al. | |
| 8,960,632 B2 | 2/2015 | Fallows | |
| 9,228,696 B2 | 1/2016 | Borloz et al. | |
| 9,277,812 B2 | 3/2016 | Bennett et al. | |
| 9,746,125 B2 | 8/2017 | Bowman et al. | |
| 9,945,498 B2 * | 4/2018 | Timoszyk | A61B 90/30 |
| 10,066,785 B1 | 9/2018 | Chen et al. | |
| 10,274,131 B2 | 4/2019 | Petts et al. | |
| 10,948,946 B2 | 3/2021 | Borloz et al. | |
| 11,397,450 B2 * | 7/2022 | Borloz | F16M 11/08 |
| 2001/0023914 A1 | 9/2001 | Oddsen | |
| 2002/0190180 A1 | 12/2002 | Cotterill | |
| 2005/0230585 A1 | 10/2005 | Hung | |
| 2007/0089648 A1 | 4/2007 | Harrison et al. | |
| 2011/0147546 A1 * | 6/2011 | Monsalve | F16M 11/2014 248/122.1 |
| 2012/0235000 A1 | 9/2012 | Borloz et al. | |
| 2014/0367137 A1 | 12/2014 | Leung | |
| 2016/0091117 A1 | 3/2016 | Boccoleri et al. | |
| 2016/0116109 A1 | 4/2016 | Borloz et al. | |
| 2016/0319986 A1 | 11/2016 | Hörndler | |
| 2017/0314731 A1 | 11/2017 | Glaser et al. | |
| 2018/0340644 A1 | 11/2018 | Bowman et al. | |
| 2018/0356031 A1 | 12/2018 | Zebarjad et al. | |
| 2018/0372268 A1 | 12/2018 | Hung | |
| 2019/0086022 A1 | 3/2019 | Anderson et al. | |
| 2020/0278074 A1 | 9/2020 | Borloz et al. | |

FOREIGN PATENT DOCUMENTS

| | | |
|---|---|---|
| CN | 108980588 A | 12/2018 |
| JP | 2005264972 A | 9/2005 |
| WO | 2009012379 A2 | 1/2009 |

* cited by examiner

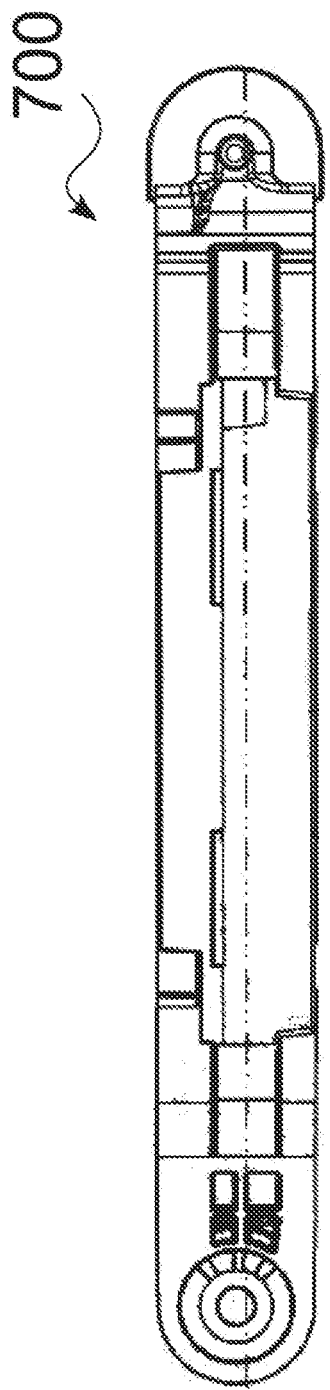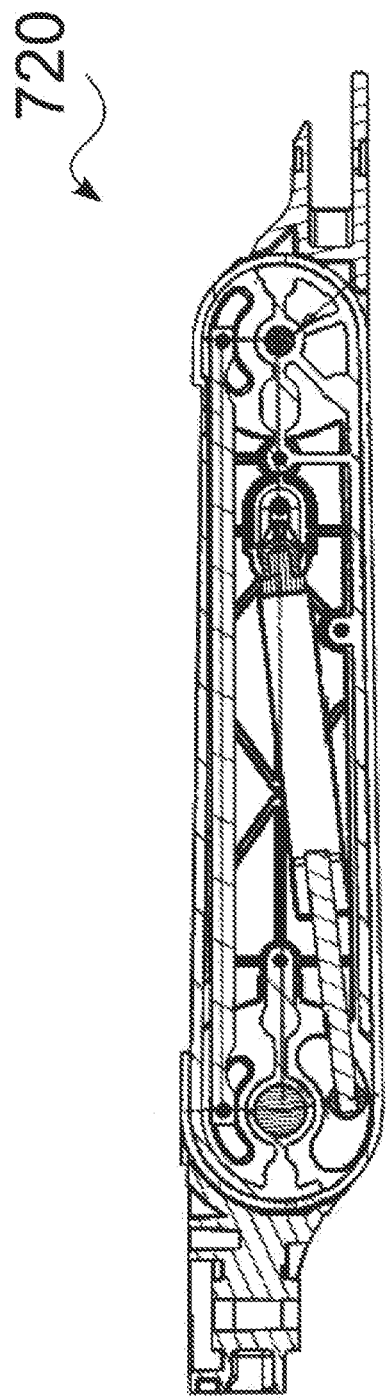

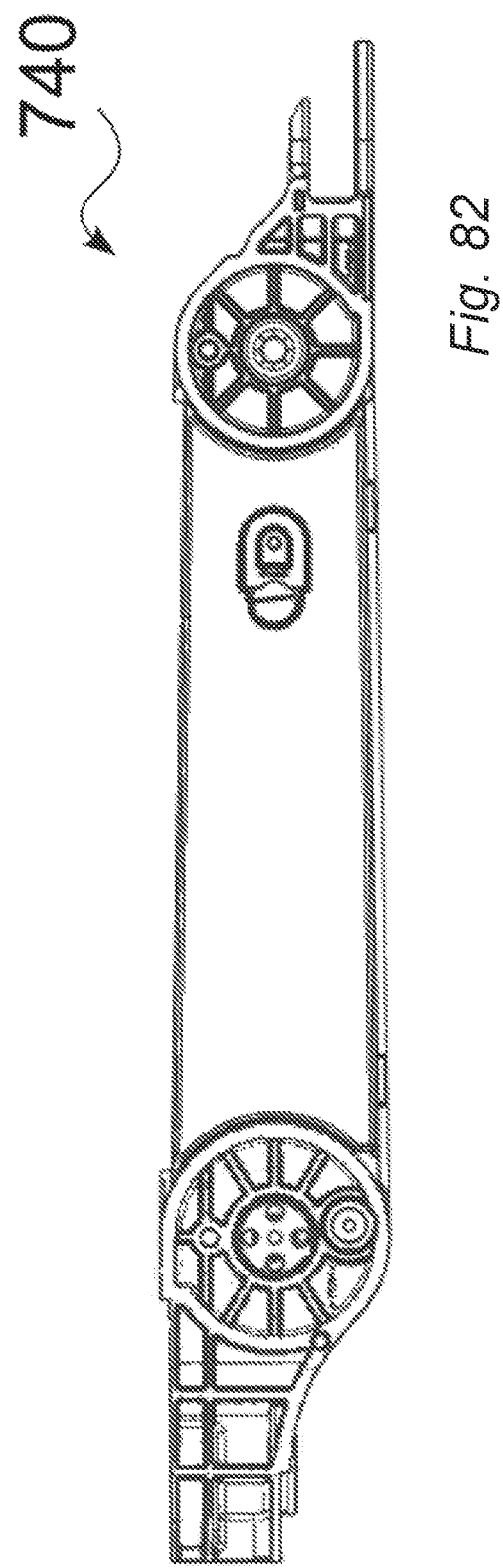

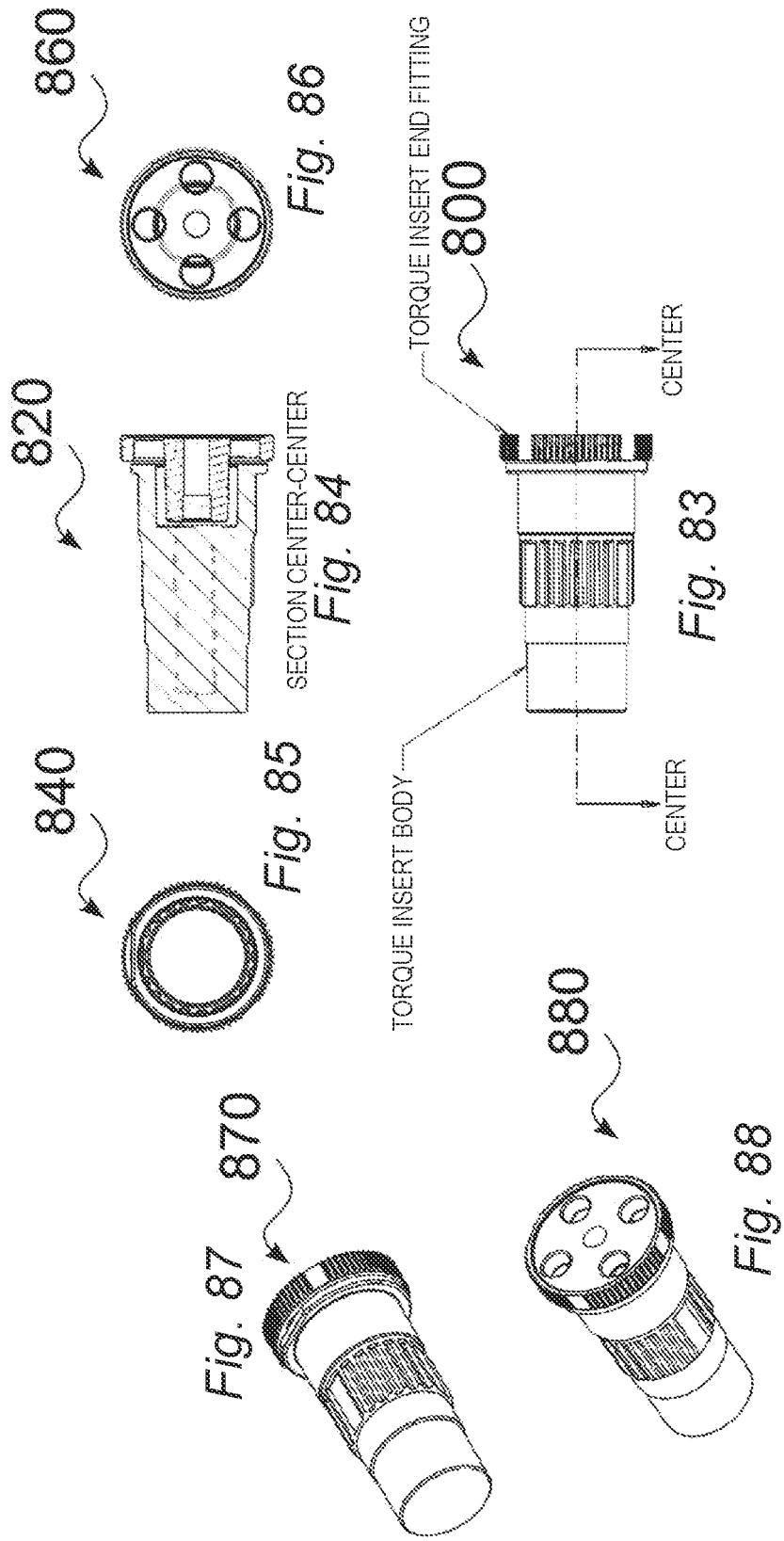

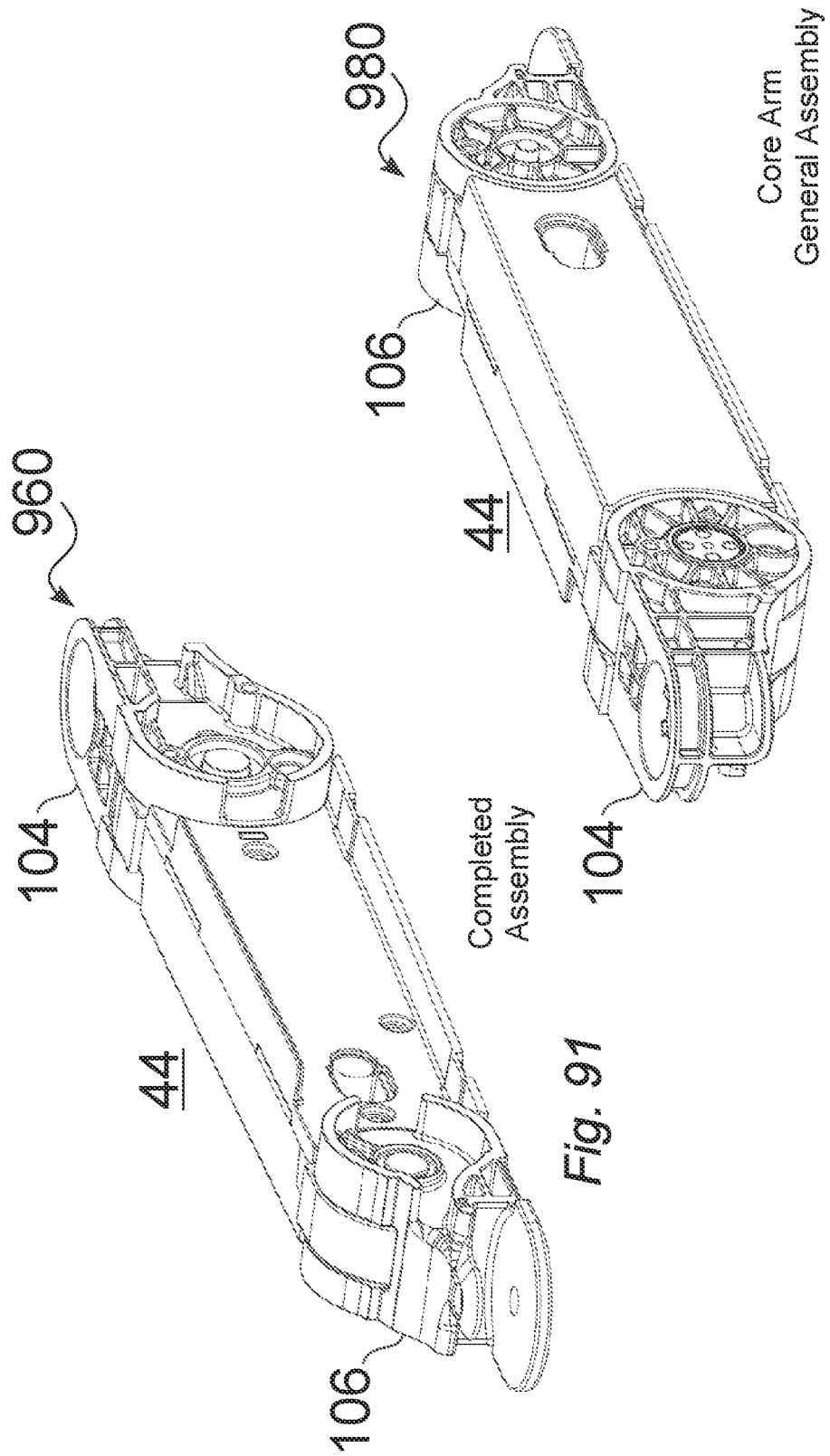

TABLET SUPPORT ARM STRUCTURES

CROSS REFERENCE TO RELATED APPLICATIONS

This Application is a continuation of U.S. patent application Ser. No. 17/112,454, filed on Dec. 4, 2020, which is a continuation application of U.S. patent application Ser. No. 16/292,803, filed on Mar. 5, 2019, which claims priority to U.S. Provisional App. No. 62/659,358, filed Mar. 6, 2018, and from U.S. Provisional App. No. 62/812,893, filed Mar. 1, 2019, which are each incorporated herein in its entirety by this reference thereto.

FIELD OF THE INVENTION

At least one embodiment of the present invention pertains to tablet support structures, systems and methods of assembly, operation, and service.

BACKGROUND

While mounting arm structures have previously been used to support screens, such as display screens and computer screens, it is often difficult to support different loads, and to position the screen at different heights, within a work environment. As well, it is often difficult to rotate or pivot the supported screen at a desired position.

Furthermore, such screens are often used within a wide variety of work environments, such as within hospitals or other medical or dental facilities, in which cleanliness is important. As it is often required to connect power and/or other cabling to support arms, it is difficult to establish and maintain a sterile environment.

BRIEF DESCRIPTION OF THE DRAWINGS

One or more embodiments of the present invention are illustrated by way of example and not limitation in the figures of the accompanying drawings, in which like references indicate similar elements.

FIG. 80 is a top view showing illustrative body structure details of a core arm.

FIG. 81 is a partial side cutaway view showing illustrative body structure details of a core arm.

FIG. 82 is a side view showing illustrative body structure details of a core arm.

FIG. 83 is a detailed side view of an illustrative torque insert for a core arm.

FIG. 84 is a partial cutaway view of an illustrative torque insert for a core arm.

FIG. 85 is a lead end view of an illustrative torque insert for a core arm.

FIG. 86 is a head end view of an illustrative torque insert for a core arm.

FIG. 87 is a detailed view of an illustrative torque insert for a core arm.

FIG. 88 is an alternate detailed view of an illustrative torque insert for a core arm.

FIG. 91 is a first completed assembly view of an illustrative core arm.

FIG. 92 is a second completed assembly view of an illustrative core arm.

DETAILED DESCRIPTION

Figure 1:
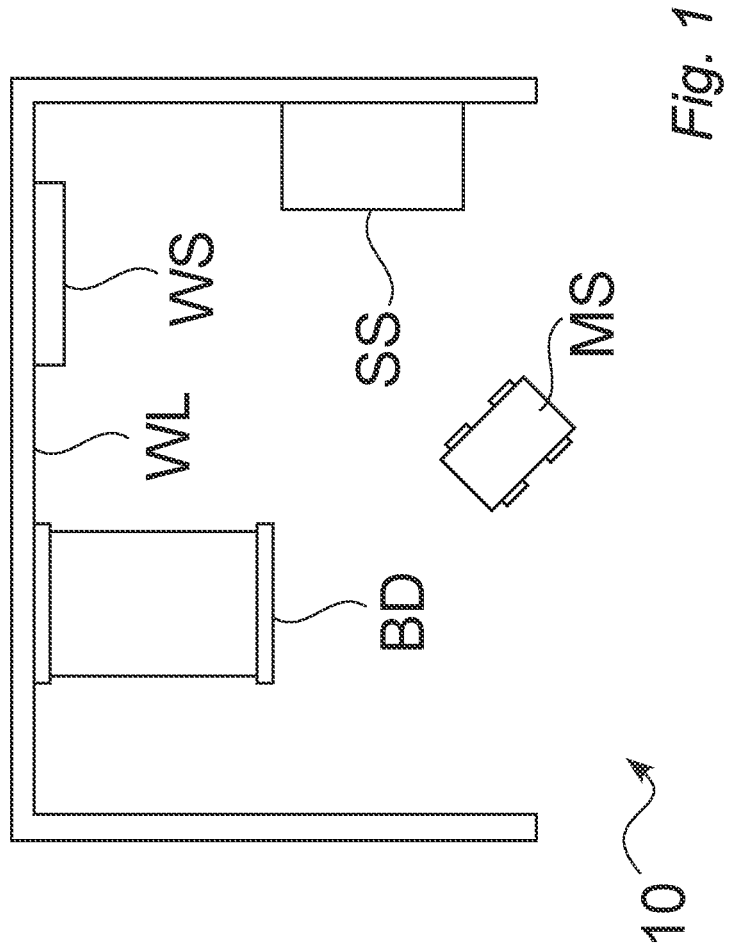
FIG. 1 shows a first illustrative environment in which a tablet arm apparatus and system can be used.

References in this description to "an embodiment", "one embodiment", or the like, mean that the particular feature, function, structure or characteristic being described is included in at least one embodiment of the present invention. Occurrences of such phrases in this specification do not necessarily all refer to the same embodiment. On the other hand, the embodiments referred to also are not necessarily mutually exclusive.

Various illustrative embodiments will now be described. The following description provides certain specific details for a thorough understanding and enabling description of these examples. One skilled in the relevant technology will understand, however, that some of the disclosed illustrative embodiments may be practiced without many of these details.

Likewise, one skilled in the relevant technology will also understand that some of the embodiments may include many other obvious features not described in detail herein. Additionally, some well-known structures or functions may not be shown or described in detail below, to avoid unnecessarily obscuring the relevant descriptions of the various examples.

The terminology used below is to be interpreted in its broadest reasonable manner, even though it is being used in conjunction with a detailed description of certain specific examples of the embodiments. Indeed, certain terms may even be emphasized below; however, any terminology intended to be interpreted in any restricted manner will be overtly and specifically defined as such in this Detailed Description section.

Introduced here are devices, structures, systems and associated methods for supporting a tablet display within an environment, such as within a hospital or other medical, dental or testing facility. The mounting structures and systems can be mounted in a variety of manners, such as a fixed mounting to a wall, a mounting through an intermediate channel, and/or mounting to stationary or moveable equipment or structures.

Improved support structures and systems are disclosed for installing tablet devices, display screens, flat screen monitors, or medical devices within a wide variety of environments. A core arm extends from a rear end, toward a front end, in which the rear end is configured to be pivotably mounted either directly to a mount structure, or to an extension arm that in turn is mounted to a mount structure. The front end is configured to be pivotably mounted to a front end panel mount structure.

The central core arm can be configured to use a non-adjustable gas spring counterbalance force with a non-adjustable friction pack element for up/down resistance, to support a range of payloads. In some embodiments, the gas spring counterbalance can be set for about the middle of the payload range, wherein friction can be used to offset the sink or float that would otherwise occur for lighter or heavier payloads. With embodiments that include these features, there is relatively more friction in the arm, which results in different user experience and engineering considerations.

As such, some embodiments of the structures and systems can thus be readily configured for light or heavy configurations, with or without the use of an extension arm, and can provide fully concealed cable routing, in which one or more cables are readily accessible, via snap fit covers, for easy installation and maintenance, which can provide a clean structure that can readily be serviced and cleaned as desired.

Some embodiments include joint rotation stop structures that comprise a floating stop key, including stop faces that are movable within a predetermined range, using stop key stop faces that can float. The floating stop key is movable, such as within a track or tunnel that is dynamically formed by the pivoting pieces.

In some embodiments, the joint rotation stop structures can be implemented to limit unwanted rotation of an articulated support arm, such as to reduce the risk of collisions with other objects. In embodiments that are implemented for support arm structures having integrated power and/or signal cables, the joint rotation stop structures can be implemented to prevent such cables from winding up around the joints and breaking.

In an illustrative embodiment of a support arm that includes a core arm, the joint rotation stop structure can be configured to allow the core arm to pivot a full 360 degrees (+/−180 degrees).

Figure 2:
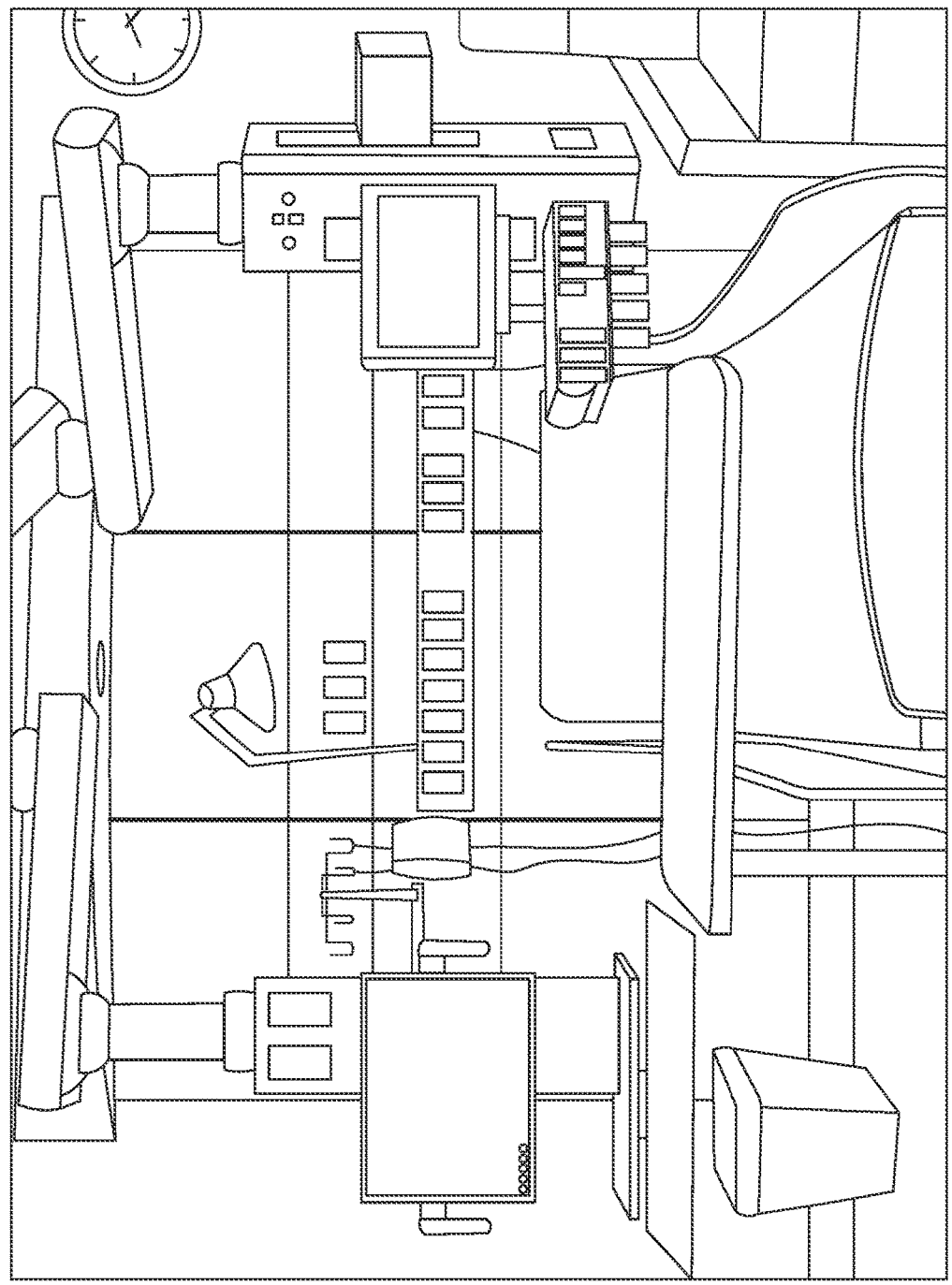
FIG. 2 shows a second illustrative environment in which a tablet arm apparatus and system can be used.
Figure 3:
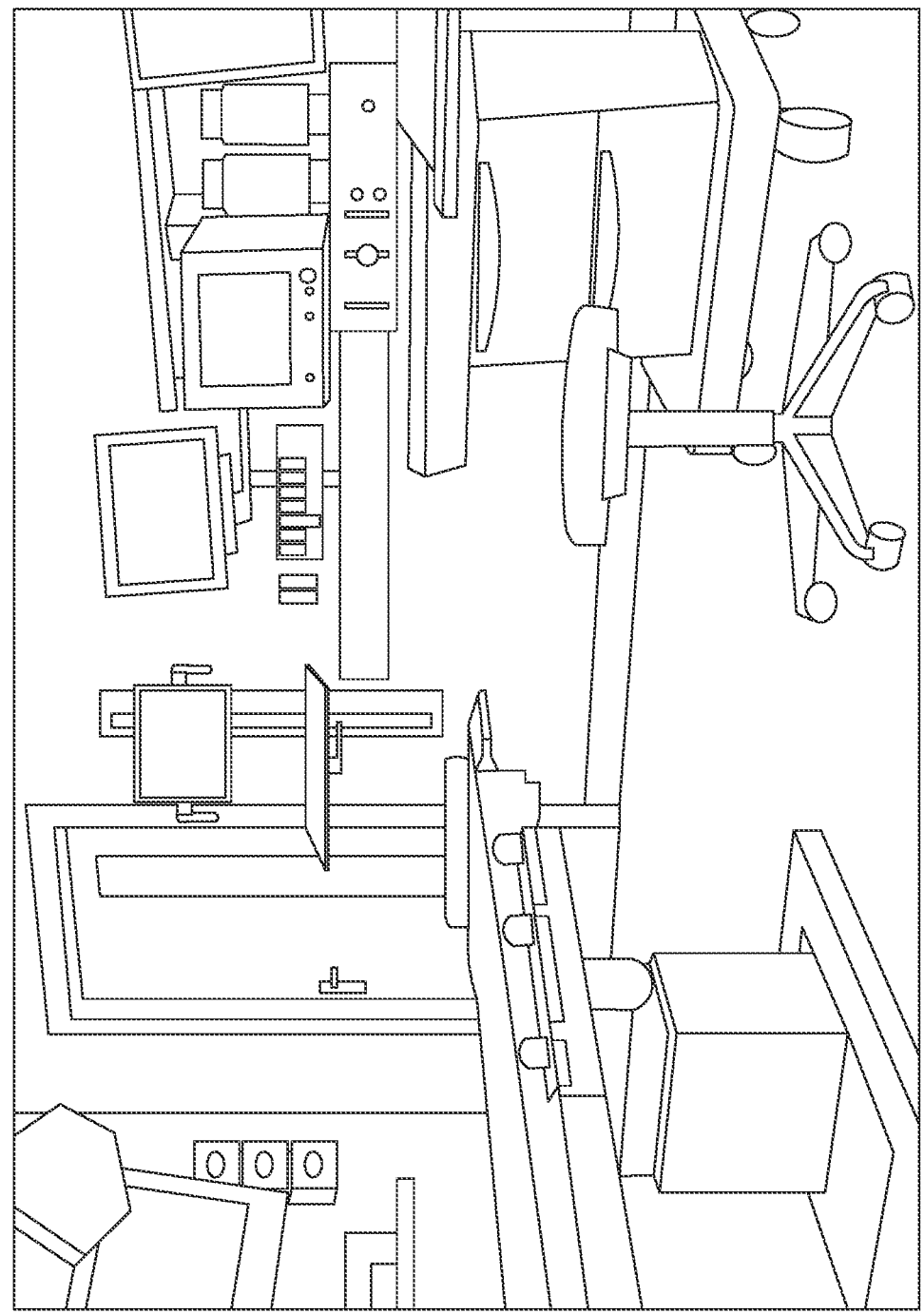
FIG. 3 shows an illustrative work environment, such as a medical facility, in which the tablet arm apparatus and system can be implemented, such as for any of direct mounting to a wall, mounting to a modular wall structure, or mounting to a stationary or a movable structure.

FIG. 1 and FIG. 2 show illustrative environments 10,20 in which a tablet arm apparatus and system can be used. FIG. 3 shows an illustrative work environment 30, such as a medical facility, in which the tablet arm apparatus and system can be implemented, such as for any of direct mounting to a wall WL, mounting to a modular wall structure SW, or mounting to a stationary structure SS or to a movable structure MS. While the illustrative work environments 10, 20, 30 are generally related to medical facilities, such as any of hospitals, medical or dental offices, clinics, laboratories, operating rooms, or other diagnostic, treatment, therapy, or recovery areas, the structures, systems and methods disclosed herein can readily be used for a wide variety of other applications.

Figure 4:
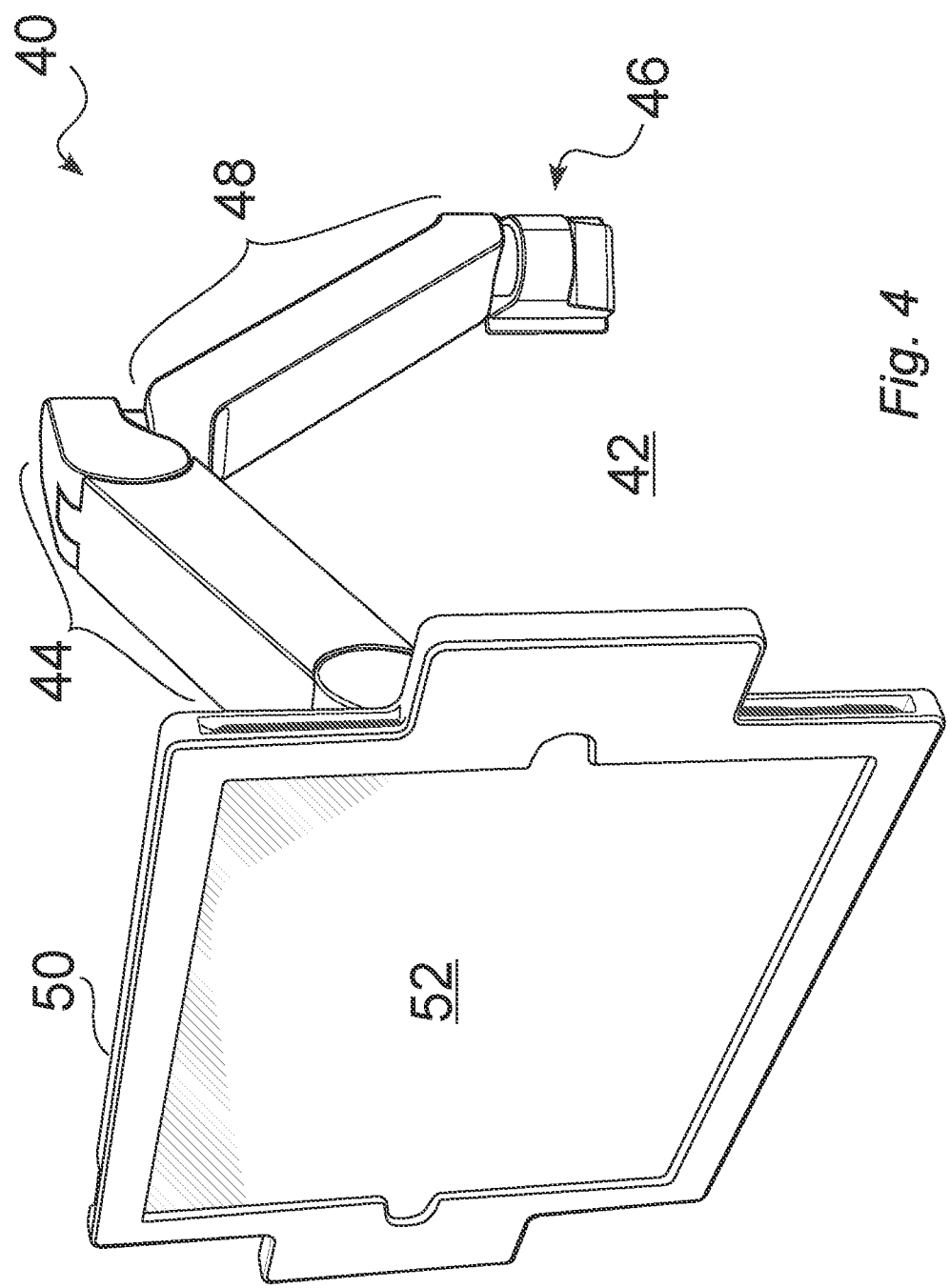
FIG. 4 is a front view of a tablet or screen mounted to an illustrative tablet arm, such as with an intermediate mounting frame, in which the illustrative tablet arm includes an extension arm.
Figure 33:
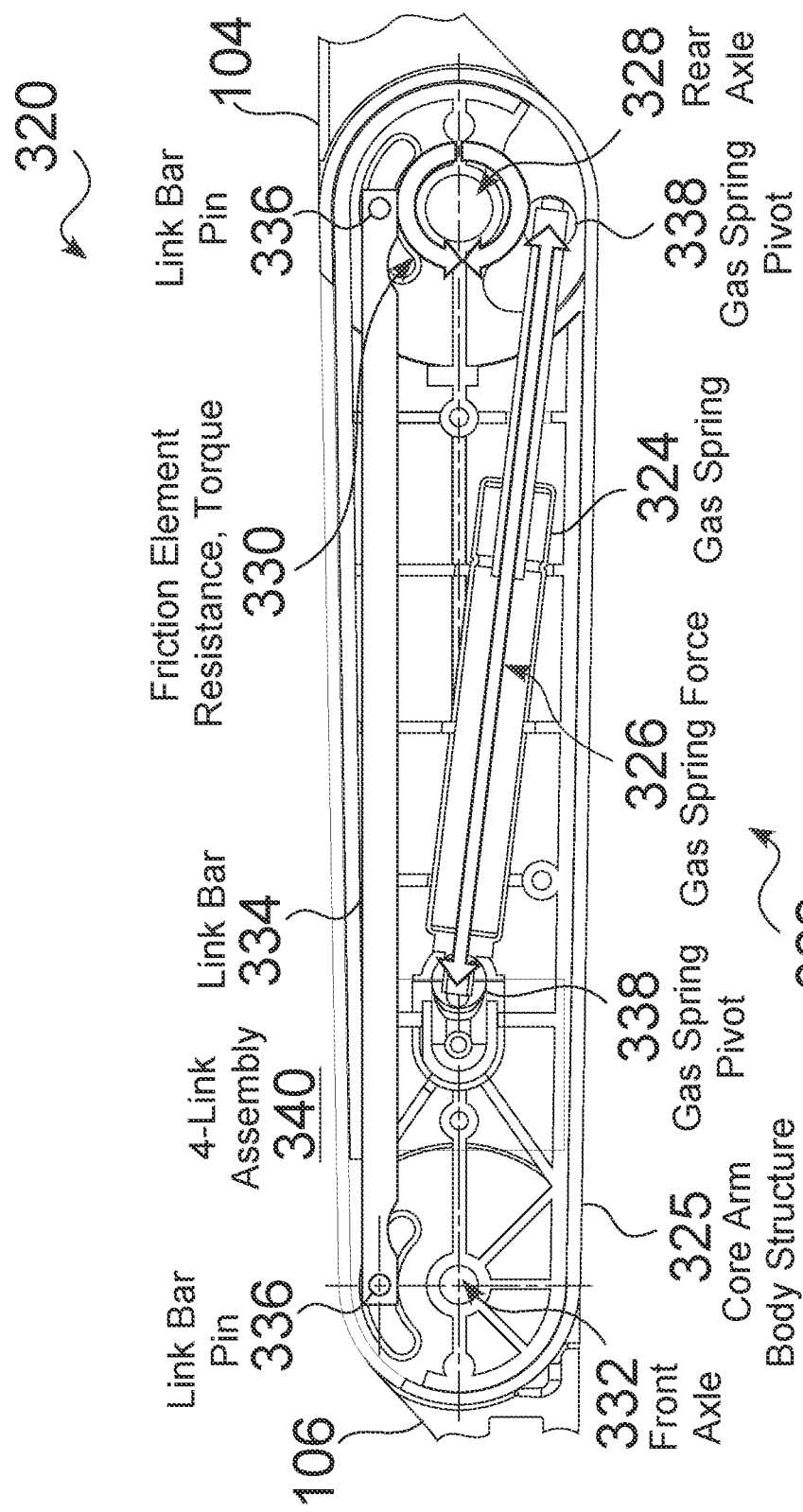
FIG. 33 is a partial cutaway view of an adjustable support arm structure for an illustrative tablet arm, in which the adjustable support arm includes both a gas spring, as well as a friction element, in which the friction element provides resistance and torque.

FIG. 4 is a front view 40 of a tablet, display or screen 52 mounted to an illustrative tablet arm 42, such as with an intermediate mounting frame 50, in which the illustrative tablet arm 42 includes an extension arm 48. In the illustrative embodiment seen in FIG. 4, the intermediate mounting frame 50 can be configured to contain and surround a tablet display device 52, while providing a secure connection to the mounting arm 42. One or more cables 130 (FIG. 8) can be run internally through the support arm structure 42, from the front tablet mount 59 (FIG. 5), i.e., from the tablet 52, to the rear, i.e., mounting end 46, wherein the cabling 130 can be used to transfer power and/or send and receive data. The tablet arm 42 includes a core arm 44 that extends from a front end toward a rear end 46, and is configured to balance a mounted device 52, e.g., a tablet 52, within designed force-to-move limits. In typical embodiments, the core arm 44 is configured with a combination of friction 330 (FIG. 33)

and spring forces 326 (FIG. 33), such that the core arm 44 does not require counterbalance adjustment.

Figure 5:
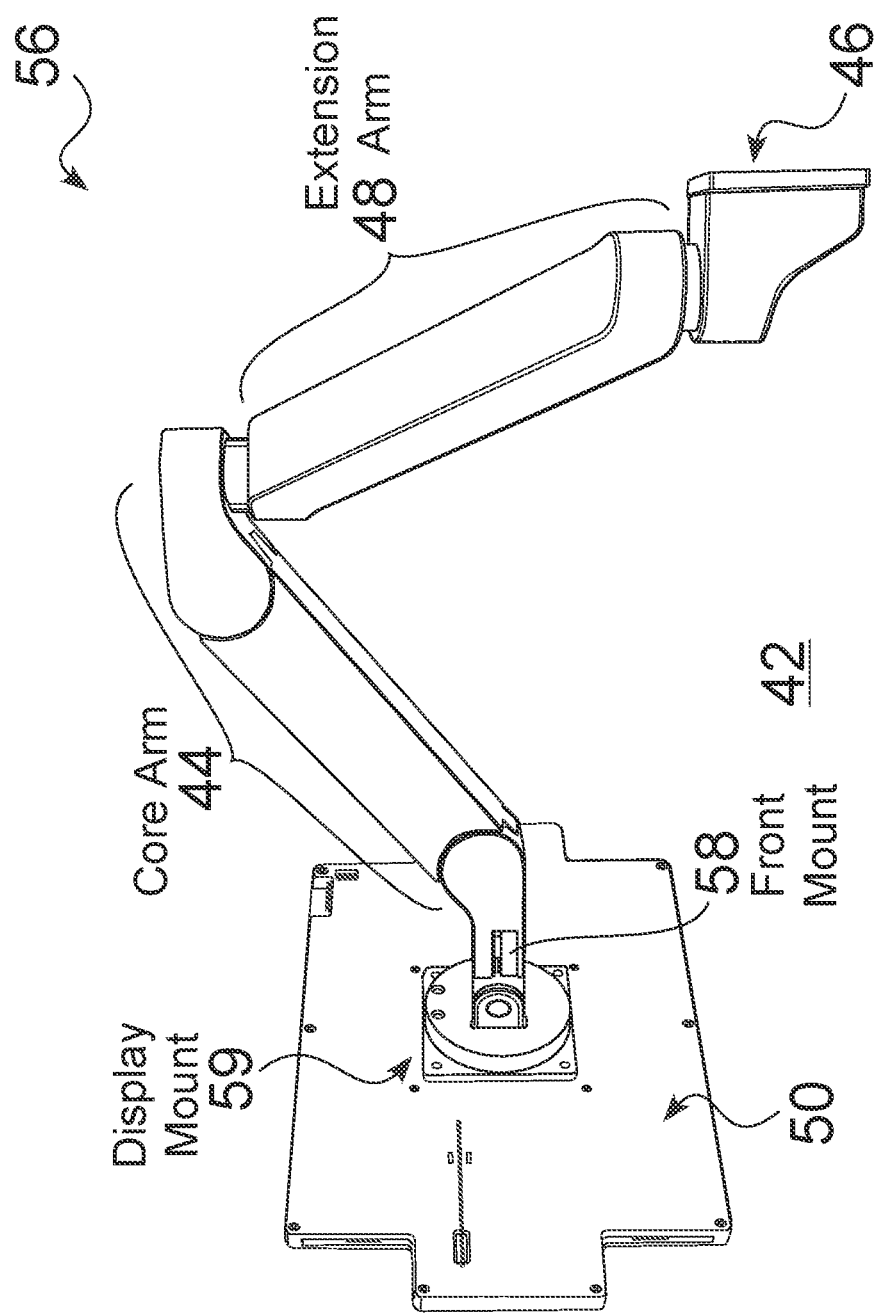
FIG. 5 is a rear view of a tablet or screen mounted to an illustrative tablet arm, such as with an intermediate mounting frame, in which the illustrative tablet arm includes an extension arm.

FIG. 5 is a rear view 56 of a tablet or screen 52 (FIG. 4) mounted to an illustrative tablet arm 42, e.g., 42*b*, such as with an intermediate mounting frame 50, in which the illustrative tablet arm 42 seen in FIG. 5 includes an extension arm 48.

Figure 6:
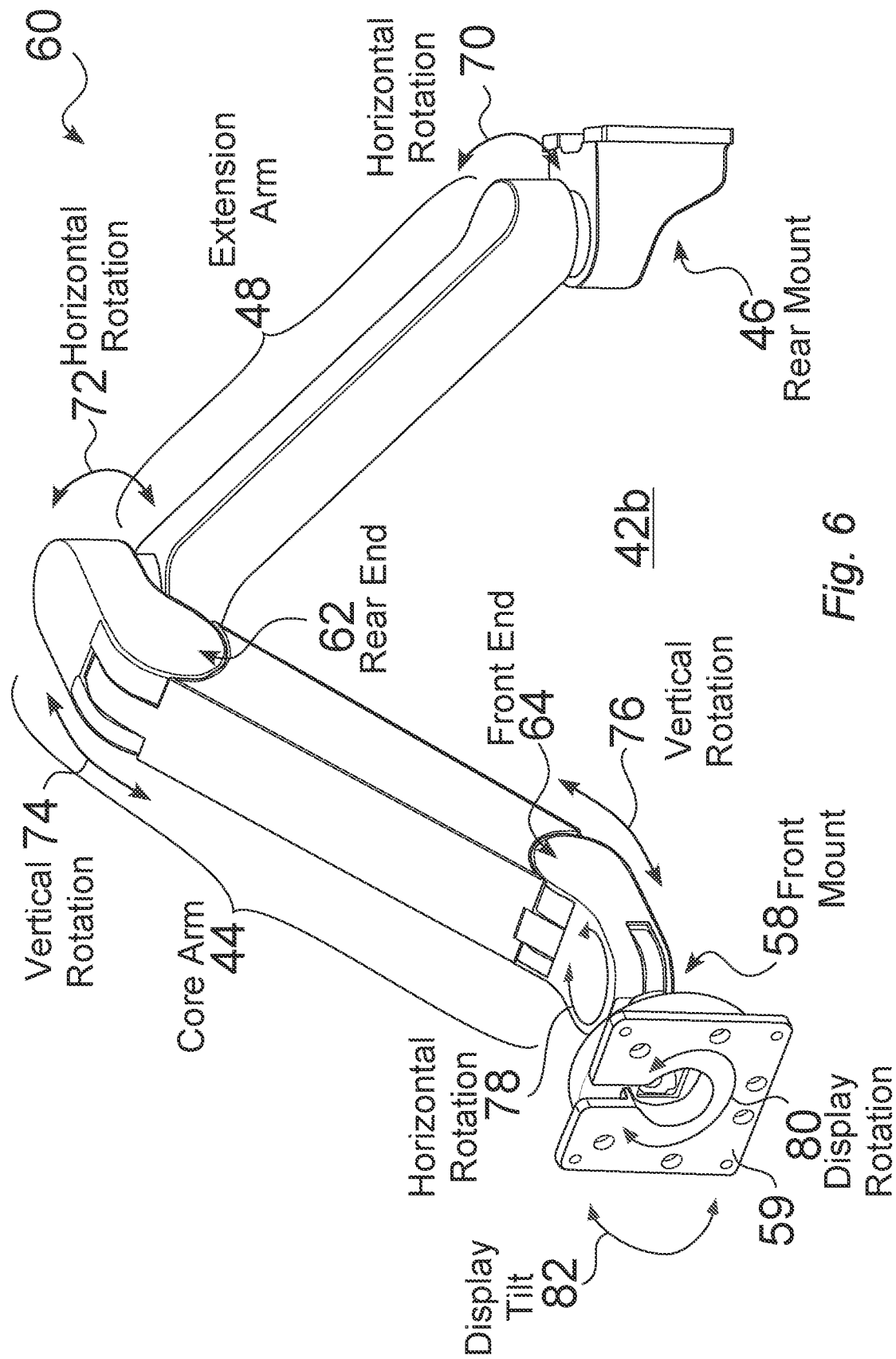
FIG. 6 is a front view of an illustrative tablet arm, which includes an extension, which can be implemented for light or heavy applications.

FIG. 6 is a front view 60 of a base configuration of an illustrative tablet arm 42*b* having an extension arm 48, which can be implemented for light or heavy applications. The illustrative tablet arm 42*b* seen in FIG. 6 can be positioned in a wide variety of positions; for instance:

- the extension arm 48 can be rotated horizontally 70 about the rear mount 46;
- the rear end 62 of the core arm 44 can be rotated horizontally 72 about the extension arm 48;
- the core arm 44 can be rotated vertically 74,76 in relation to the extension arm 48;
- the front mount 58 can be rotated generally horizontally 78 from the front end 64 of the core arm 44;
- the front mount 58 and attached tablet 52 can be vertically tilted 82, such as to improve line of sight and/or to reduce reflection, at a desired elevation; and/or
- the orientation of the attached tablet display 52 can be rotated 80 (e.g., from landscape to portrait; e.g., 0 degrees plus or minus a range (such as 0 plus or minus 90 or 135 degrees). In some embodiments, the orientation 80 can be locked, such as by a screw or detent.

Figure 7:
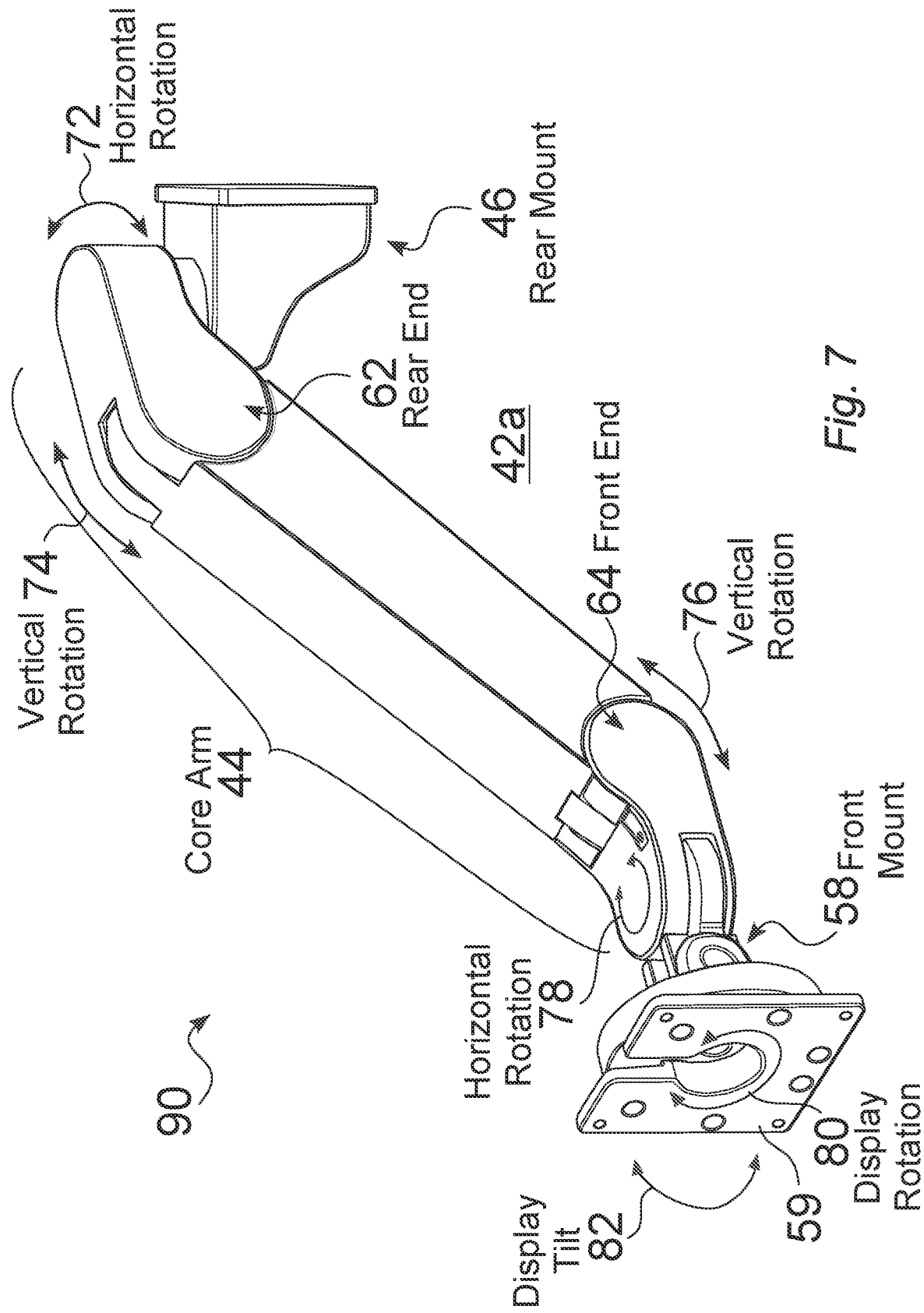
FIG. 7 is a front view of a base configuration of an illustrative tablet arm, which does not include an extension, which can be implemented for light or heavy applications.

FIG. 7 is a front view 90 of a base configuration of an illustrative tablet arm 42*a* that does not include an extension arm 48, which can be implemented for light or heavy applications. The illustrative tablet arm 42*a* seen in FIG. 7 can also be positioned in a variety of positions as desired, such as including any of horizontal rotation 72,78, vertical rotation 74,76, and/or tablet display rotation 80 and/or tilting 82.

Figure 8:
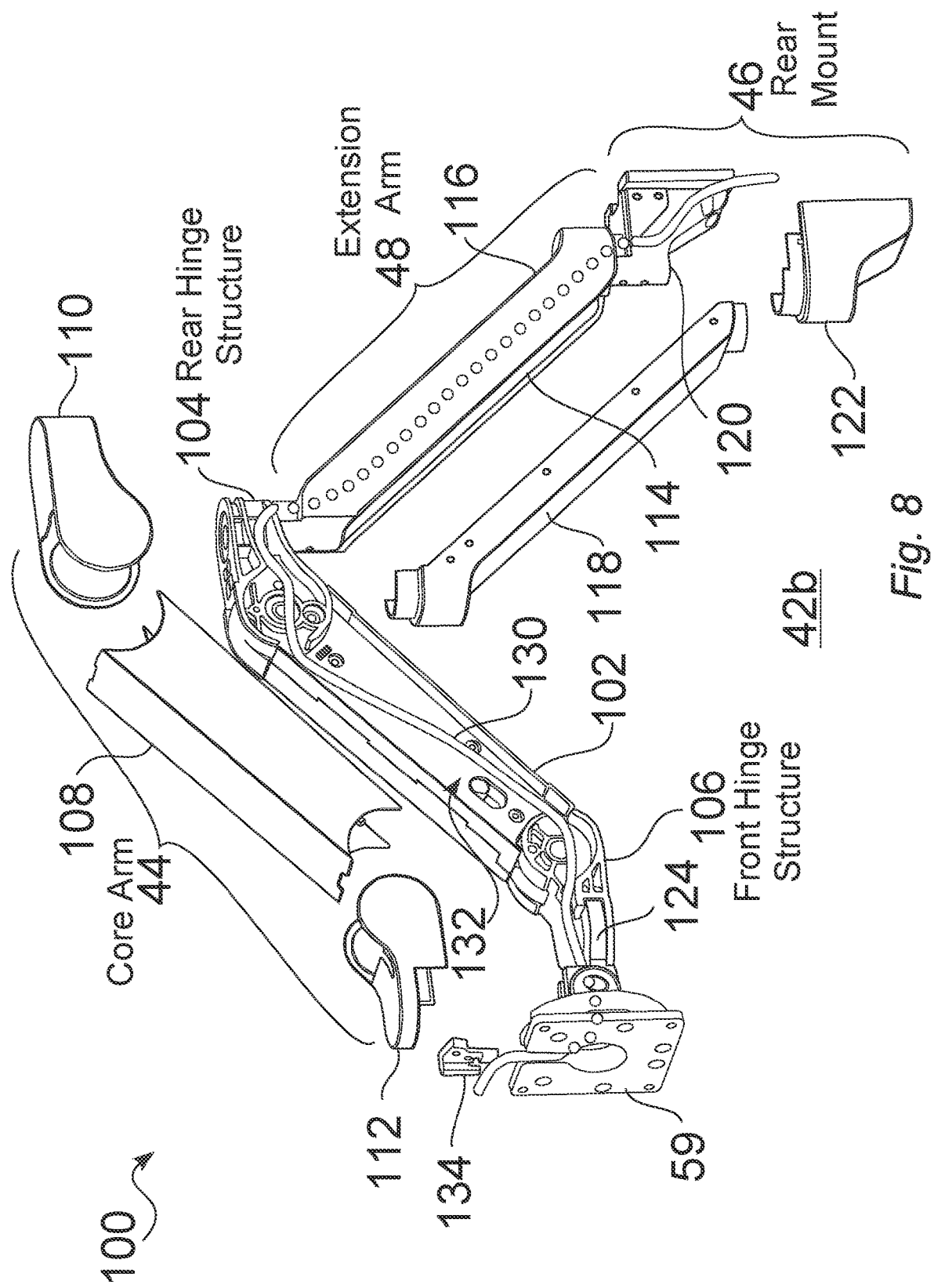
FIG. 8 is an expanded assembly view of an illustrative tablet arm, which includes an extension, in which a cable path is shown.
Figure 32:
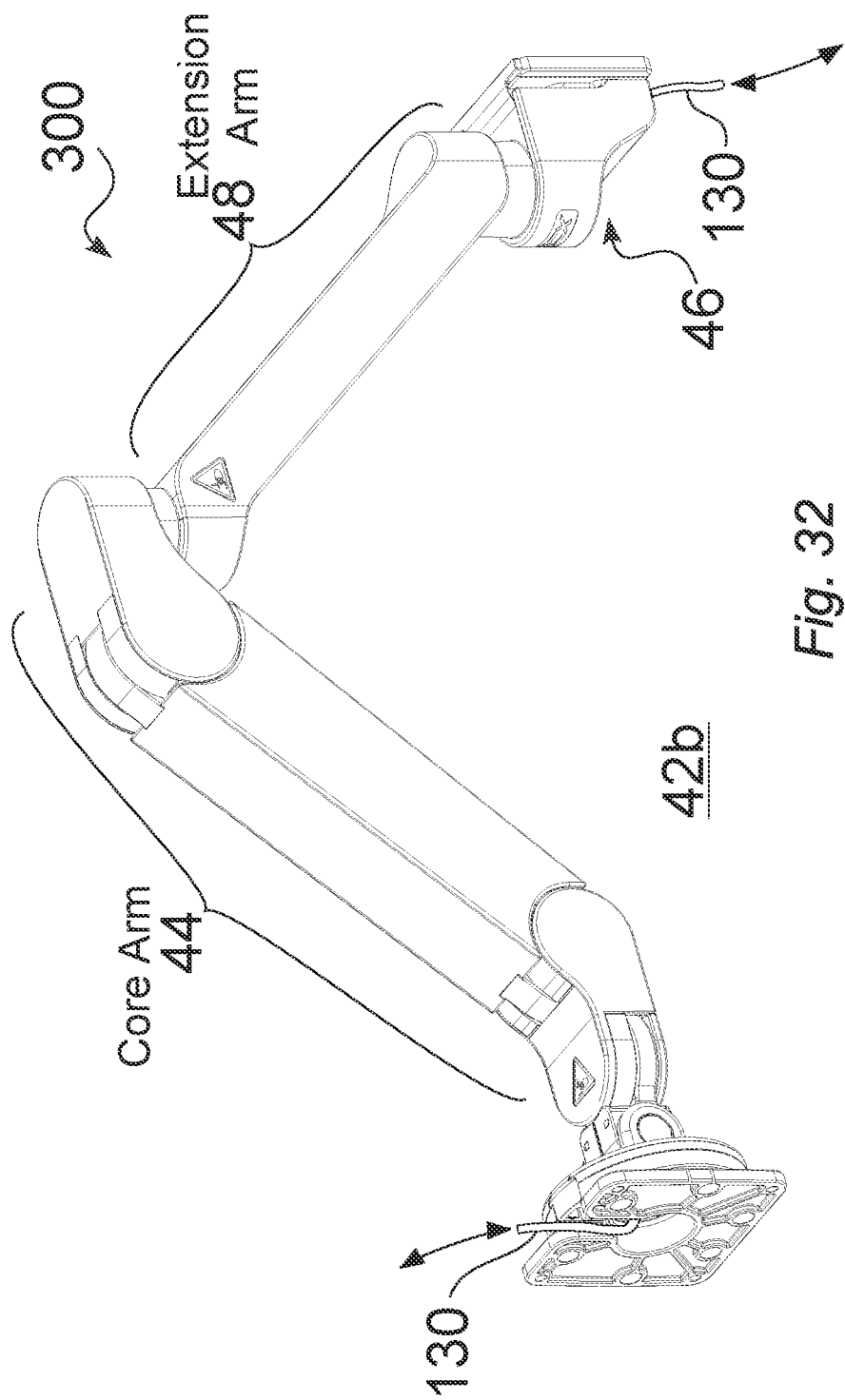
FIG. 32 is an assembled view of an illustrative tablet arm, which includes an extension.

FIG. 8 is an expanded assembly view 100 of an illustrative tablet arm 42*b*, which includes an extension arm 48. FIG. 32 is an assembled view 300 of an illustrative tablet arm 42*b*, which includes an extension arm 48.

As seen in FIG. 8 and FIG. 32, embodiments of the tablet arm 42, e.g., 42*b* can be implemented to provide fully concealed routing of cables 130 extending between opposing ends of the tablet arm 42. The cables 32 are accessible via snap fit covers in some embodiments, for easy installation and maintenance. For instance, the core arm 44 seen in FIG. 8 includes a core arm cable cover 108, a rear hinge cable cover 110, a front hinge cable cover 112, and a front hinge seal cable cover 124. As well, the extension arm 48 seen in FIG. 8 includes an extension structure cover 116 and an extension cable cover 118, while the rear mount 42 includes a channel mount cable cover 122.

As such, the exterior as well as the interior of the tablet arms 42 are readily cleanable. As further seen in FIG. 8, some embodiments of the tablet arm 42 include asymmetric construction, whereby one or more cables 130 can be routed 132 to the side of the structural componentry, e.g., core arm structure 102, rear hinge structure 104, and front hinge structure 106, such as to aid in any of manufacturing, maintenance, and cleaning. As further seen in FIG. 8, at the front end of the tablet arm 42, the cable 130 can be routed to avoid kinking or binding, throughout the range of rotation 80 and tilt 82 of the tablet screen 52.

As discussed above, illustrative embodiments of the tablet arm 42 can be positioned in a variety of positions as desired, such as including any of horizontal rotation 120, 122, or 128, vertical rotation 124, 126, and tablet display tilting 130. Some embodiments can be rotated about one or more axes, e.g., pivot axis 154 (FIG. 11), within a defined or predetermined range, such as to allow controlled movement within an environment, while avoiding undesired positioning with respect to the environment or other equipment, and/or to prevent damage or binding to internal cables 130.

Some embodiments of the tablet arms 42 can include one or more stops to limit rotation within range. Some embodiments can include, for example, a stop tooth on the rear hinge structure 104 and a stop tooth on the extension structure 114, which engage at the limit of rotation. These tooth features (or pins, or walls) typically take up space on each component. Therefore, rotation is limited to less than 360 degrees, because the features cannot, by design, overlap and occupy the same space. In some embodiments, such stops can be used, e.g., between a rear channel mount 42 and an extension arm 48, which in some embodiments can readily be configured to provide about +/−90 degrees of rotation 72.

Figure 9:
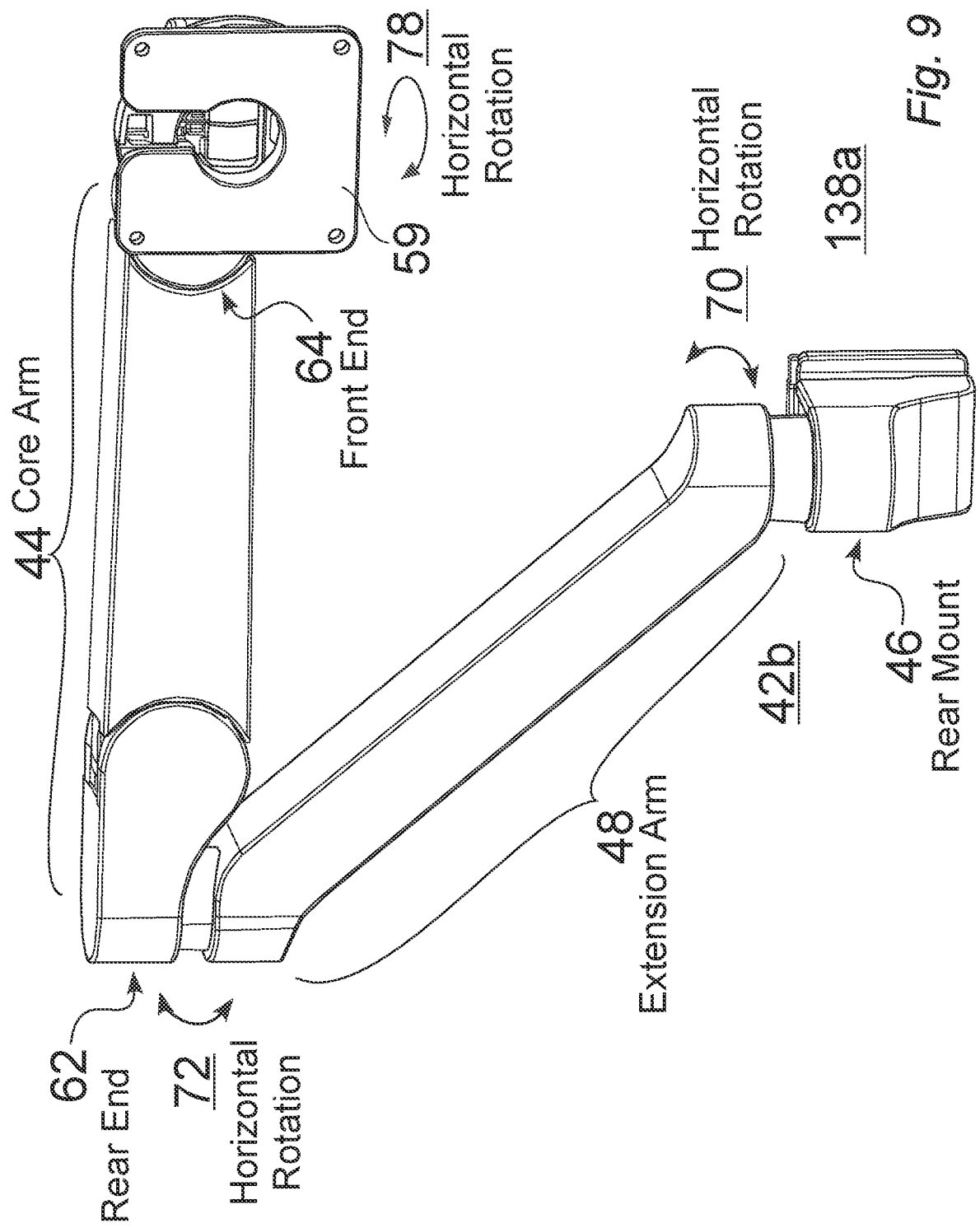
FIG. 9 is an illustrative view of a tablet arm including a core arm that is pivotably connected to an extension arm, in a first rotated position.
Figure 10:
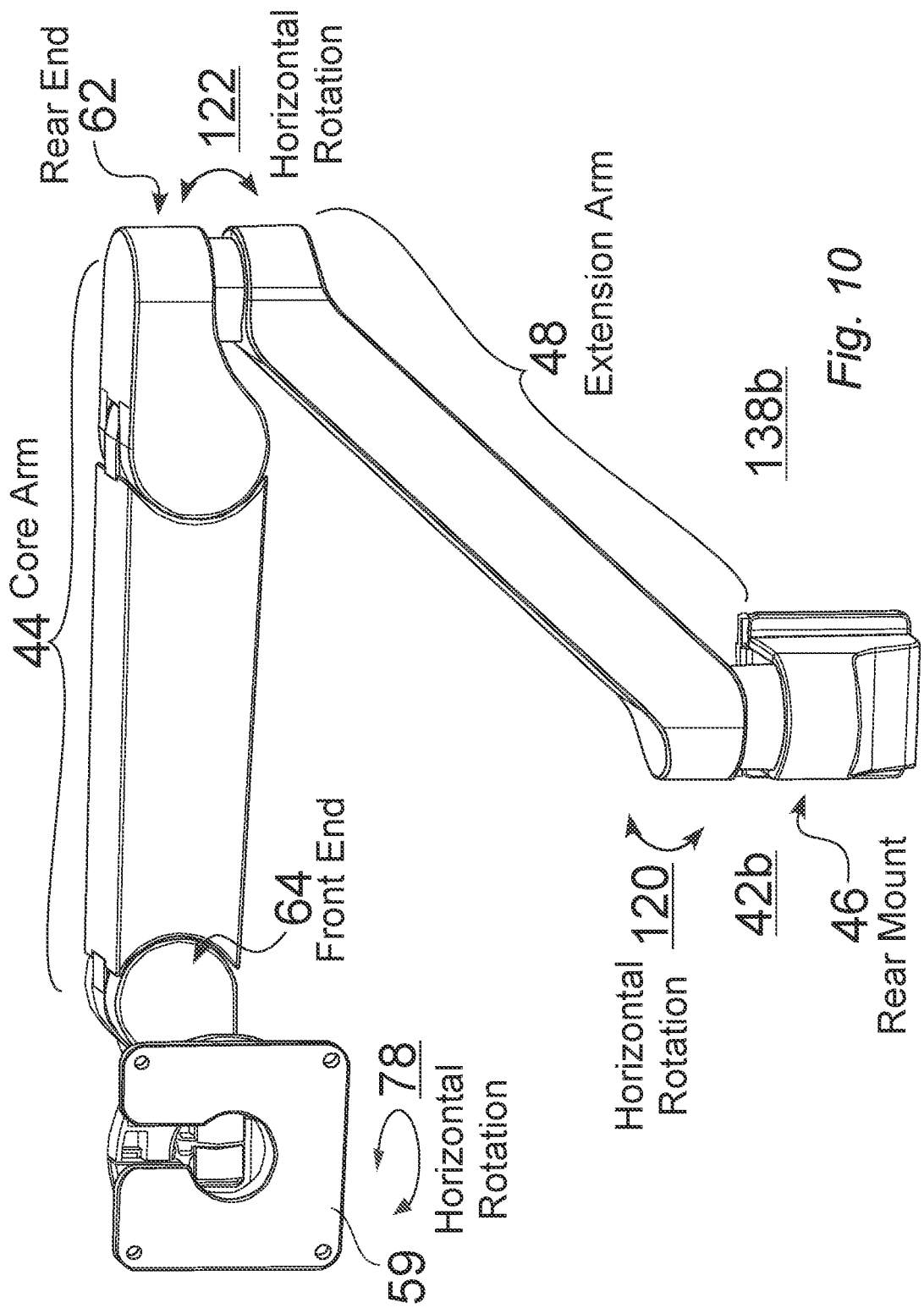
FIG. 10 is an illustrative view of a tablet arm including a core arm that is pivotably connected to an extension arm, in a second rotated position.

FIG. 9 is an illustrative view of a tablet arm 42*b* including a core arm 44 pivotably connected to an extension arm 48, in a first rotated position 138*a*. FIG. 10 is an illustrative view of a tablet arm 42*b* including a core arm 44 pivotably connected to an extension arm 48, in a second rotated position 138*b*. The illustrative extension arm 48 seen in FIG. 9 and FIG. 10 can be rotated 70 from the far left to the far right, while the rear end 62 of the core arm 44 can also be rotated 72 from a far left position to a far right position with respect to the extension arm 48. Similarly, the illustrative front mount 58 (FIG. 7) can also be rotated 78 clockwise or counterclockwise with respect to the front end 64 of the core arm 44. In some embodiments, the rotation 70, 72, and/or 78 can provide a predetermined range, e.g., such as up to 360 degrees (+/−180 degrees) rotation.

As well, in addition to enabling mechanical rotation of one or more components of the tablet arm 42 throughout a wide range of motion, the tablet arm 42 can be configured to provide robust internal routing 132 of cabling 130, without binding or pinching, such as within the predetermined range, which would otherwise limit cable life and/or break the cables 130. For example, in some embodiments, 360 degrees (+/−180 degrees) rotation allows the tablet arm 42 to reach these preferable positions while also limiting over-rotation. Over-rotation is detrimental to cable life, or may even break cables 130.

Some embodiments of the tablet arm 42 include joint rotation stop structures that provide rotation, e.g., rotation 72 of a core arm 44 with respect to an extension arm 48, within such a defined or predetermined range. For instance, some embodiments of the tablet arm 42 can include joint rotation stop structures 140 that include a floating stop key 152, including stop faces 164 (FIG. 13) that are movable within a predetermined range, e.g., stop key stop faces 164 that can float.

Figure 11:
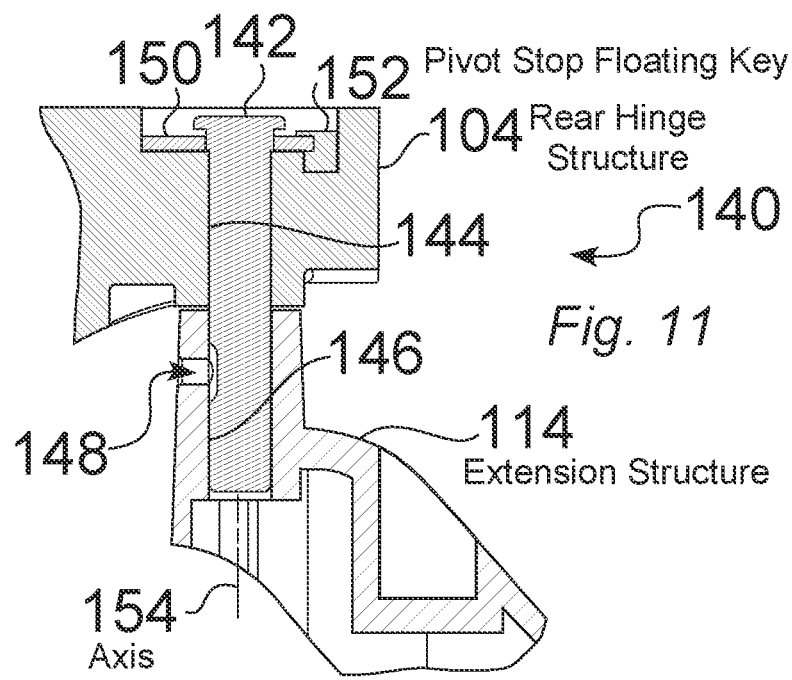
FIG. 11 is a partial cutaway view of an illustrative rear hinge structure of a core arm that includes a pivot stop structure, which is pivotably connected to an extension arm.
Figure 12:
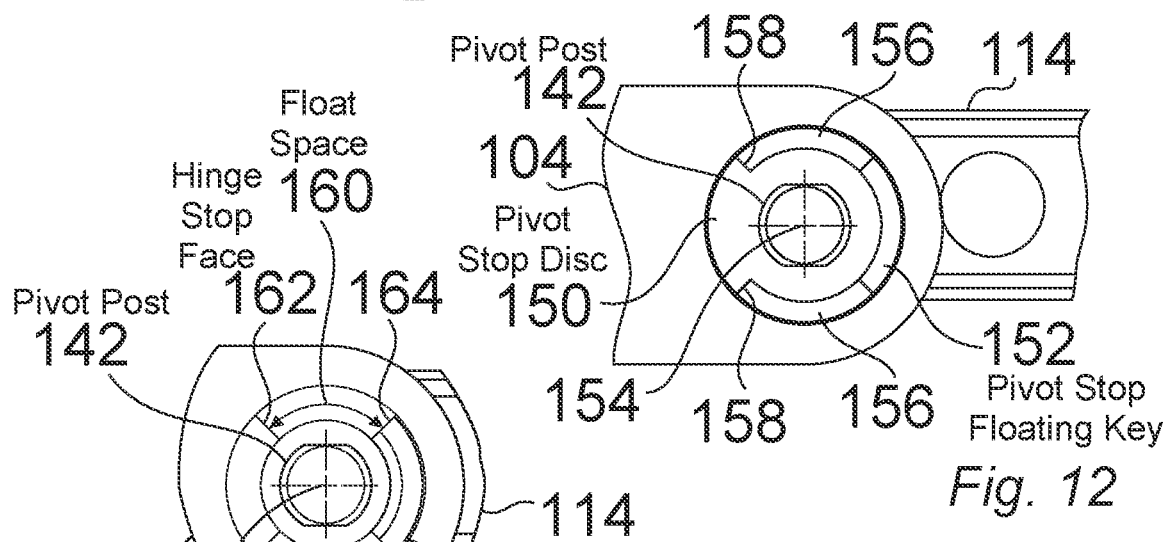
FIG. 12 is a detailed top partial cutaway view of an illustrative rear hinge structure having a pivot stop structure, in which the rear hinge structure is pivotably connected to an extension arm.
Figure 13:
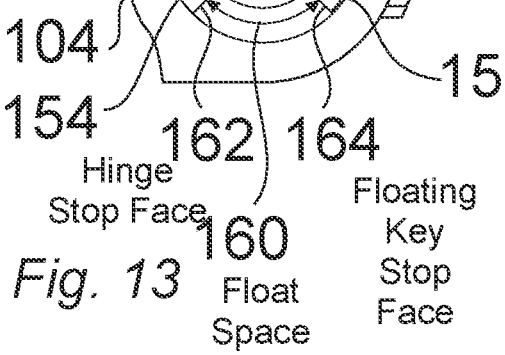
FIG. 13 is a detailed top view of an illustrative pivot stop structure for a hinge structure of a core arm.
Figure 14:
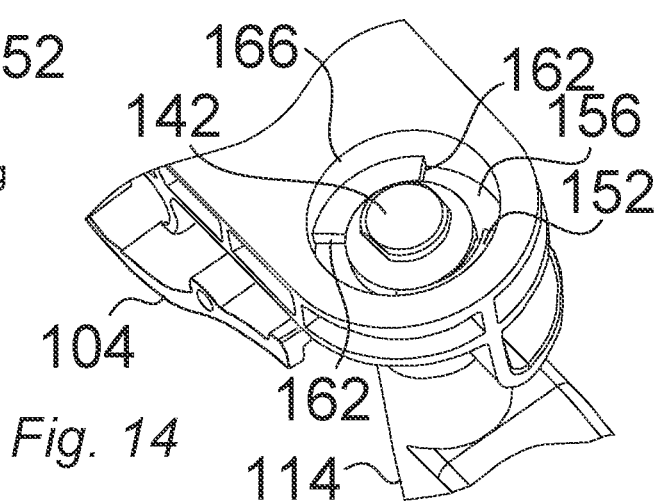
FIG. 14 is a detailed view of an illustrative rear hinge structure for a core arm, wherein the rear hinge structure is configured to include a pivot stop structure.

FIG. 11 is a partial cutaway view of an illustrative rear hinge structure 104 of a core arm that 44 includes a pivot stop structure 140, which is pivotably connected to an extension arm 48. FIG. 12 is a detailed top partial cutaway view of an illustrative rear hinge structure having a pivot stop structure 140, in which the rear hinge structure 104 is pivotably connected to an extension arm structure 114. FIG. 13 is a detailed top view of an illustrative pivot stop structure 140 for a rear hinge structure 104 of a core arm 44. FIG. 14 is a detailed view of an illustrative rear hinge structure 104 for a core arm 44, wherein the rear hinge structure 104 is configured to include a pivot stop structure 140.

The illustrative pivot stop structure 140 seen in FIGS. 11-14 includes a pivot stop disc 150 and a pivot stop floating key 152, such as located within a defined pivot region 166 of a rear hinge structure 104. At the zero degree position shown in FIGS. 11-14, the pivot stop floating key 152 is within a defined range of rotation, and as such, is considered to be a floating key.

As seen in the partial cutaway view of FIG. 11, the pivot stop disc 150 is rotationally fixed to a core arm pivot post 142 about the pivot axis 154, while the pivot stop floating key 152 is captured in the float space 156 (FIG. 12) defined between the pivot stop disc 150 and the rear hinge structure 104. The pivot stop floating key 152 is free to rotate about the pivot axis 154 within the float space 156 between the pivot stop disc 150 and the rear hinge structure 104, within the defined float region 156. The core arm rear pivot post 142 is rotationally fixed 148 to the extension structure 114 about the pivot axis 154, and the pivot stop disc 150 provides stop faces 158 (FIG. 12) for the pivot stop structure 140.

Figure 15:
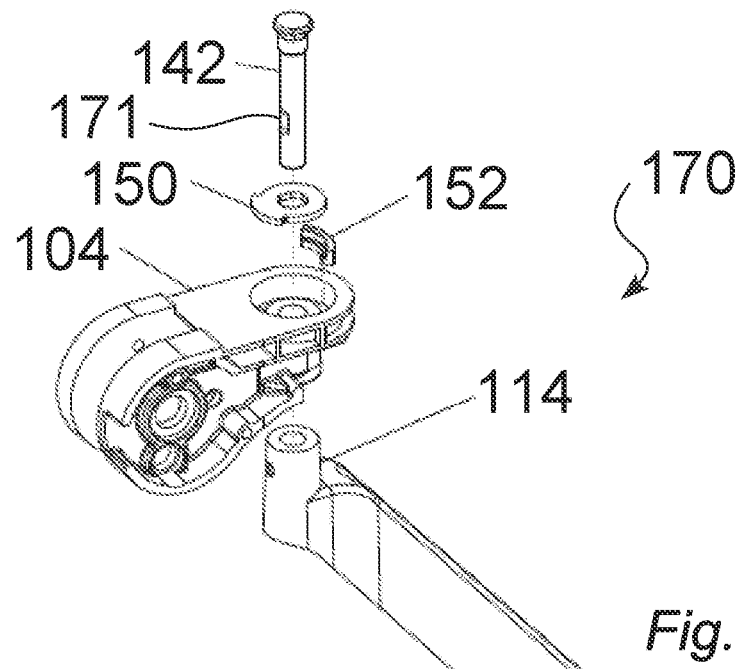
FIG. 15 is an expanded assembly view of an illustrative rear hinge structure, an extension arm structure, and a pivot stop structure.

FIG. 15 is an expanded assembly view 170 of an illustrative rear hinge structure 104, an extension arm structure 114, and a pivot stop structure 140, which includes a pivot stop floating key 152 to be located within a pivot region 166 defined within a rear hinge structure 104, a pivot stop disc 150, and a pivot post 142 that extends through the pivot stop disc 150, to be affixed 148 (FIG. 11), such as with respect to landing 171 on the pivot post 142, within pivot hole 146 (FIG. 11) defined through the extension structure, about pivot axis 154.

Figure 16:
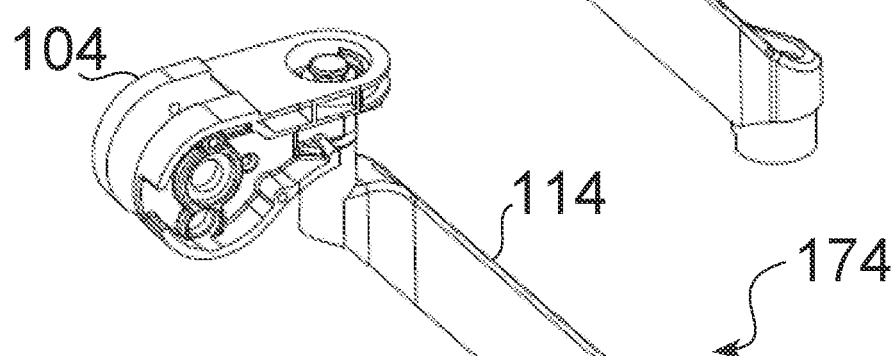
FIG. 16 is an assembly view of an illustrative rear hinge structure, an extension arm structure, and a pivot stop structure.
Figure 17:
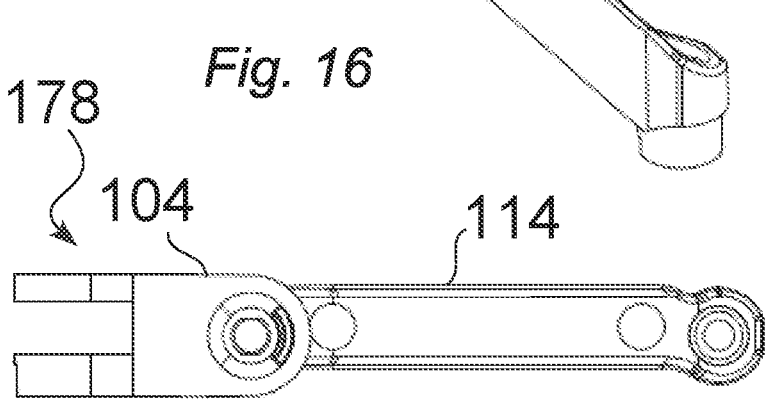
FIG. 17 is a top assembly view of an illustrative rear hinge structure, an extension arm structure, and a pivot stop structure.

FIG. 16 is an assembly view 174 of an illustrative rear hinge structure 104, an extension arm structure 114, and a pivot stop structure. FIG. 17 is a top assembly view 178 of an illustrative rear hinge structure 104, an extension arm structure 114, and a pivot stop structure 140. When assembled, the pivot stop disc 150 retains the pivot stop floating key 152 within the pivot region 166 defined within a rear hinge structure 104, to allow rotation of the rear hinge structure 104 with respect to the extension structure 114, within a range of motion.

Figure 18:
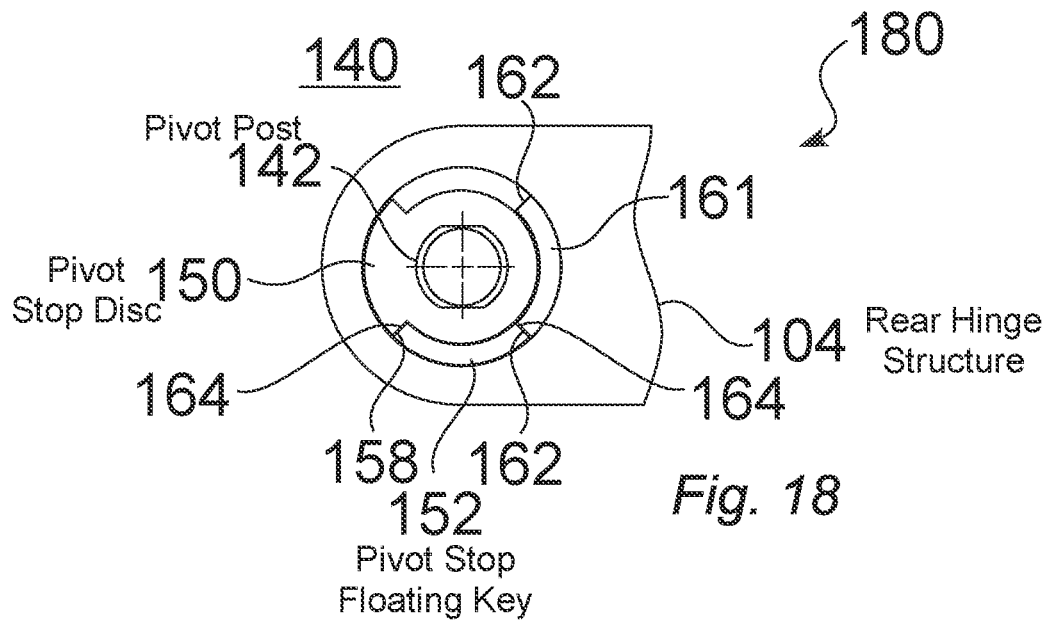
FIG. 18 is a detailed top view of an illustrative pivot stop structure for a rear hinge structure of a core arm, wherein the rear hinge structure is rotated 180 degrees counterclockwise.
Figure 19:
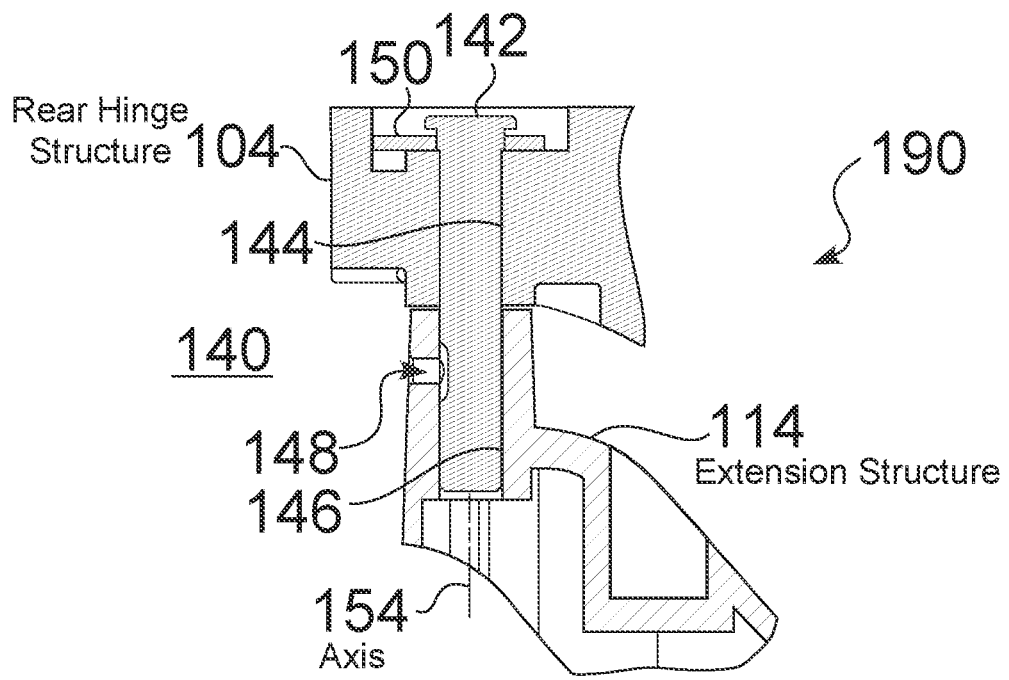
FIG. 19 is a partial cutaway view of an illustrative rear hinge structure having a corresponding pivot stop structure, which is pivotably connected to an extension arm, wherein the rear hinge structure is rotated 180 degrees counterclockwise.

FIGS. 18 and 19 provide detailed views 180,190 of an illustrative pivot stop structure 140, such as including a pivot stop disc 150 and a pivot stop floating key 152, located within a defined pivot region 166 of a rear hinge 104, in which the rear hinge 104 is rotated to a 180 degree counter-clockwise (CCW) position. In the illustrative 180 degree CCW position seen in FIGS. 18 and 19, the floating stop key 152 has been moved, i.e., pushed, by a counter-clockwise pivot rotation motion of the rear hinge 104 with respect to the rest of the assembly. In this position, the floating stop key 152 is in a fully captured position, wherein a set of stop faces 158,162,164, as shown, are active in preventing further counter-clockwise rotation of the rear hinge 170 with respect to the rest of the assembly. Specifically, one of the stop faces 164 of the floating key 152 is captured with respect to a respective stop face 162 of the rear hinge 104, while the opposing stop face 164 of the floating key 152 is captured with respect to a respective stop face 158 of the pivot stop disc 150. In this illustrative case, the rear hinge 170 has been rotated 180 degrees counter-clockwise to a stopped position, with respect to the extension structure 114.

Figure 20:
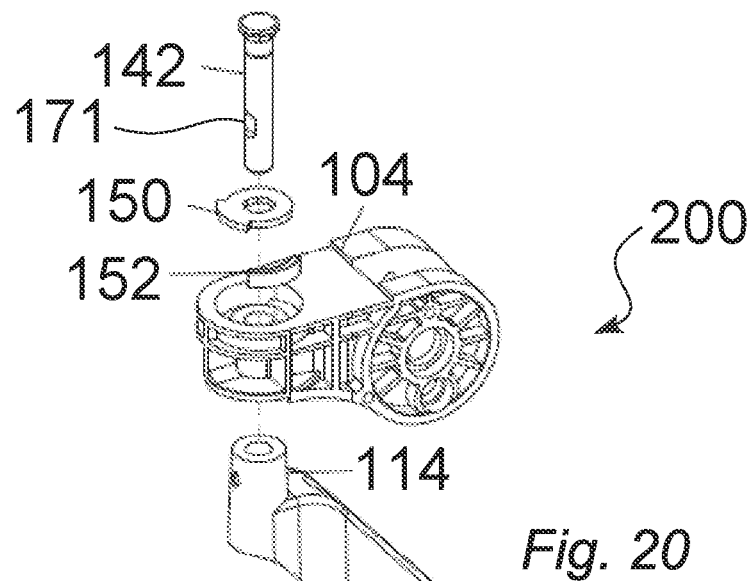
FIG. 20 is an expanded assembly view of an illustrative rear hinge structure, an extension arm structure, and a pivot stop structure, wherein the rear hinge structure is rotated 180 degrees counterclockwise.

FIG. 20 is an expanded assembly view 200 of an illustrative rear hinge structure 104, an extension arm structure 114, and a pivot stop structure 140, which includes a pivot stop floating key 152 to be located within a pivot region 166 defined within a rear hinge structure 104, a pivot stop disc 150, and a pivot post 142 that extends through the pivot stop disc 150, to be affixed 148 (FIG. 11), such as with respect to landing 171 on the pivot post 142, within pivot hole 146 (FIG. 11) defined through the extension structure, about pivot axis 154.

Figure 21:
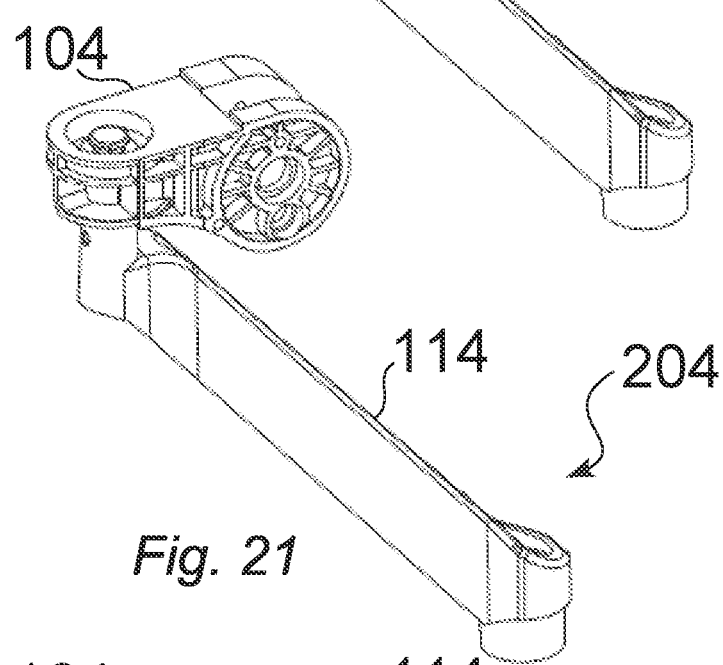
FIG. 21 is an assembly view of an illustrative rear hinge structure, an extension arm structure, and a pivot stop structure, wherein the rear hinge structure is rotated 180 degrees counterclockwise.
Figure 22:
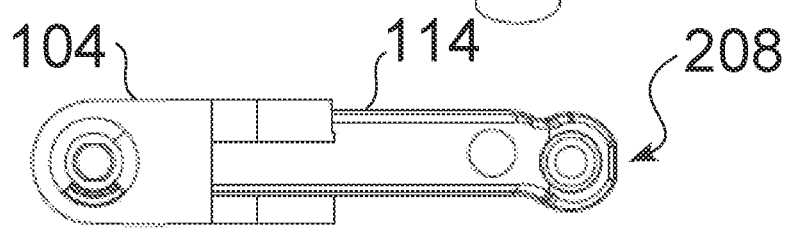
FIG. 22 is a top assembly view of an illustrative rear hinge structure, an extension arm structure, and a pivot stop structure, wherein the rear hinge structure is rotated 180 degrees counterclockwise.

FIG. 21 is an assembly view 204 of an illustrative rear hinge structure 104, an extension arm structure 114, and a pivot stop structure. FIG. 22 is a top assembly view 208 of an illustrative rear hinge structure 104, an extension arm structure 114, and a pivot stop structure 140, wherein the rear hinge 170 has been rotated 180 degrees counter-clockwise to a stopped position, with respect to the extension structure 114.

In this position, the rear hinge structure 104 is prevented from being rotated further counterclockwise, but can readily be rotated clockwise with respect to the extension structure 114, within the defined range of motion.

Figure 23:
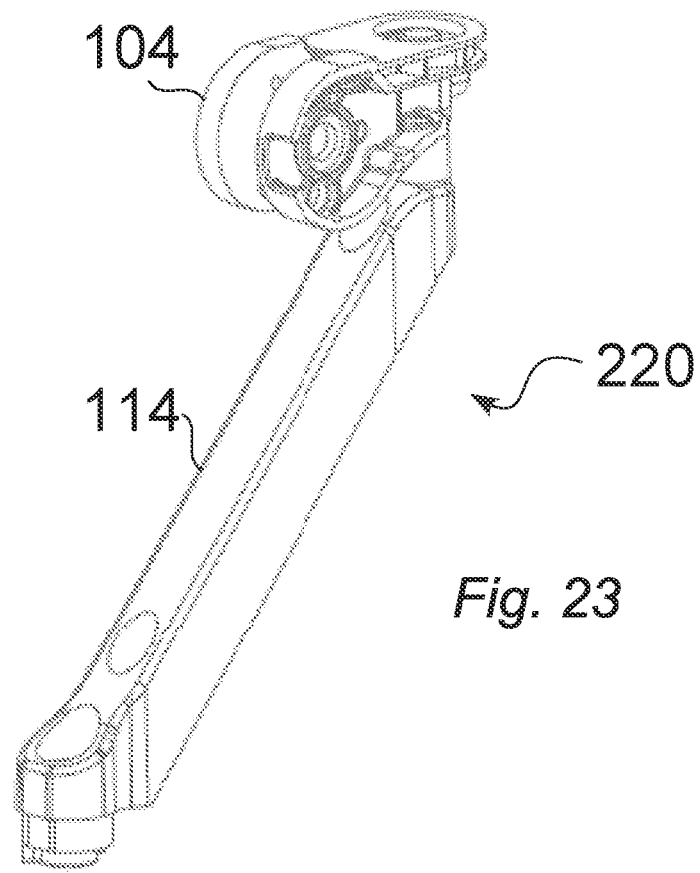
FIG. 23 is a first completed assembly view of an illustrative rear hinge structure, an extension arm structure, and a pivot stop structure, wherein the rear hinge structure is rotated 180 degrees counterclockwise.
Figure 24:
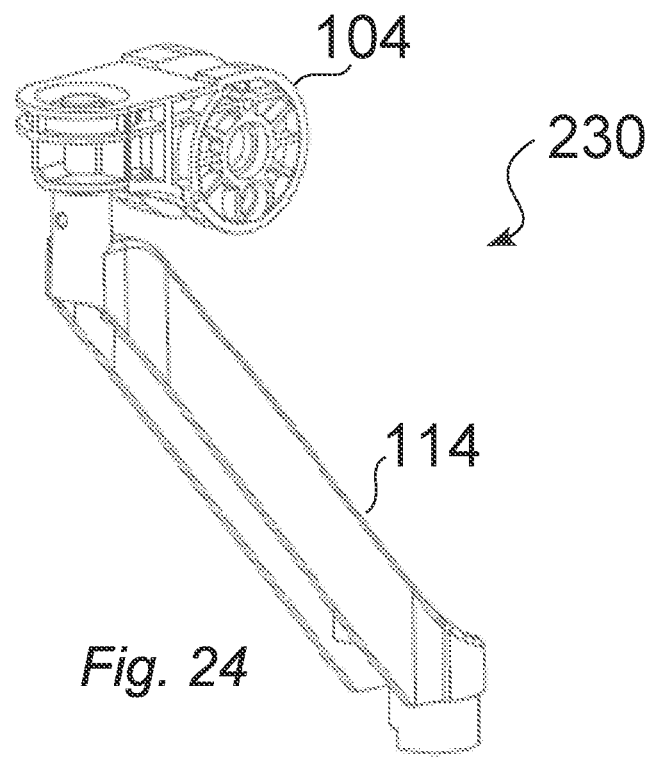
FIG. 24 is a second completed assembly view of an illustrative rear hinge structure, an extension arm structure, and a pivot stop structure, wherein the rear hinge structure is rotated 180 degrees counterclockwise.

FIG. 23 is a first completed assembly view 220 of an illustrative rear hinge structure 104, an extension arm structure 114, and a pivot stop structure 140, wherein the rear hinge structure 104 is rotated 180 degrees counterclockwise, with respect to the extension structure 114. FIG. 24 is a second completed assembly view 230 of an illustrative rear hinge structure 104, an extension arm structure 114, and a pivot stop structure 140, wherein the rear hinge structure 104 is rotated 180 degrees counterclockwise, with respect to the extension structure 114.

Figure 25:
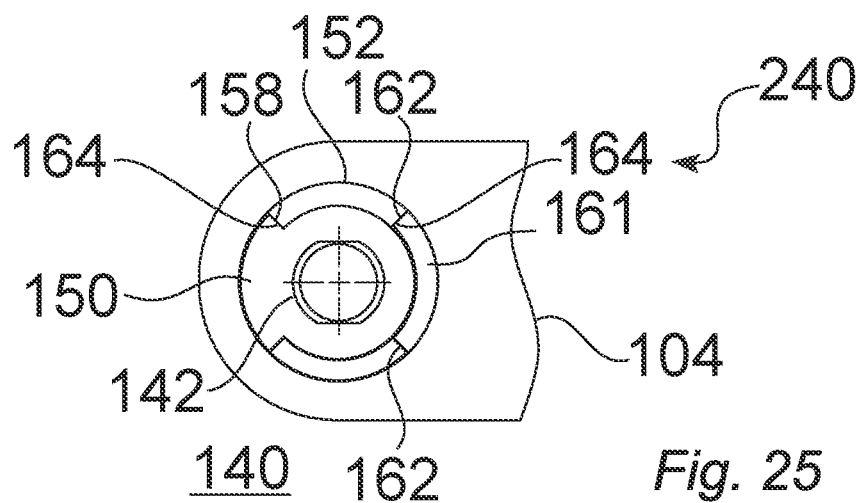
FIG. 25 is a detailed top view of an illustrative pivot stop structure for a core arm, wherein the rear hinge structure is rotated 180 degrees clockwise.
Figure 26:
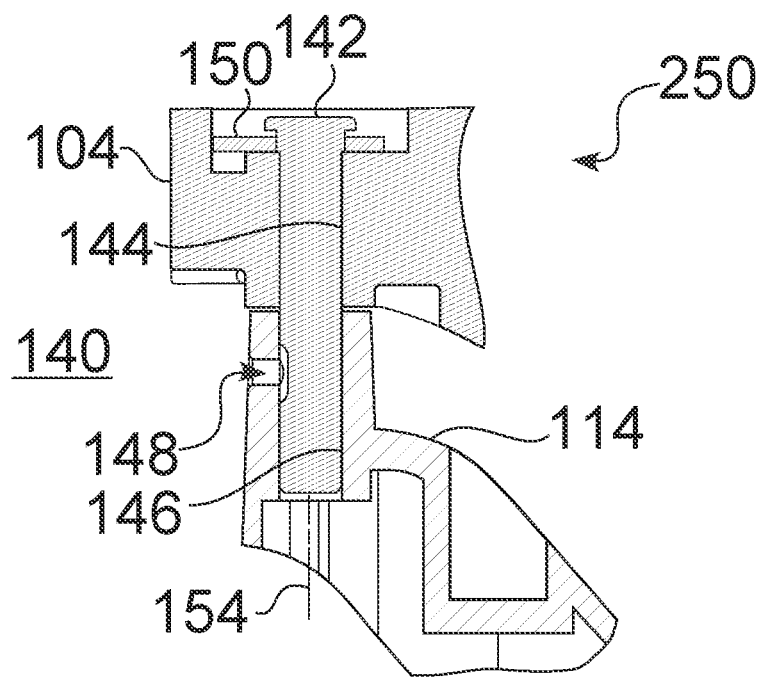
FIG. 26 is a partial cutaway view an illustrative rear hinge structure having a corresponding pivot stop structure, which is pivotably connected to an extension arm, wherein the rear hinge structure is rotated 180 degrees clockwise.

FIG. 25 is a detailed top view 240 of an illustrative pivot stop structure 140 for a core arm 44, wherein the rear hinge structure 104 is rotated 180 degrees clockwise (CW) with respect to an extension arm structure 114. FIG. 26 is a partial cutaway view 250 of a tablet arm 42 including a rear hinge structure 104 that includes a pivot stop structure 140 that is pivotably connected to an extension arm structure 114, wherein the rear hinge structure 104 is rotated 180 degrees clockwise with respect to an extension arm structure 114.

Figure 27:
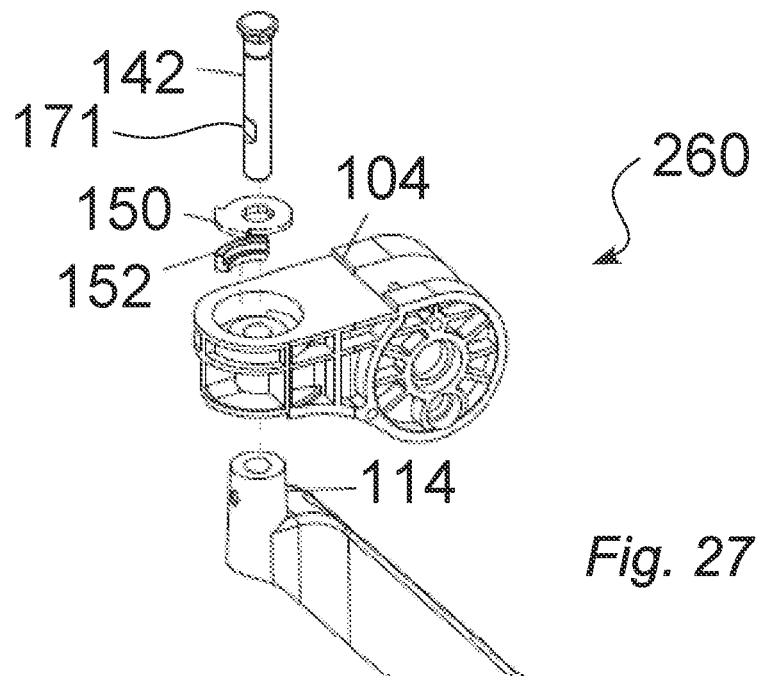
FIG. 27 is an expanded assembly view of an illustrative rear hinge structure, an extension arm structure, and a pivot stop structure, wherein the rear hinge structure is rotated 180 degrees clockwise.
Figure 28:
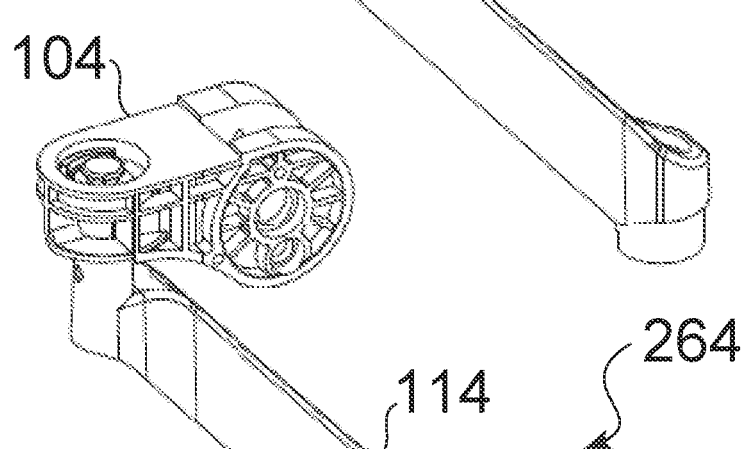
FIG. 28 is an assembly view of an illustrative rear hinge structure, an extension arm structure, and a pivot stop structure, wherein the rear hinge structure is rotated 180 degrees clockwise.
Figure 29:
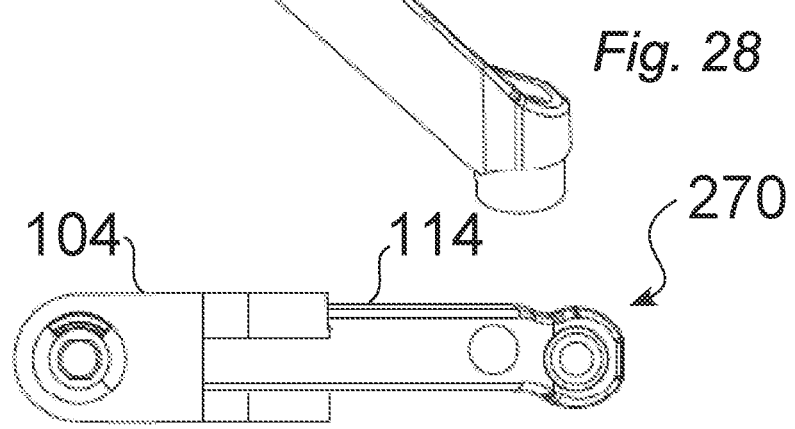
FIG. 29 is a top assembly view of an illustrative rear hinge structure, an extension arm structure, and a pivot stop structure, wherein the rear hinge structure is rotated 180 degrees clockwise.

FIG. 27 is an expanded assembly view 260 of an illustrative rear hinge structure 104, an extension arm structure 114, and a pivot stop structure 140, wherein the rear hinge structure 104 is rotated 180 degrees clockwise (CW). FIG. 28 is an assembly view 264 of an illustrative rear hinge structure 104, an extension arm structure 114, and a pivot stop structure 140, wherein the rear hinge structure 104 is rotated 180 degrees clockwise. FIG. 29 is a top assembly view 270 of an illustrative rear hinge structure 104, an extension arm structure 114, and a pivot stop structure 140, wherein the rear hinge structure 140 is rotated 180 degrees clockwise.

Figures 30, 31:
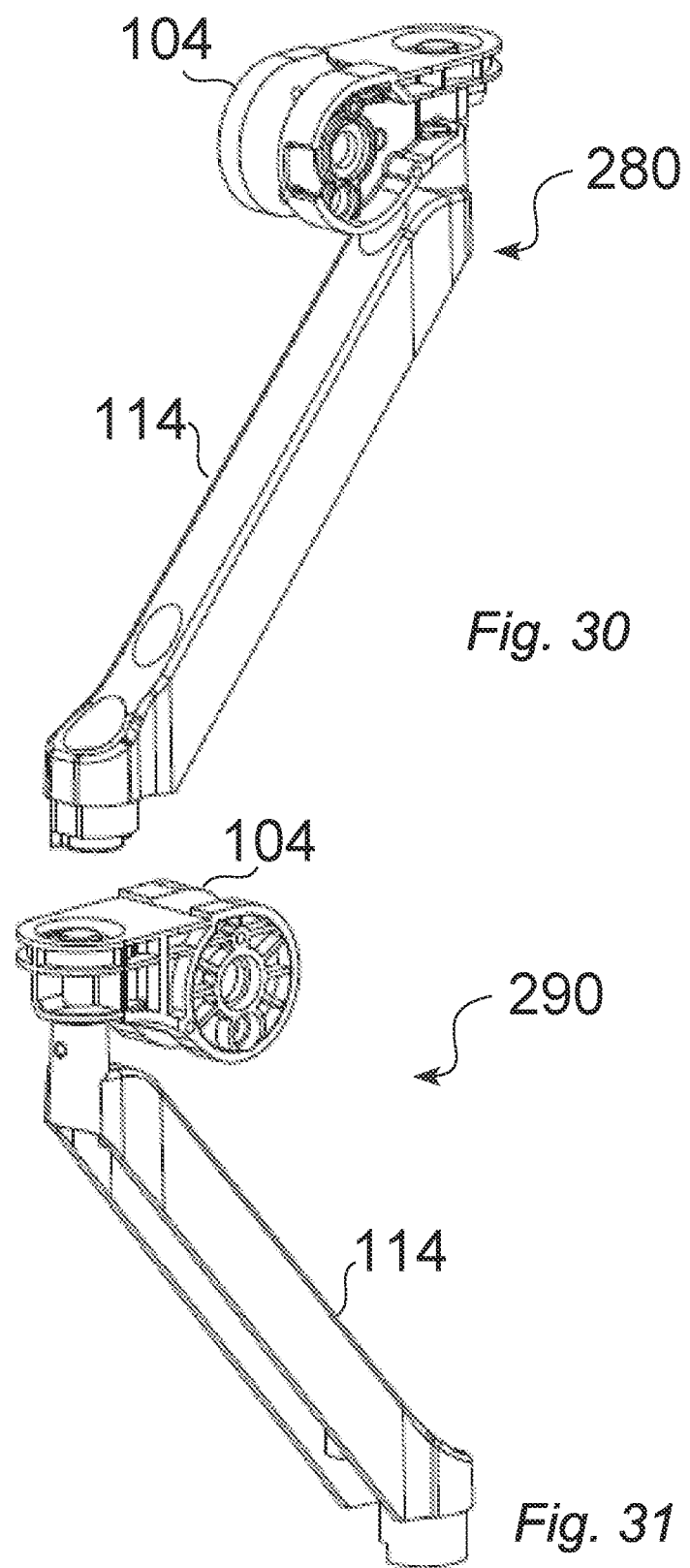
FIG. 30 is a first completed assembly view of an illustrative rear hinge structure, an extension arm structure, and a pivot stop structure, wherein the rear hinge structure is rotated 180 degrees clockwise.
FIG. 31 is a second completed assembly view of an illustrative rear hinge structure, an extension arm structure, and a pivot stop structure, wherein the rear hinge structure is rotated 180 degrees clockwise.

FIG. 30 is a first completed assembly view 280 of an illustrative rear hinge structure 104, an extension arm structure 114, and a pivot stop structure 140, wherein the rear hinge structure 104 is rotated 180 degrees clockwise with respect to the extension arm structure 114. FIG. 31 is a second completed assembly view 290 of an illustrative rear hinge structure 104, an extension arm structure 114, and a pivot stop structure 140, wherein the rear hinge structure 104 is rotated 180 degrees clockwise with respect to the extension arm structure 114. The illustrative joint rotation stop structure 140 includes a pivot stop disc 150 and a pivot stop floating key 152, located within a defined pivot region 166 of a rear hinge 104, in which the pivot stop structure 140 is rotated to a 180 degree clockwise (CW) position.

As discussed above, the illustrative pivot stop structure 140 seen in FIGS. 25 to 31 includes a pivot stop disc 150 and a pivot stop floating key 152, located within a defined pivot region 166 of a rear hinge structure 104, in which the rear hinge structure 104 is rotated to a 180 degree clockwise (CW) position. In the illustrative 180 degree CW position, the floating stop key 152 has been moved, i.e., pushed, by a clockwise pivot rotation motion of the rear hinge structure 104 with respect to the rest of the assembly, i.e., with respect to the extension structure 114. In this position, the floating stop key 152 is in a fully captured position, wherein a set of stop faces, as shown, are active in preventing further clockwise rotation of the rear hinge 104 with respect to the rest of the assembly. In this illustrative case, the rear hinge structure 104 has rotated 180 degrees clockwise to a stopped position, with respect to the extension structure 114.

In the illustrative embodiments of the joint rotation stop structure 140, the floating stop key 152 is movable, such as within a track or tunnel region 156 that is dynamically formed by the pivoting components, i.e., the rear hinge structure 104, the relative position of the pivot stop disc 150, and the movable, i.e., floating stop key 152.

While the illustrative joint rotation stop structures 140 are described with respect to rotation between a core arm 108 and an extension arm 104, the joint rotation stop structures 140 can readily be implemented for other rotatable joints or interfaces, such as between an extension arm 104 and a rear mount 102, or between the front end 110 of a core arm 108 and a connected component, e.g., a front mount 58. As well, the joint rotation stop structures 140 can be configured to be used for other applications, such as for any mechanical pivot or joint having specific rotational requirements and/or that includes cabling that would otherwise be prone to wear or damage.

In some embodiments, the joint rotation stop structures 140 can be implemented to limit unwanted rotation of an articulated support arm 42, such as to reduce the risk of collisions with other objects. In embodiments that are implemented for support arm structures having integrated power and/or signal cables 130, the joint rotation stop structures 140 can be implemented to prevent cables 130 from winding up around the joints, and breaking. In some embodiments, the joint rotation stop structure 140 can be configured to allow the core arm 108 to pivot a full 360 degrees (+/−180 degrees).

The floating stop key 208 introduces stop faces, as shown, which can move within a design range, because the stop key stop faces can float. Essentially, the floating stop key 152 is configured to move within a dynamically formed track or tunnel, e.g. the float region 156, that is created by the pivoting pieces.

Embodiments of the illustrative joint rotation stop structures 140 can therefore be configured to prevent cables 130 from winding up around the joints and breaking. While the joint rotation stop structure 140 can be configured to provide rotational movement within other defined ranges, some current embodiments allow the core arm to pivot a full +/−180 degrees (yielding a defined range of 360 degrees).

While some illustrative embodiments of the tablet arm 42 are specifically configured for use an overbed table, the tablet arm 42 and corresponding defined range of rotation can readily be configured for a wide variety of uses, with one or more design constraints, such as including any of specified ranges of motion, forces to move, mounting type, stationary, mobile operation, and/or mounted devices.

As discussed above, embodiments of the illustrative joint rotation stop structures 140 can be configured to prevent cables 162 from winding up around the joints and breaking, and/or can be configured to limit unwanted rotation, for example to reduce the risk of collisions with other objects.

In an illustrative embodiment, the joint rotation stop structure 140 allows a full 360 degrees (+/−180 degrees) range of rotation, which is often preferred when the main function is to prevent cable winding. In an illustrative embodiment to be used between a rear hinge structure 104 and an extension structure 114, the design rotation range can be defined as: Rotation range=(angle length of path in rear hinge 170)+(angle length of path in the stop disc 150)−2* (angle length of the floating key 152).

In the case of the illustrative configuration disclosed above, the rotation range=(270)+(270)−2*(90)=360 degrees (+/−180 deg). In some embodiments, the rotation range can be set, up to limits of physical possibility, to be more or less than the illustrative rotation range described with respect to the embodiments disclosed above.

For instance, for some embodiments of the tablet arm 42 that do not include an extension structure 114, such as for a direct connection to a wall mount 46, the range of motion can be 180 degrees (+/−90). For such an embodiment, the joint rotation stop structure 140 can be configured with 180 degrees of floating key length, such as by including two floating keys 152 in the assembly 140 (e.g., 90 degrees+90 degrees=180).

FIG. 33 is a partial cutaway view 320 of an adjustable core arm structure 322 for an illustrative tablet arm 42, in which the adjustable core arm structure 322, such as installed within the core arm body structure 325, includes both a gas spring 324, as well as a friction element 330, e.g., a friction pack element, such as integrated with the rear axle 328 and/or the front axle 332, in which the friction element 330 provides resistance and/or torque. As also seen in FIG. 33, the illustrative gas spring 324 is configured in conjunction with a link bar 334, such as extending between link bar pins 336, to form a 4-link parallelogram assembly 340.

Figure 34:
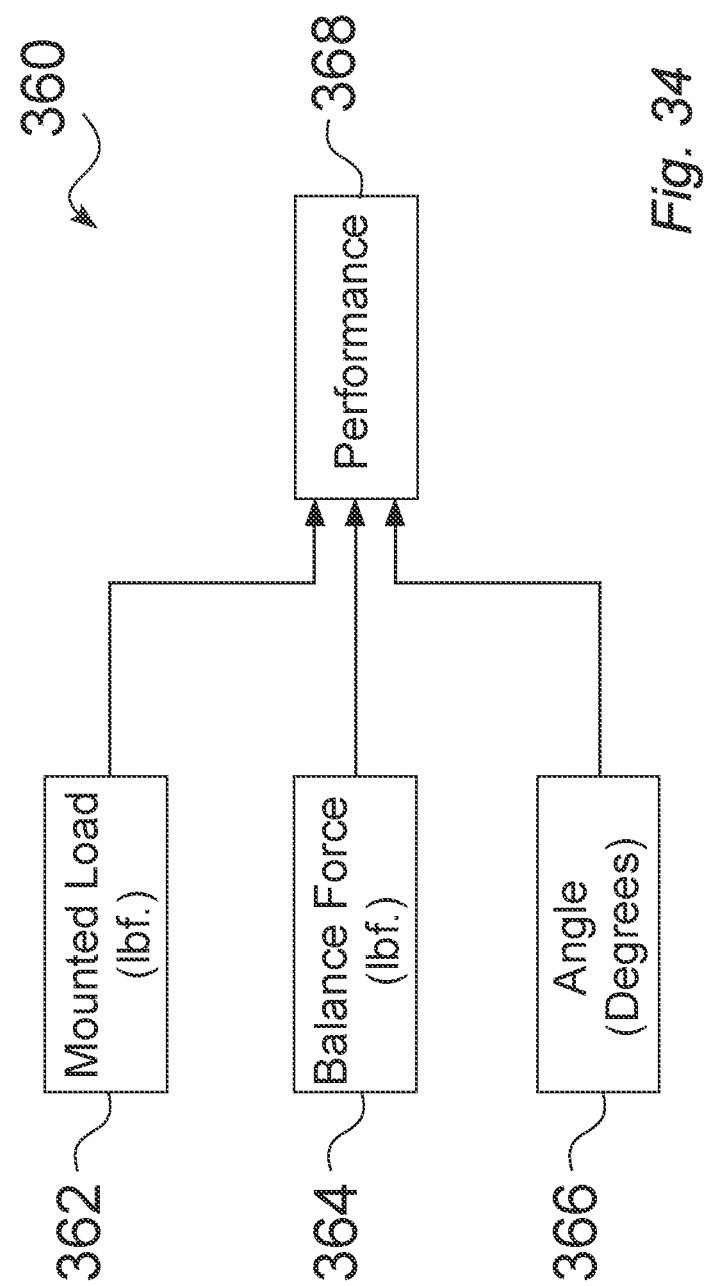
FIG. 34 is a schematic diagram that illustrates arm performance as a function of mounted load, balance force, and angle, such as for light loads, medium loads and high loads.

FIG. 34 is a schematic diagram 360 that illustrates some of the key design parameters to be considered for different mounted loads for a tablet support arm 42, such as based on a user force required to move a mounted tablet 52 up or down within a range of motion. For example, if too little force is needed to move the mounted tablet 52 up or down from one angle to another, the mounted screen 52 may undesirably sink or float, creating a functional issue. As well, if too much force is needed to move the mounted tablet 52 up or down from one angle to another, such movement may also be undesirable.

The illustrative performance parameters 368 seen in FIG. 34 can take into account one or more factors, such as the mounted load (lbf.) 362, the balance force (lbf.) 364, and the angle (degrees) 366.

For instance, some embodiments of the tablet support arm 42 can be configured to provide acceptable movement performance 368 for an intended load 362, with a combination of precise friction 330 and spring force 326. Some embodiments are configured to provide acceptable movement performance 368, with no counterbalance adjustment, such as by the use of a combination of friction 330 and spring forces 326. Some embodiments are configured to balance a mounted device 52 within designed or specified force-to-move limits. For instance, some embodiments can provide a light arm 42, such as for supporting 2.0 to 4.5 lb. devices 52, while some embodiments are configured to provide a heavy arm 42, such as for supporting 3.5 to 6.0 lb. devices 52.

Theory of "Counterbalance" Design for Tablet Arm.

Illustrative embodiments of the tablet core arm 44 disclosed herein can be configured to use a non-adjustable gas spring counterbalance force with a non-adjustable friction pack element 330 for up/down resistance to support a range of payloads.

In some embodiments, the gas spring counterbalance can be set for about the middle of the payload range, and then the friction can be used to offset the sink or float that would occur for lighter or heavier payloads. With this design there is relatively more friction in the arm, which results in different user experience and engineering considerations. Understanding desirable User Force preferences is a critical design input.

Explanation of User Forces.

In a first theoretical case, it is assumed that there is a mid-range payload, with the support arm 44 perfectly gas spring counterbalanced, and with equal friction resistance 330 up and down. In this case, the amount of force to move the arm up and down is purely friction resistance, and the amount of force required to move the arm up and down is the same.

In one example, the User Force to move up is +2 lb and down is −2 lb. The Differential User Force is then +(+2 lb)+(−2 lb)=0. In this example, the Differential User Force has no bias.

With a payload that weighs 1 lb more than the mid-range, the friction actually holds the arm up. The User Force to move up would be 3 lb and down would be −1 lb. The Differential User Force is +(+3 lb)+(−1 lb)=2 lb. Under these conditions, the user would need 2 lbf more to move up vs. down. Therefore, in this scenario, there is a +(up) bias.

With a payload that weighs 1 lb less than the mid-range, the friction actually holds the arm down. The User Force to move up would be +1 lb and down would be −3 lb. The Differential User Force is +(+1 lb)+(−3 lb)=−2 lb. In this example, the user needs 2 lb more to move down vs. up. There is a − (down) bias.

Note that in the case where friction up and down is perfectly equal, the Differential User Force is simply twice (2x) that of the gas spring counterbalance mismatch, because the friction zero's out in the equation.

The scenario used above to explain user forces is a simplified theoretical situation. In reality, the gas spring counter balance will vary in mismatch over the arm travel. Also, the spring force has a manufacturing tolerance, so the mid-range will be different from arm to arm. The internal friction pack also has a manufacturing tolerance so the resistance will vary from arm to arm, although in a given arm the up/down amount from a given friction pack may generally be the same. In addition, the gas spring 324 has its own linear friction and the pivoting joints of the arm at the axles 328,332, link bar pins 336 (FIG. 33), and to a lesser degree the gas spring pivots 338 (FIG. 33), also have friction with kinematic relationships with arm position. The stack-up of mismatches and tolerances is therefore preferably accounted for in the engineering design.

For "counter balance", it is a fundamental requirement that the tablet arm 42 must support a mounted payload in any (positionable) static position when the mounted payload, e.g., a tablet display 52, is within the specified product limits. In preferred embodiments, this should be true for all combinations of mismatches and tolerances and at all required vertical positions; the approach is a worst case total stack-up analysis including all element tolerances. For "User Forces", as with the counter balance analysis, the worst case mismatch and tolerance stack-up is used. However, when analyzing User Differential Force, it is recognized that, for a given tablet support arm 42, the friction is symmetrical up and down at a given height, and therefore the friction tolerance does not influence the Differential force, although it does affect the overall force. It is likewise for the gas spring tolerance. However, the mismatch of all the support forces vs. the perfect balance forces does result in a variation of the differential force to over the arm travel, to a high degree, because of the arm geometry (e.g., friction torque vs. linear force) so the case is not as simple as the idealized case used in the Explanation of User Forces. Calculations for the analysis of arm balance include the requirements below.

User Force Requirements.

A study was performed to learn user preferences that were analyzed to define desirable functional requirements, based on an exemplary design goals. It should be understood that, while the following specifications are generally pertinent to the goals of one or more products, the acceptable and preferred specifications may, and likely would, vary for other products with different payloads, etc. For example, the disclosed design parameters can be scaled "up" for heavier, bulkier, devices, where the specific numbers will be different, and similarly can be scaled down for light and/or compact embodiments.

User Force to Move the Arm UP:
  Feels "good": +0.5 lbf to +4.5 lbf (most to least desirable)
  Feels "okay": +0.5 lbf to +5.5 lbf
  Feels "bad": outside the "okay" range.
User Force to Move the Arm DOWN:
  Feels "good": −1.0 lbf to −5.5 lbf
  Feels "okay": −0.5 lbf to −6.5 lbf
  Feels "bad": outside the "okay" range.
User Differential Force:
  User Differential Force>=0 then +8.5 lbf to 0 lbf (that is If User Force |UP| is more than or equal to |DOWN|)
  User Differential Force<0 then 0 lbf to −4.0 lbf (that is If User Force |UP| is less than |DOWN|)

Different embodiments of the tablet arm 42 are configured to provide controlled and stable movement, through a wide variety of positions, and for a wide variety of mounted devices 52, with or without the inclusion of an extension arm 48, and for mounting to a wide variety of stationary, movable and mobile applications.

For instance, embodiments of the tablet arm 42a that do not include an extension arm 48 can readily be configured to provide controlled and stable movement, through a wide variety of positions, and for a wide variety of mounted devices 52.

Figure 35:
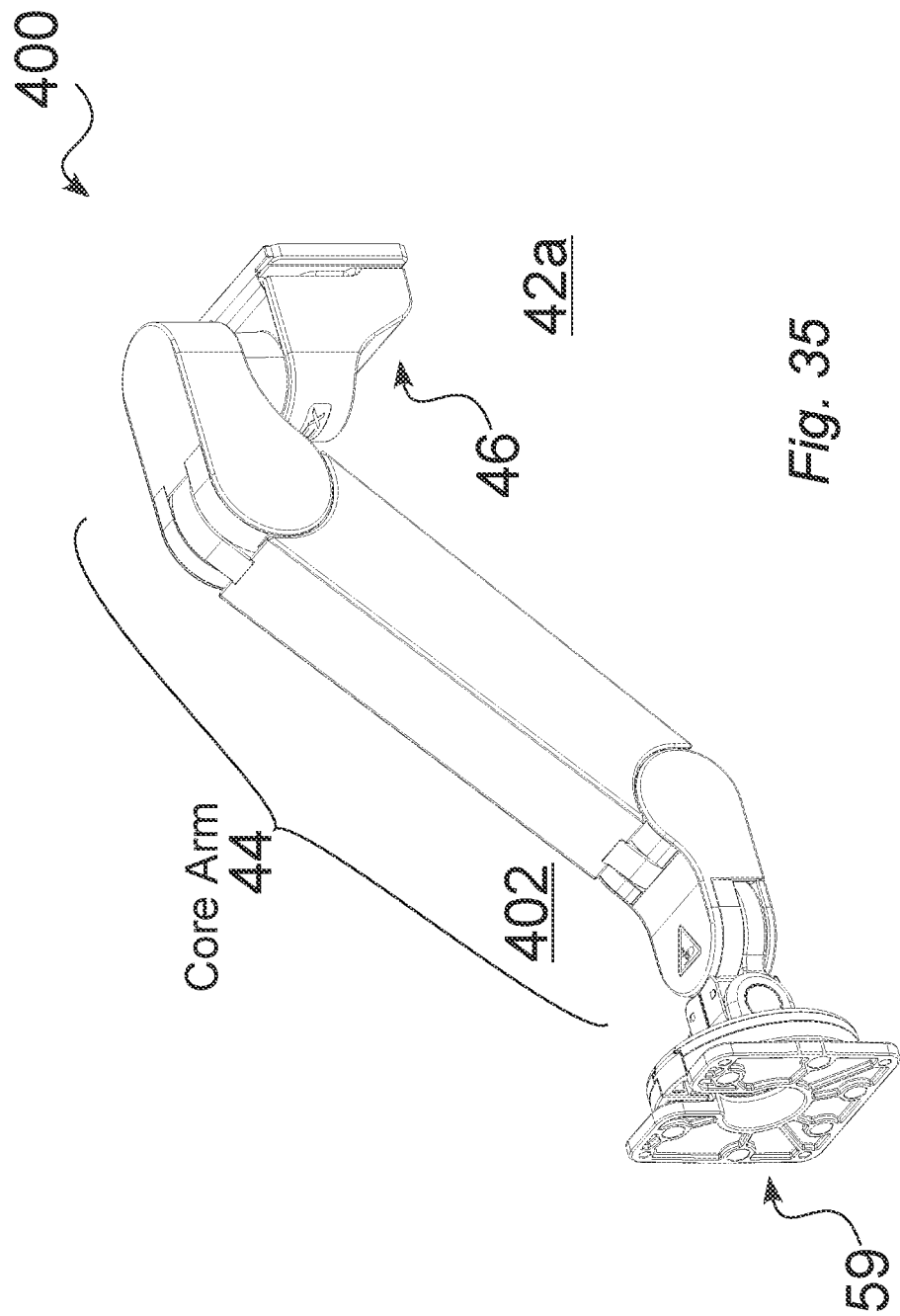
FIG. 35 is a front perspective view of an illustrative tablet arm, without extension, in a downward position.
Figure 36:
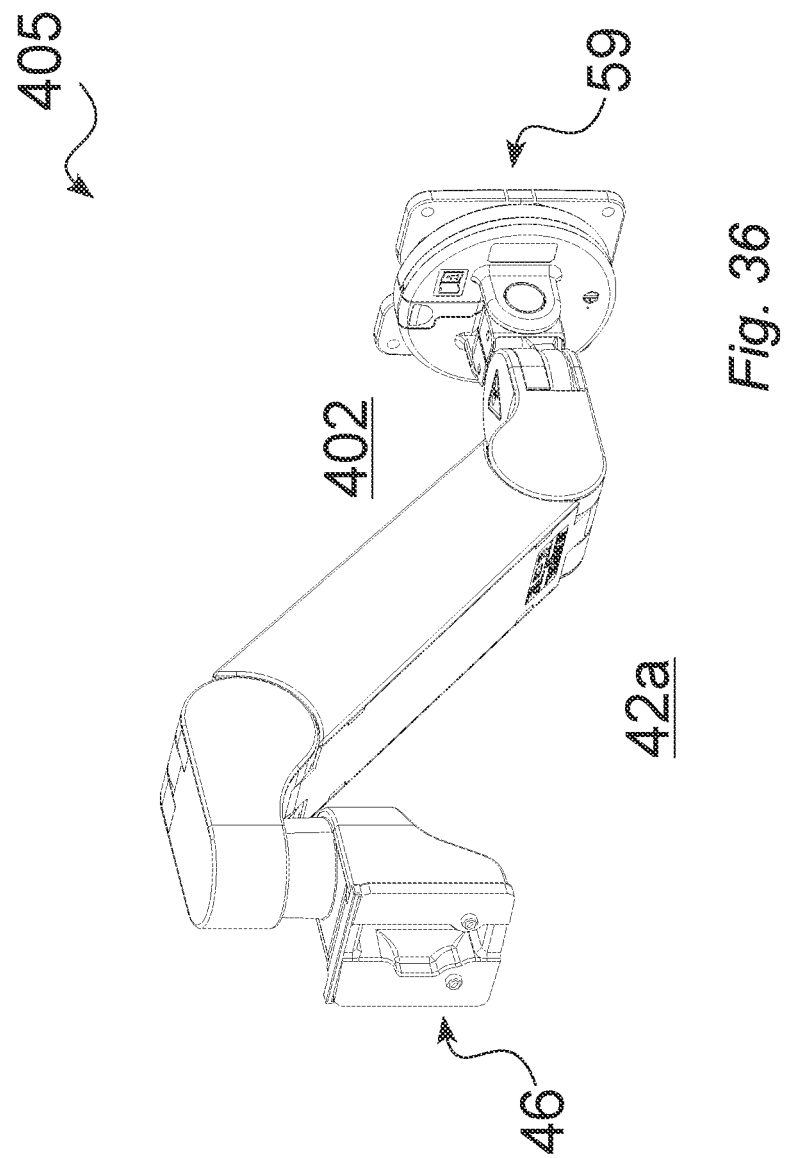
FIG. 36 is a rear perspective view of an illustrative tablet arm, without extension, in a downward position.
Figure 37:
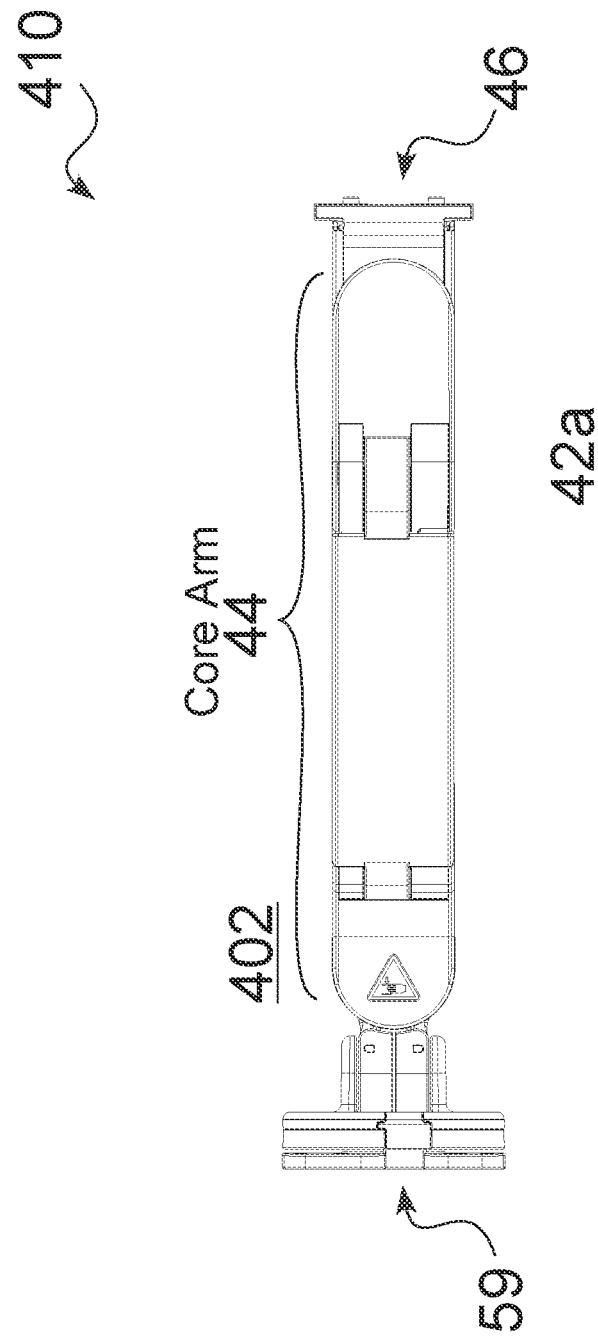
FIG. 37 is a top view of an illustrative tablet arm, without extension, in a downward position.
Figure 38:
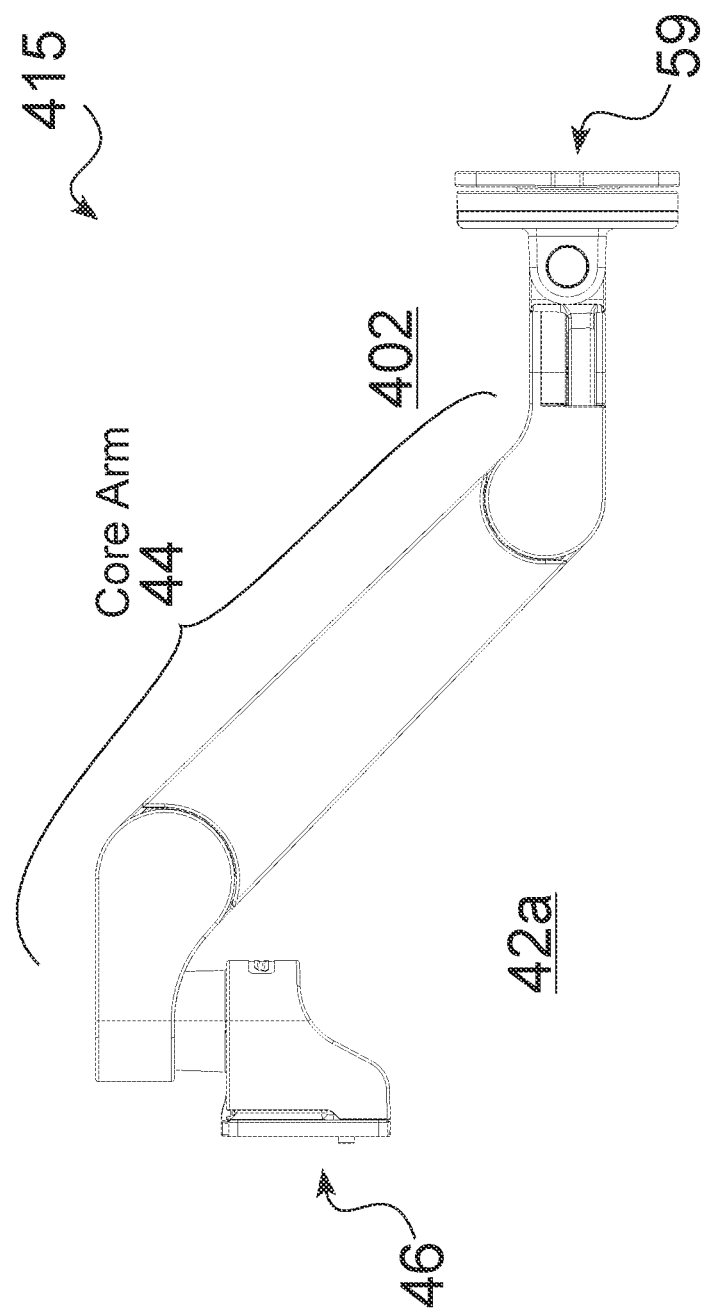
FIG. 38 is a right side view of an illustrative tablet arm, without extension, in a downward position.
Figure 39:
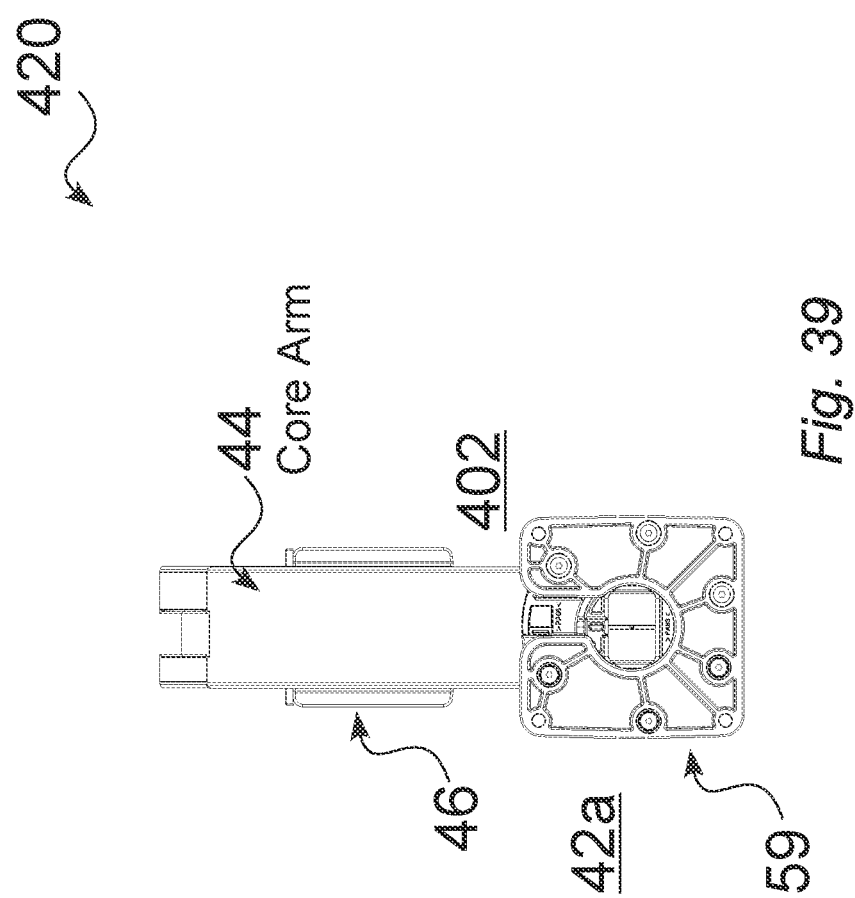
FIG. 39 is a front (tablet-side) view of an illustrative tablet arm, without extension, in a downward position.
Figure 40:
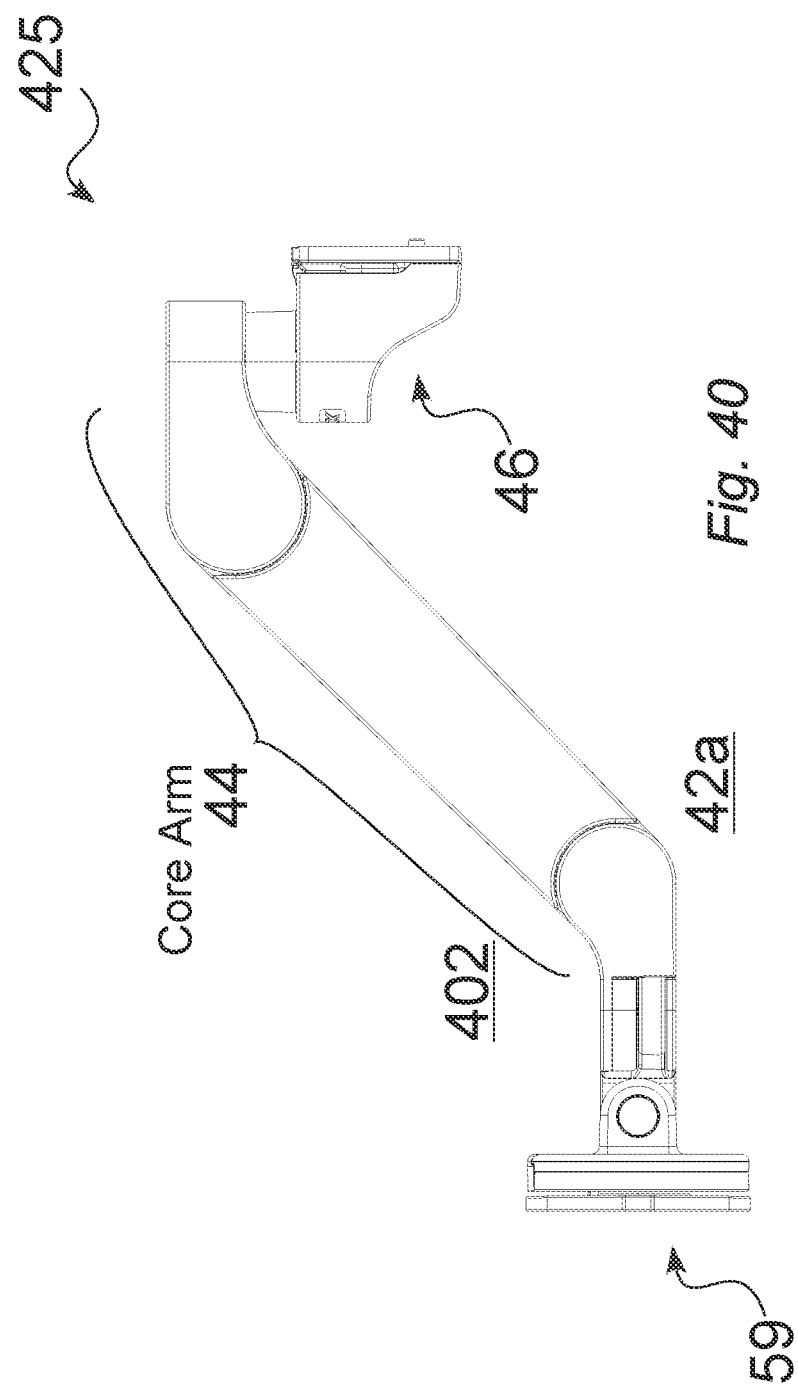
FIG. 40 is a left side view of an illustrative tablet arm, without extension, in a downward position.
Figure 41:
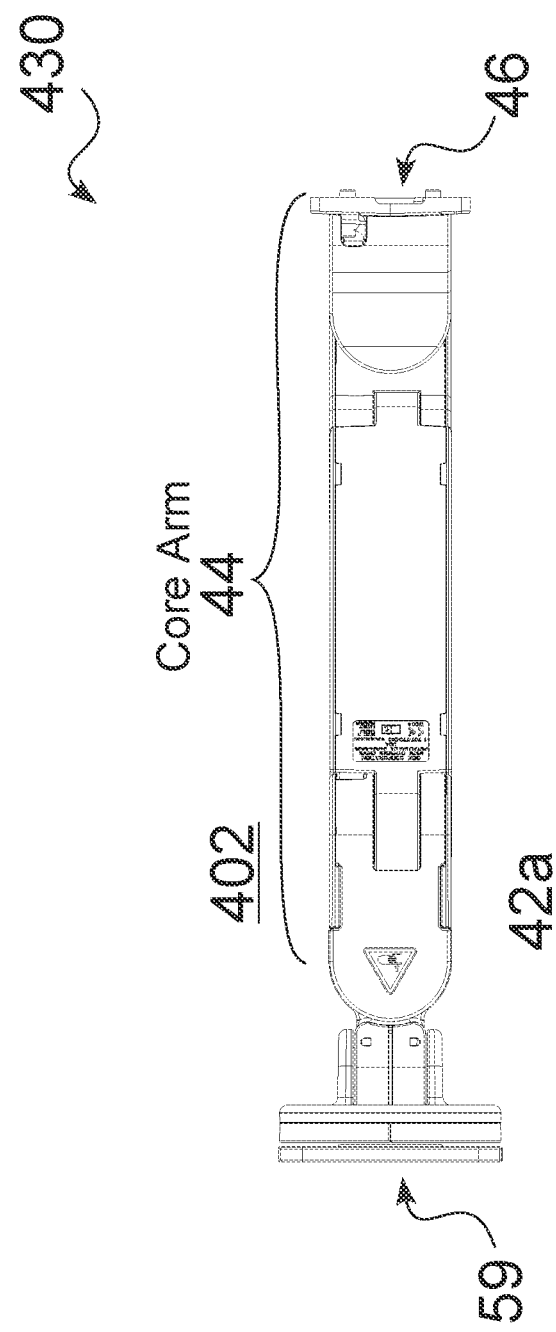
FIG. 41 is a bottom view of an illustrative tablet arm, without extension, in a downward position.

FIG. 35 is a front perspective view 400 of an illustrative tablet arm 42a, without extension 48, in a downward position 402. FIG. 36 is a rear perspective view 405 of an illustrative tablet arm 42a, without extension 48, in a downward position 402. FIG. 37 is a top view of an illustrative tablet arm 42a, without extension 48, in a downward position 402. FIG. 38 is a right side view 415 of an illustrative tablet arm 42a, without extension 48, in a downward position 402. FIG. 39 is a front (tablet-side) view 420 of an illustrative tablet arm 42, without extension 48, in a downward position 402. FIG. 40 is a left side view 425 of an illustrative tablet arm 42a, without extension 48, in a downward position 402. FIG. 41 is a bottom view 430 of an illustrative tablet arm 42a, without extension 48, in a downward position 402.

Figure 42:
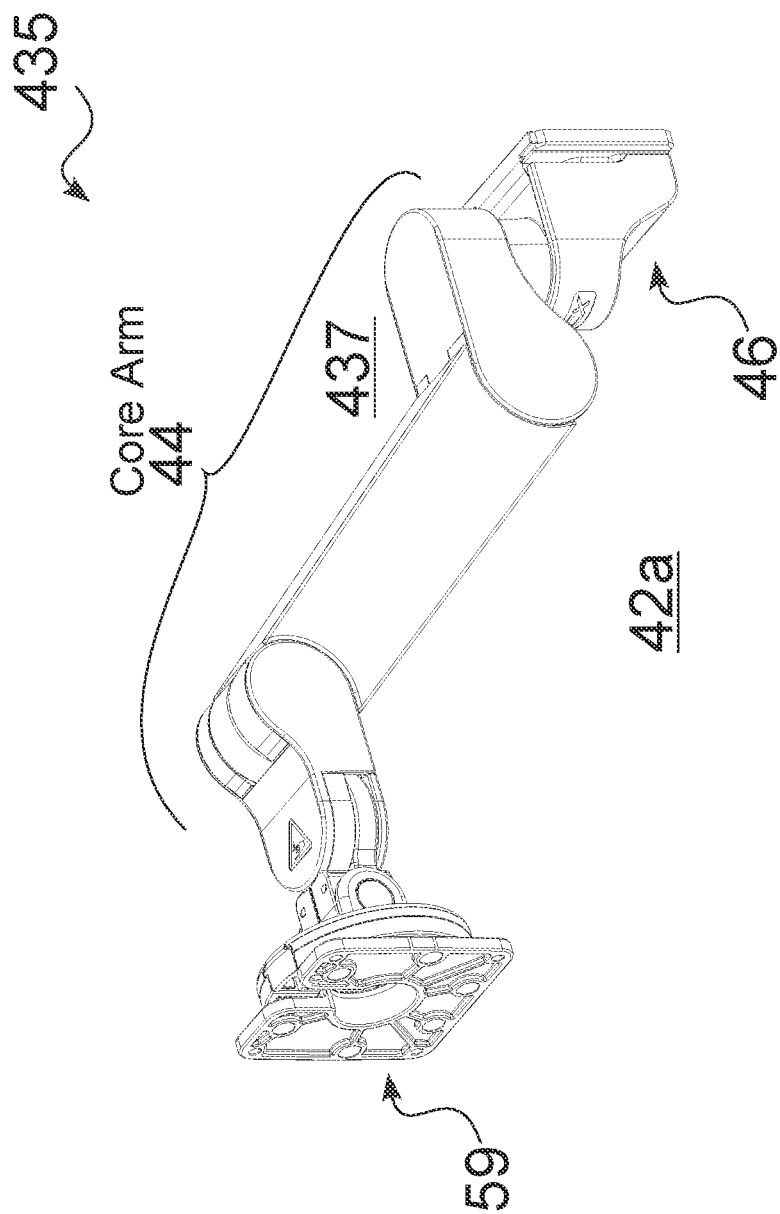
FIG. 42 is a front perspective view of an illustrative tablet arm, without extension, in an upward position.
Figure 43:
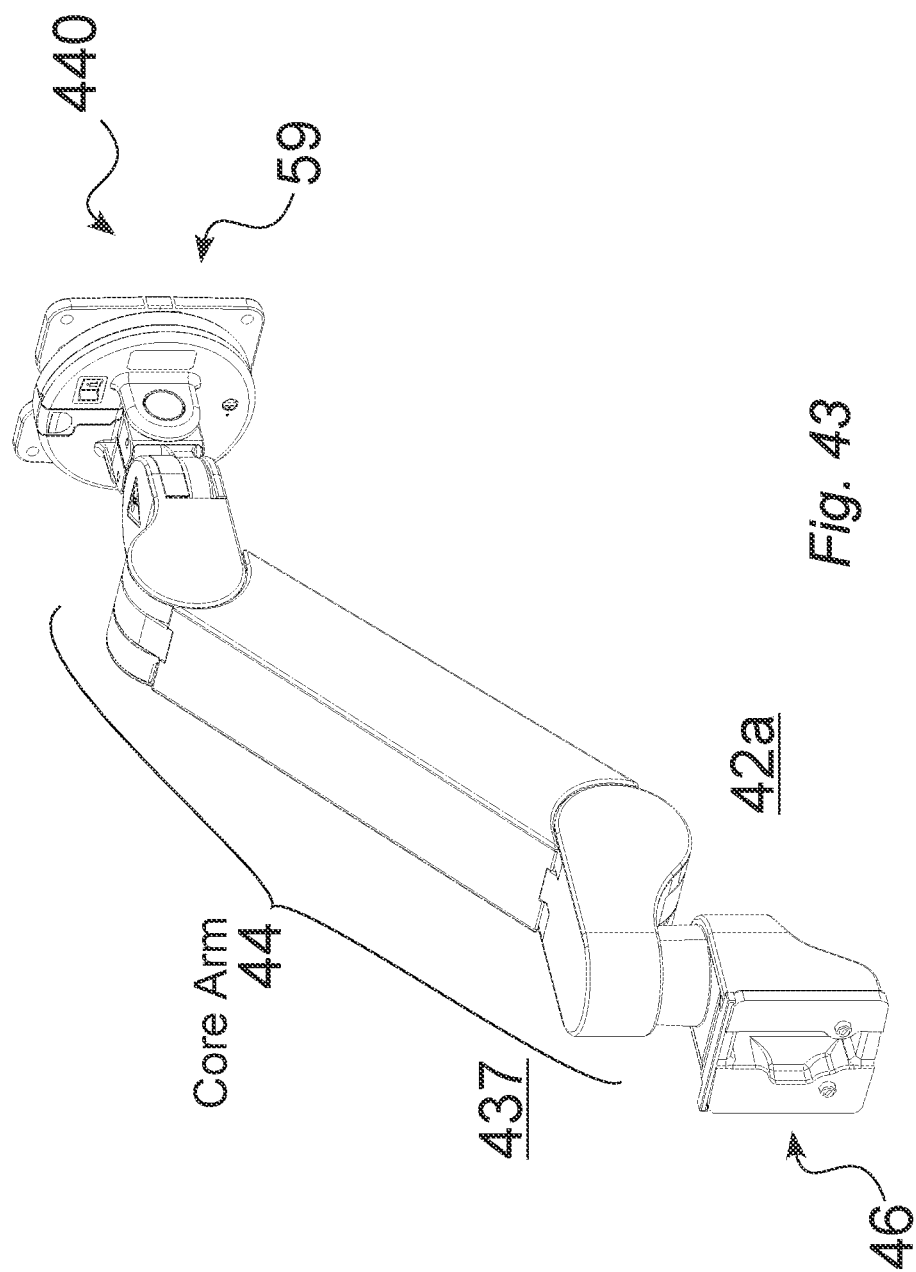
FIG. 43 is a rear perspective view of an illustrative tablet arm, without extension, in an upward position.
Figure 44:
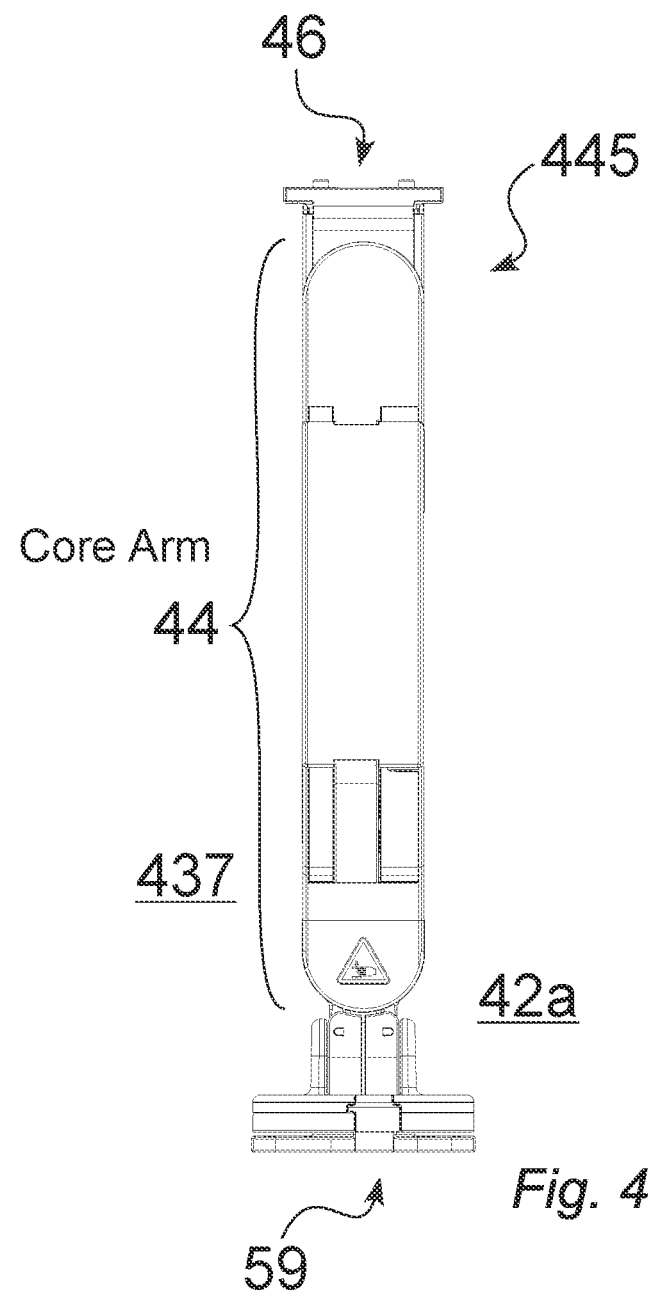
FIG. 44 is a top view of an illustrative tablet arm, without extension, in an upward position.
Figure 45:
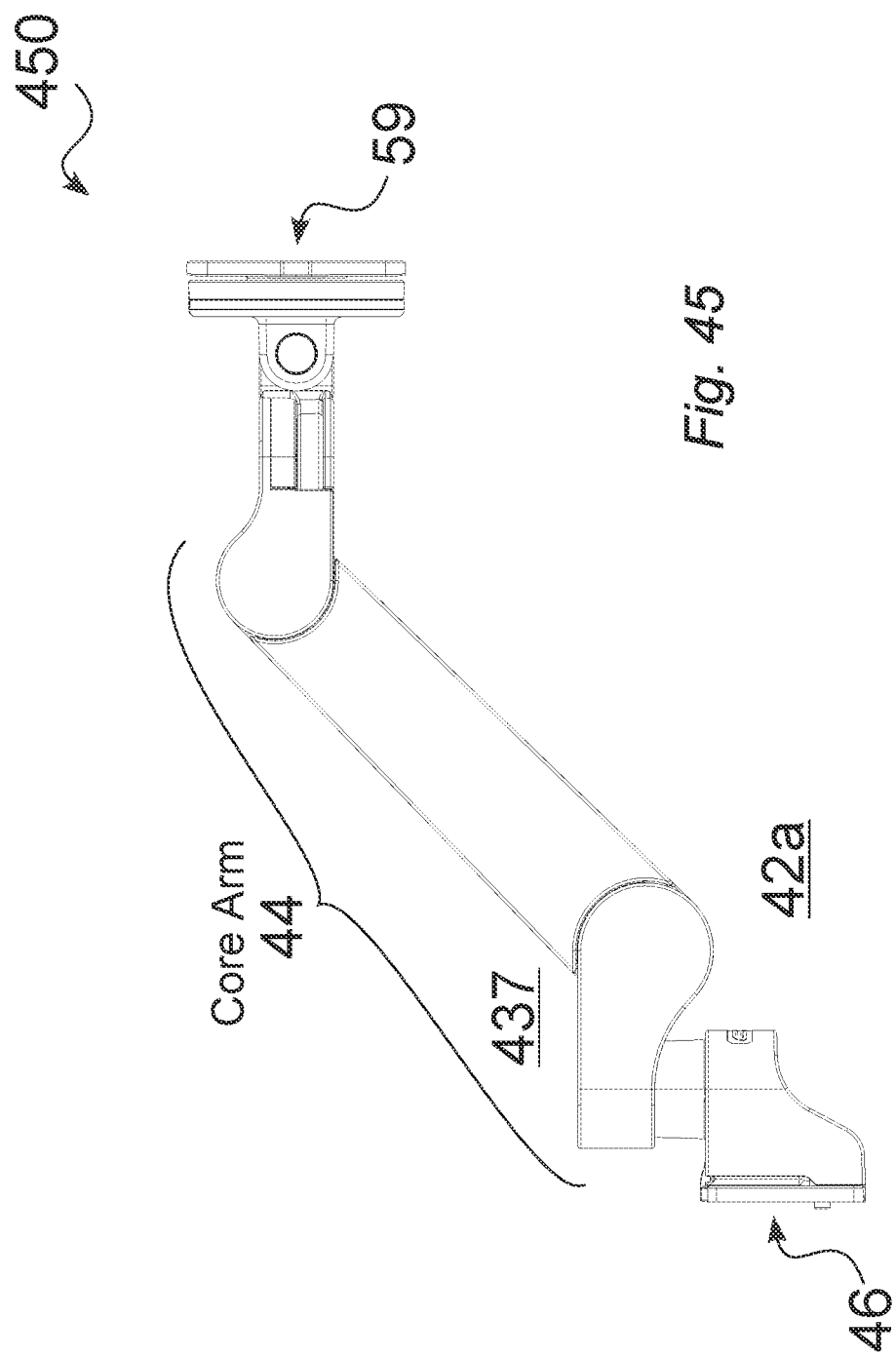
FIG. 45 is a right side view of an illustrative tablet arm, without extension, in an upward position.
Figure 46:
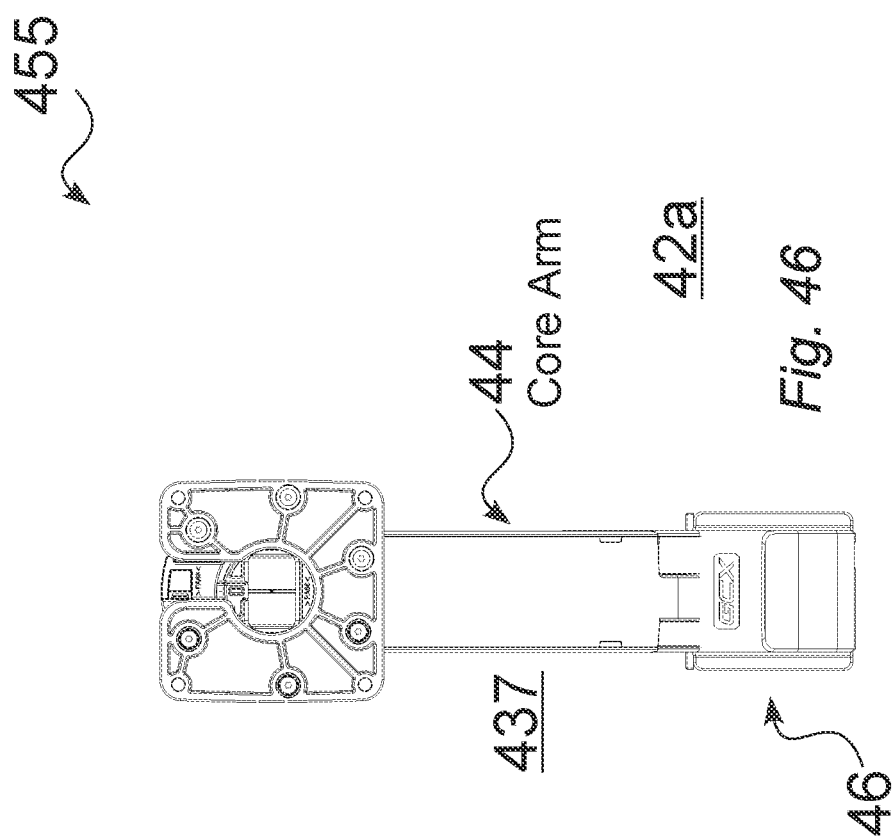
FIG. 46 is a front (tablet-side) view of an illustrative tablet arm, without extension, in an upward position.
Figure 47:
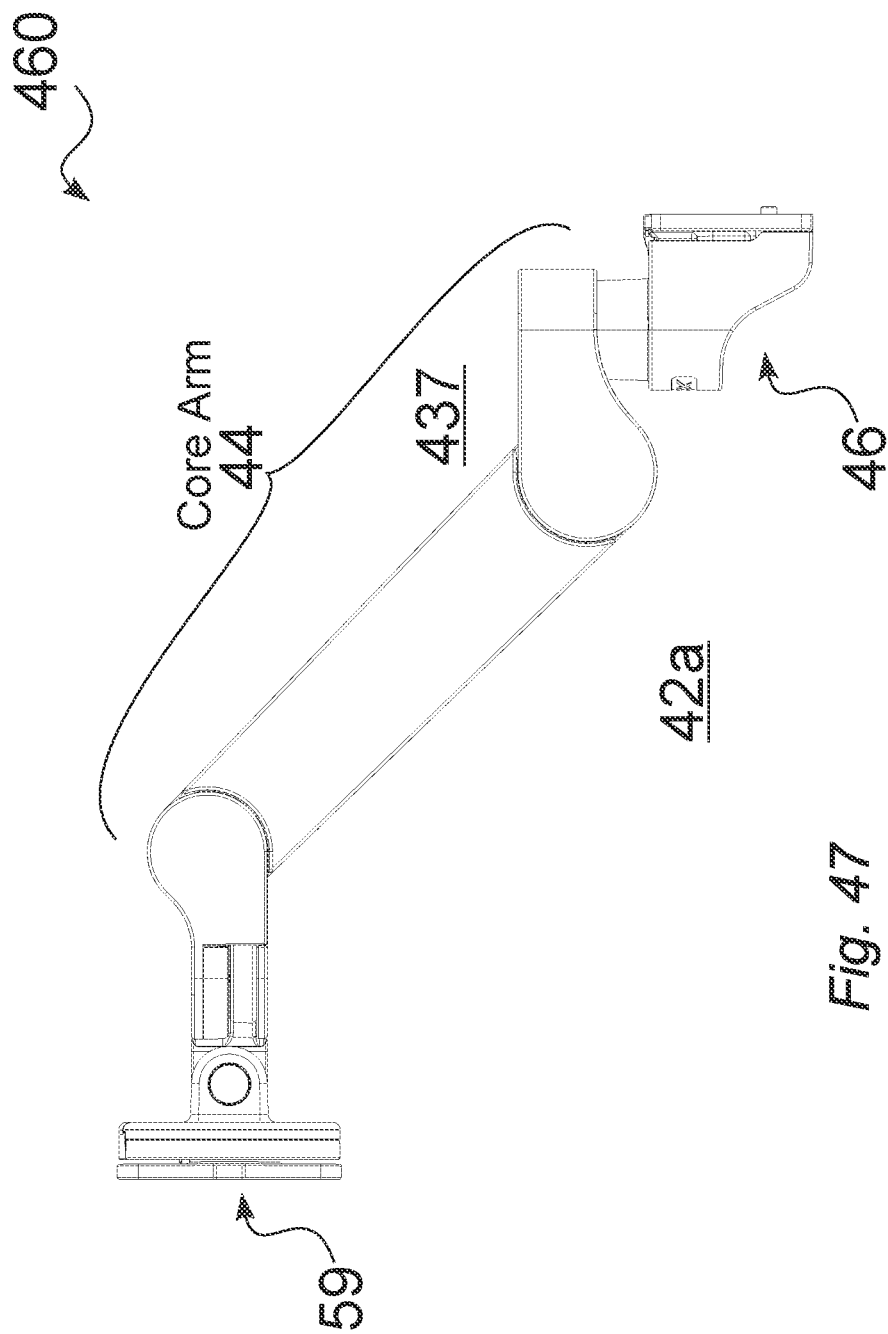
FIG. 47 is a left side view of an illustrative tablet arm, without extension, in an upward position.
Figure 48:
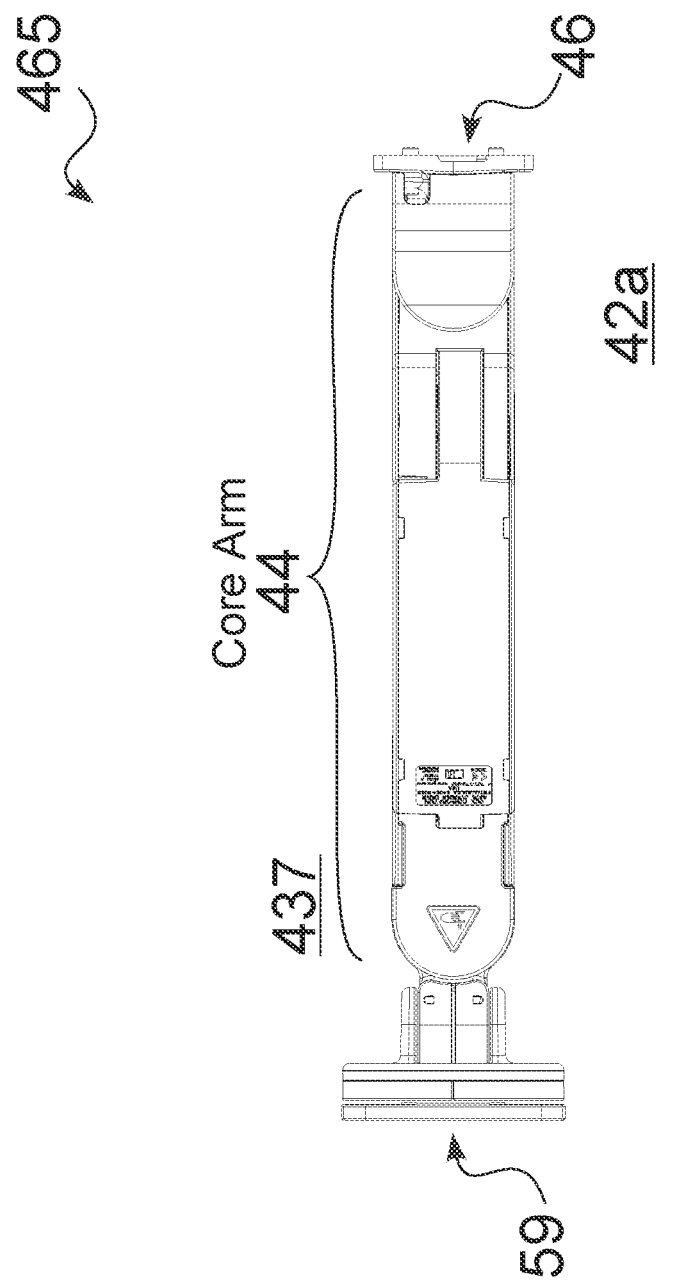
FIG. 48 is a bottom view of an illustrative tablet arm, without extension, in an upward position.

FIG. 42 is a front perspective view 435 of an illustrative tablet arm 42a, without extension 48, in an upward position 437. FIG. 43 is a rear perspective view 440 of an illustrative tablet arm 42a, without extension 48, in an upward position 437. FIG. 44 is a top view 445 of an illustrative tablet arm 42a, without extension 48, in an upward position 437. FIG. 45 is a right side view 450 of an illustrative tablet arm 42a, without extension 48, in an upward position 437. FIG. 46 is a front (tablet-side) view 455 of an illustrative tablet arm 42a, without extension 48, in an upward position 437. FIG. 47 is a left side view 460 of an illustrative tablet arm 42a, without extension 48a, in an upward position 437. FIG. 48 is a bottom view 465 of an illustrative tablet arm 42*a*, without extension 48, in an upward position 437.

Figure 49:
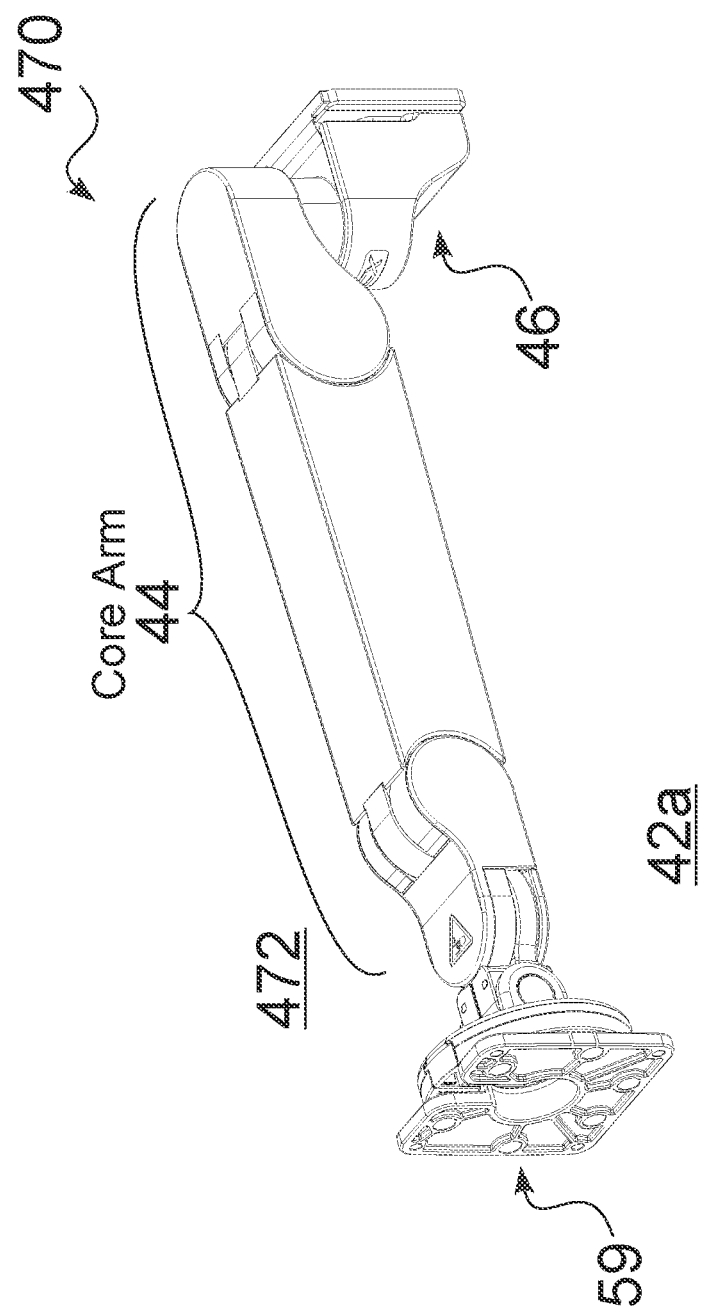
FIG. 49 is a front perspective view of an illustrative tablet arm, without extension, in a horizontal position.
Figure 50:
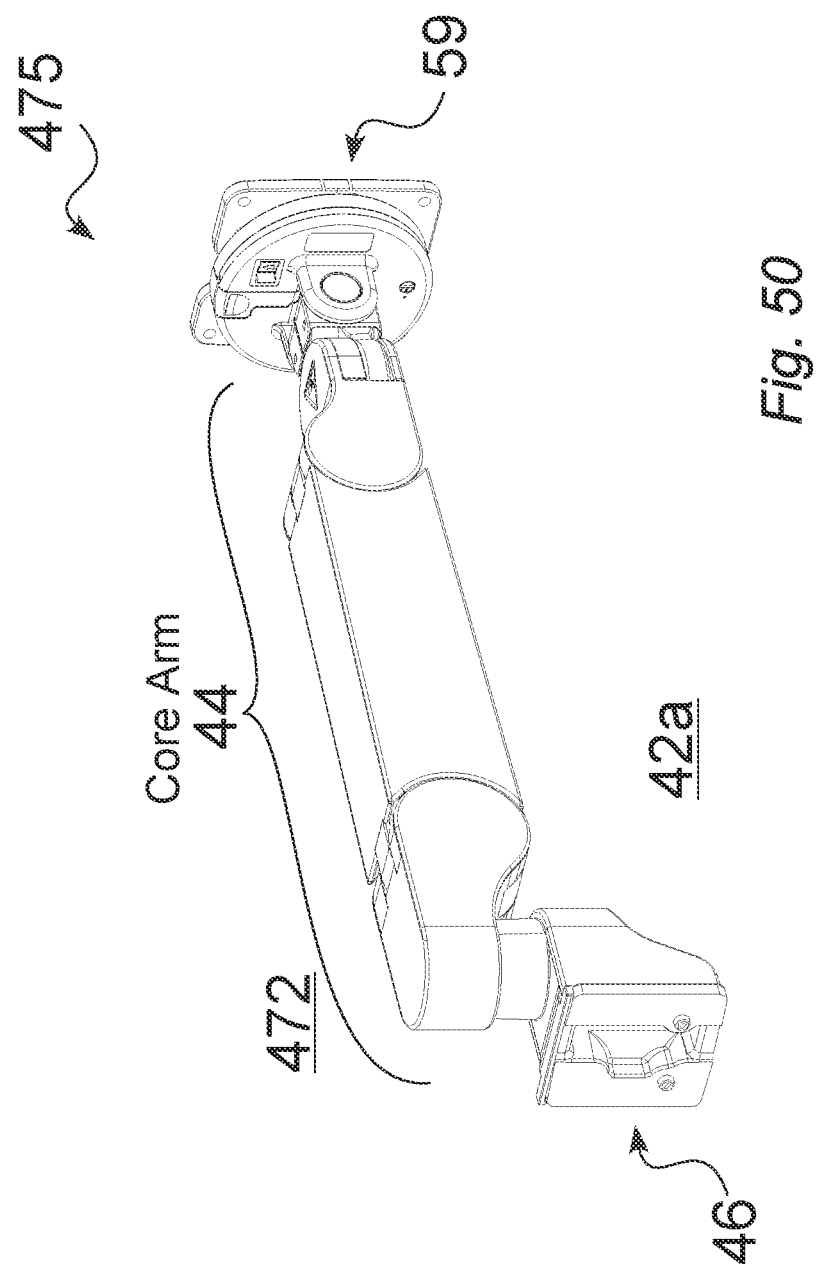
FIG. 50 is a rear perspective view of an illustrative tablet arm, without extension, in a horizontal position.
Figure 51:
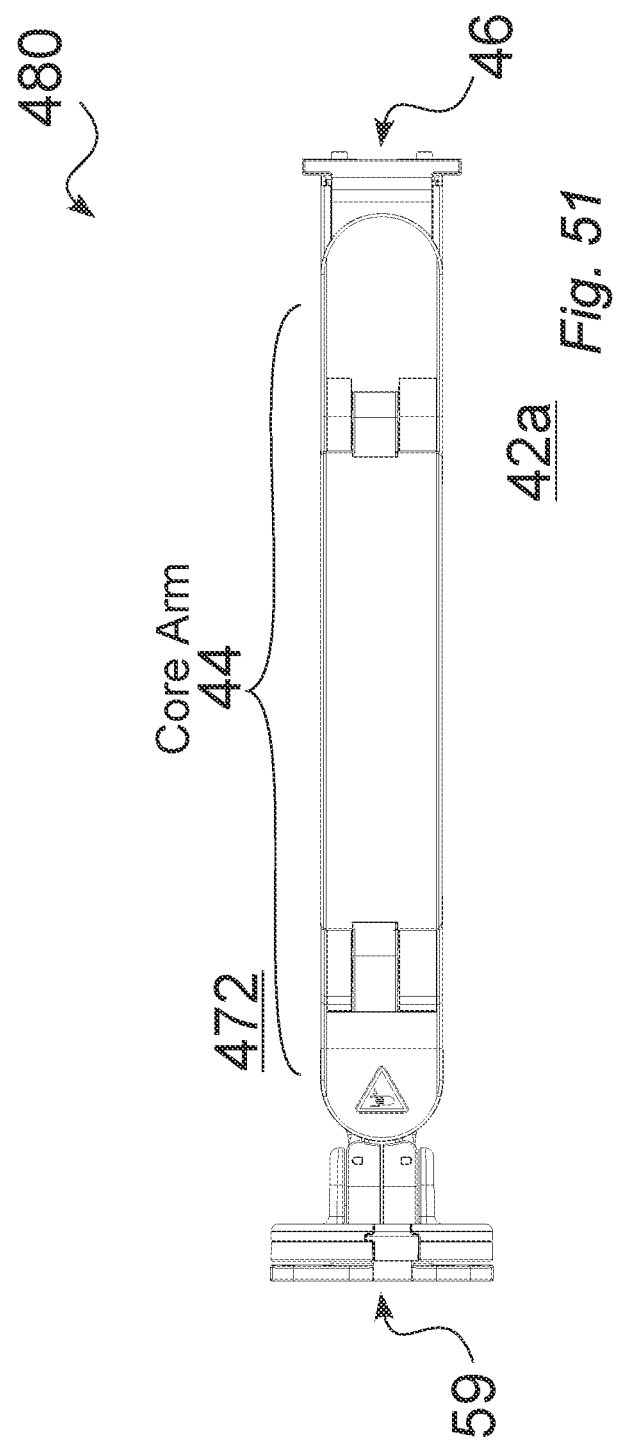
FIG. 51 is a top view of an illustrative tablet arm, without extension, in a horizontal position.
Figure 52:
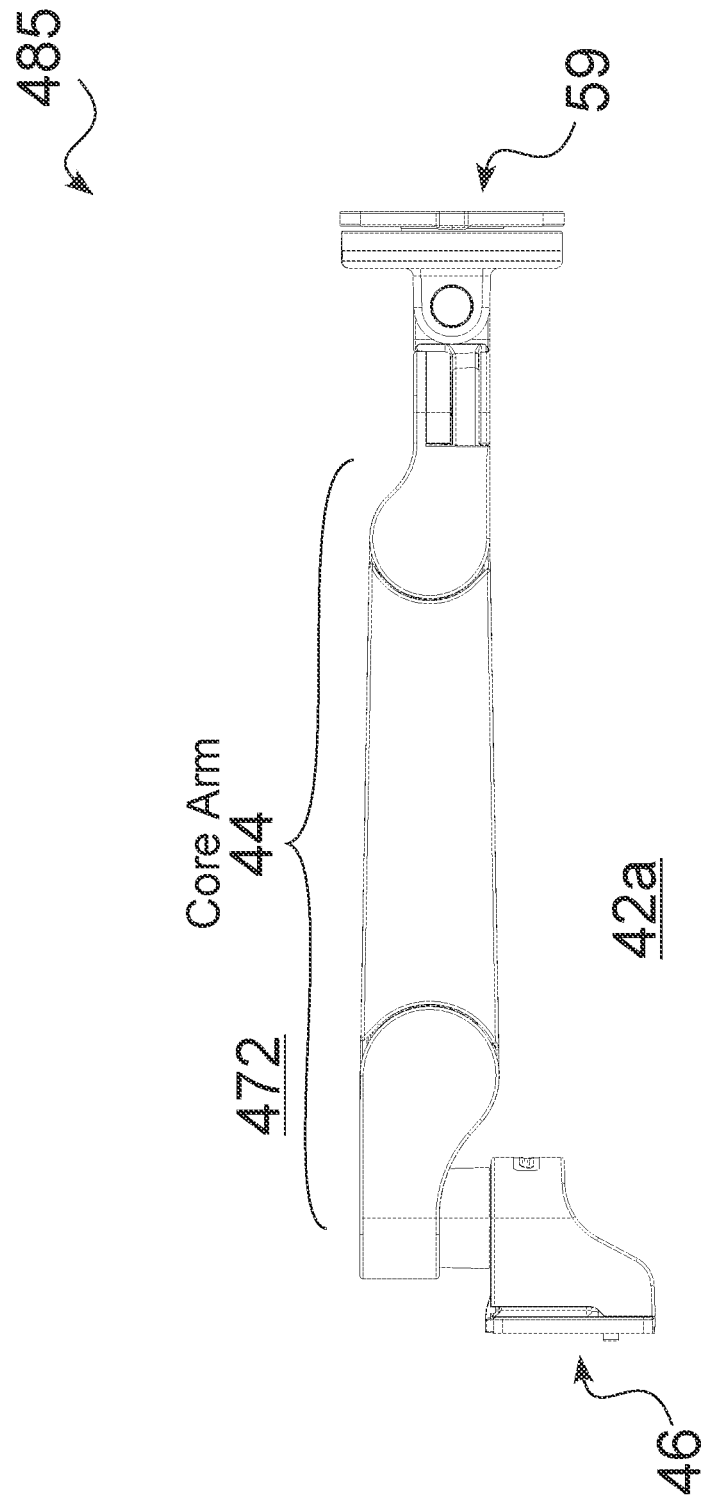
FIG. 52 is a right side view of an illustrative tablet arm, without extension, in a horizontal position.
Figure 53:
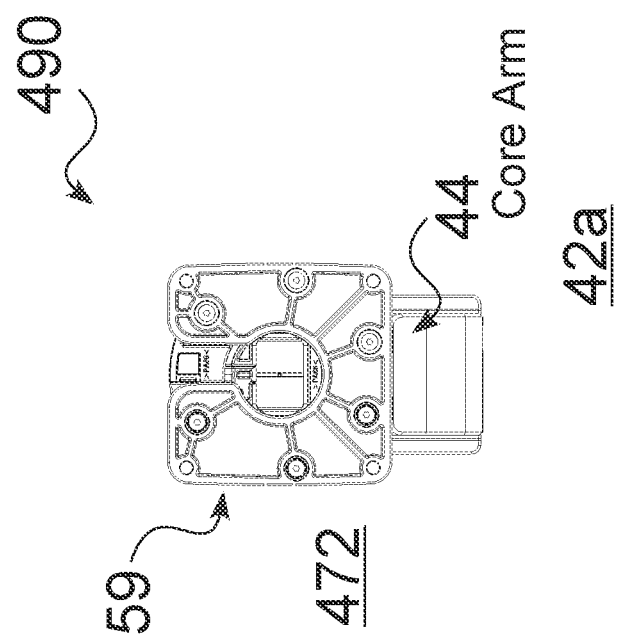
FIG. 53 is a front (tablet-side) view of an illustrative tablet arm, without extension, in a horizontal position.
Figure 54:
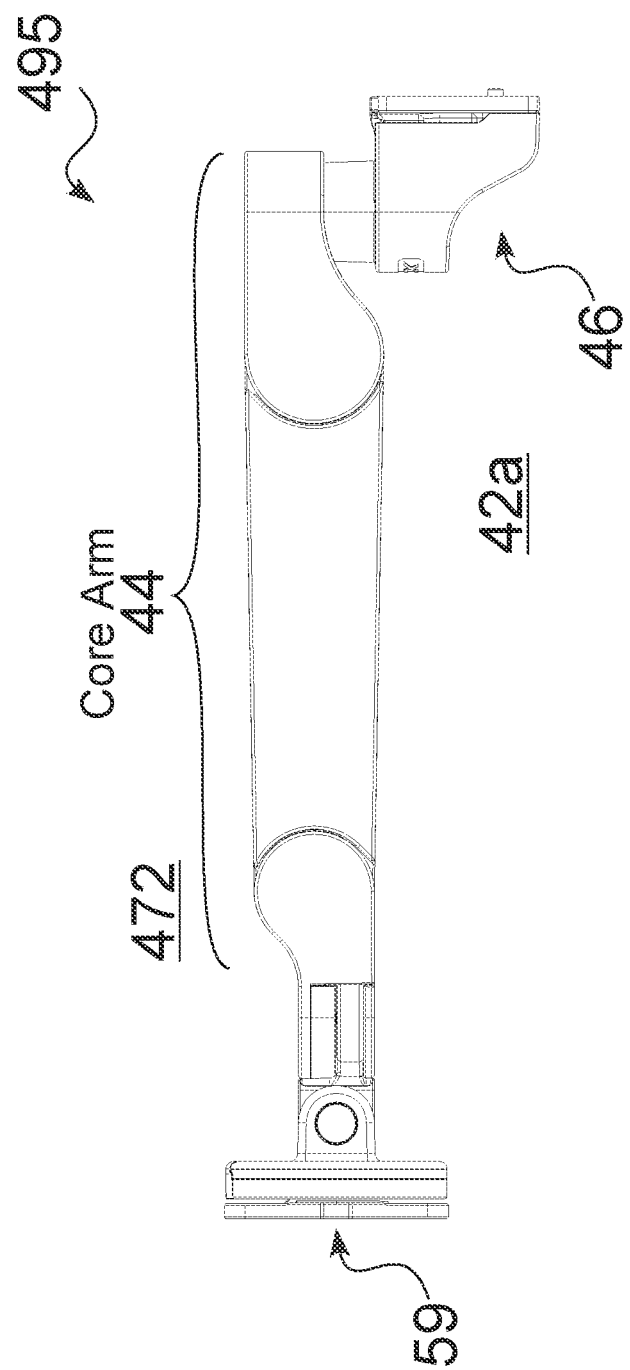
FIG. 54 is a left side view of an illustrative tablet arm, without extension, in a horizontal position.
Figure 55:
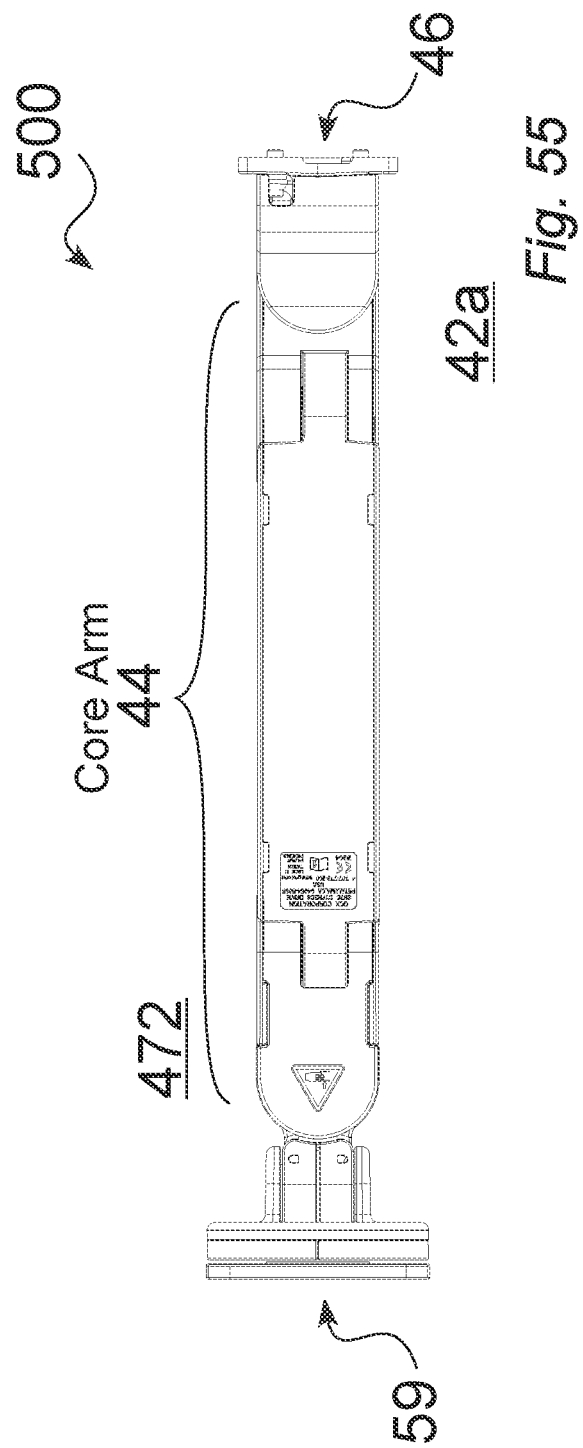
FIG. 55 is a bottom view of an illustrative tablet arm, without extension, in a horizontal position.

FIG. 49 is a front perspective view 470 of an illustrative tablet arm 42*a*, without extension 48, in a horizontal position 472. FIG. 50 is a rear perspective view 475 of an illustrative tablet arm 42*a*, without extension 48, in a horizontal position 472. FIG. 51 is a top view 480 of an illustrative tablet arm 42*a*, without extension 48, in a horizontal position 472. FIG. 52 is a right side view 485 of an illustrative tablet arm 42*a*, without extension 48, in a horizontal position 472. FIG. 53 is a front (tablet-side) view 490 of an illustrative tablet arm 42*a*, without extension 48, in a horizontal position 472. FIG. 54 is a left side view 495 of an illustrative tablet arm 42*a*, without extension 48, in a horizontal position 472. FIG. 55 is a bottom view 500 of an illustrative tablet arm 42*a*, without extension 48, in a horizontal position 472.

Embodiments of the tablet arm 42*b* that include an extension arm 48 can also be configured to provide controlled and stable movement, through a wide variety of positions, and for a wide variety of mounted devices 52.

Figure 56:
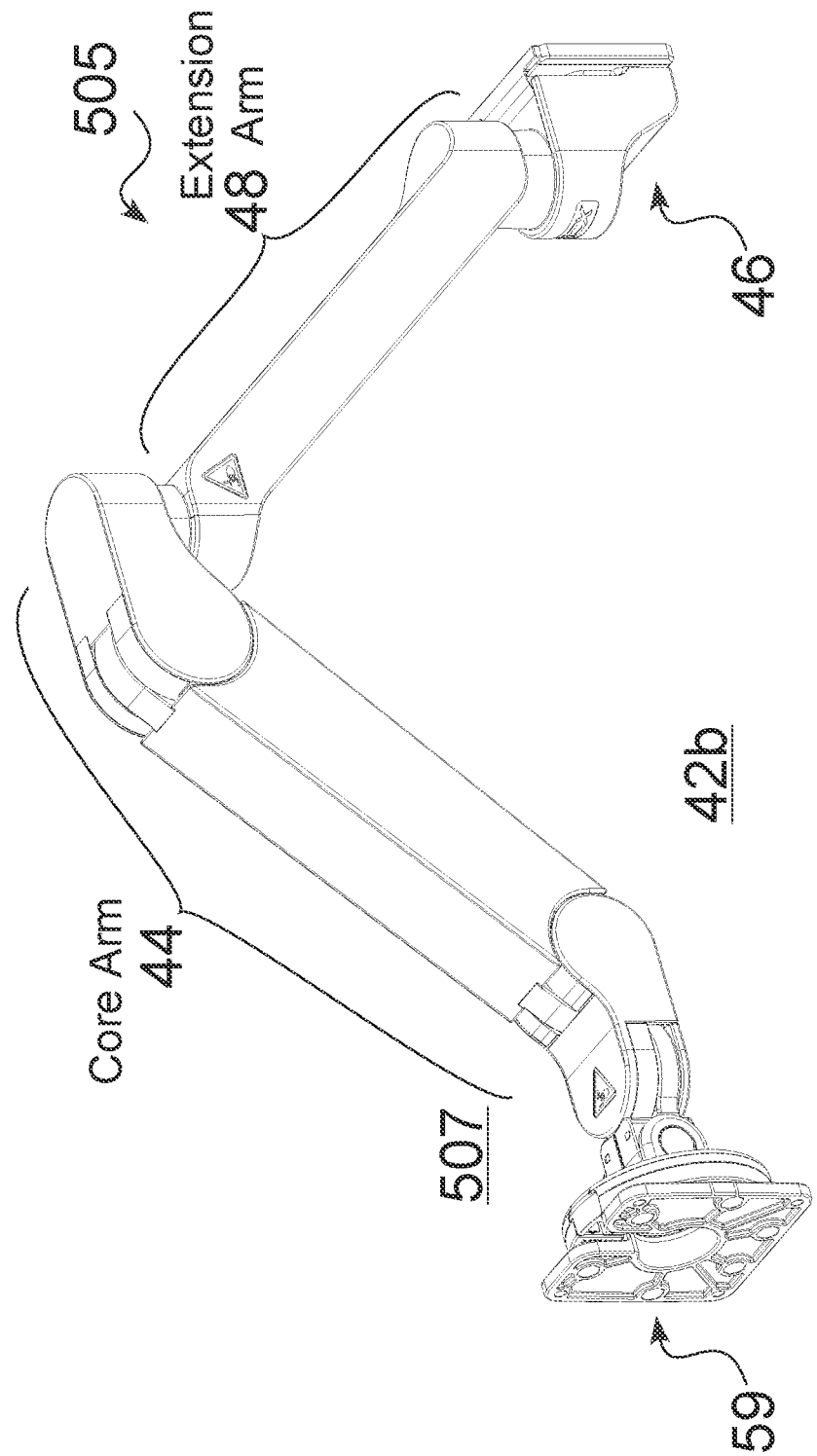
FIG. 56 is a front perspective view of an illustrative tablet arm, with extension, in a downward position.
Figure 57:
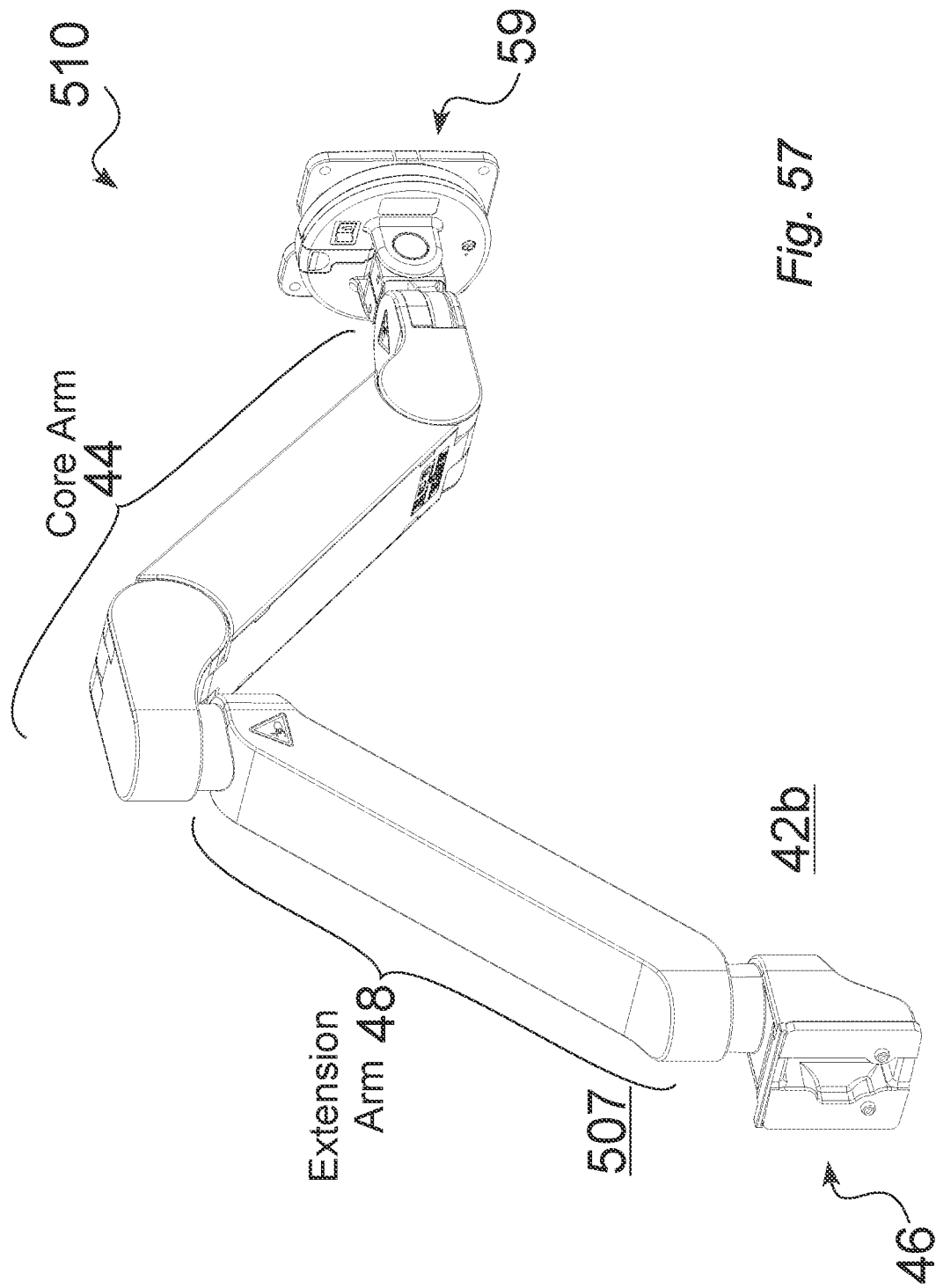
FIG. 57 is a rear perspective view of an illustrative tablet arm, with extension, in a downward position.
Figure 58:
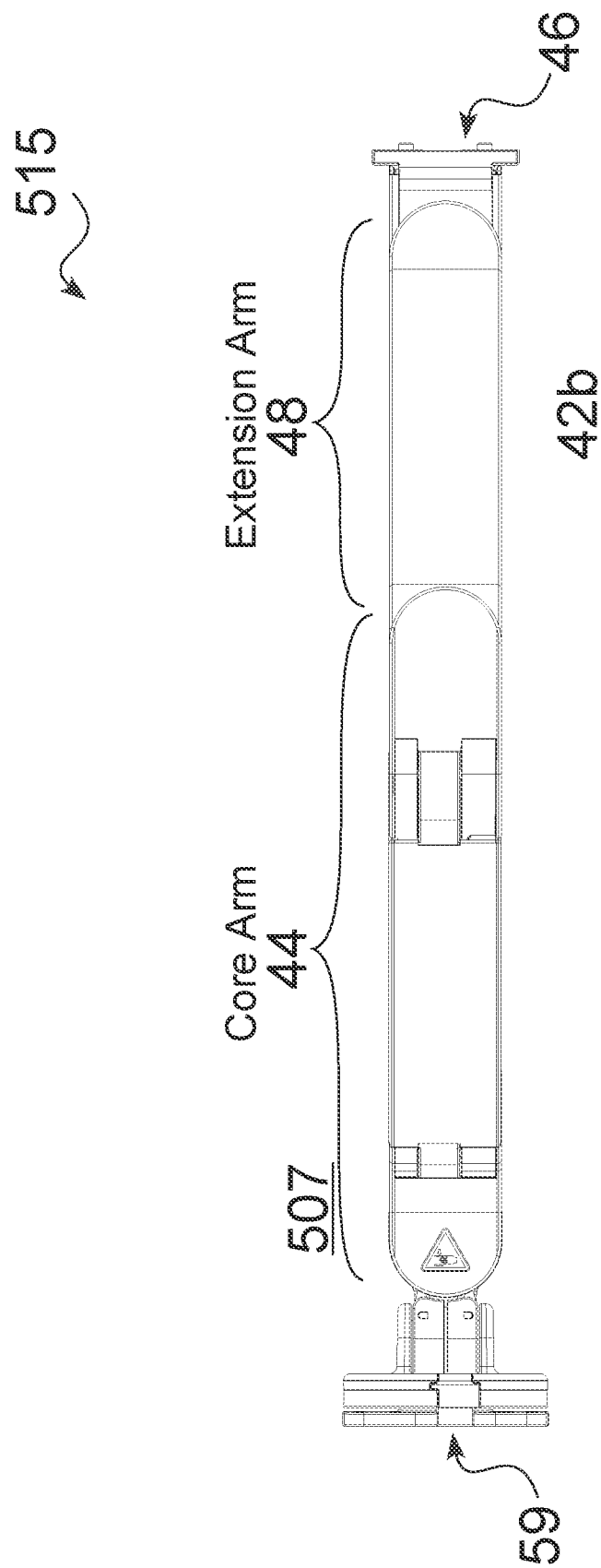
FIG. 58 is a top view of an illustrative tablet arm, with extension, in a downward position.
Figure 59:
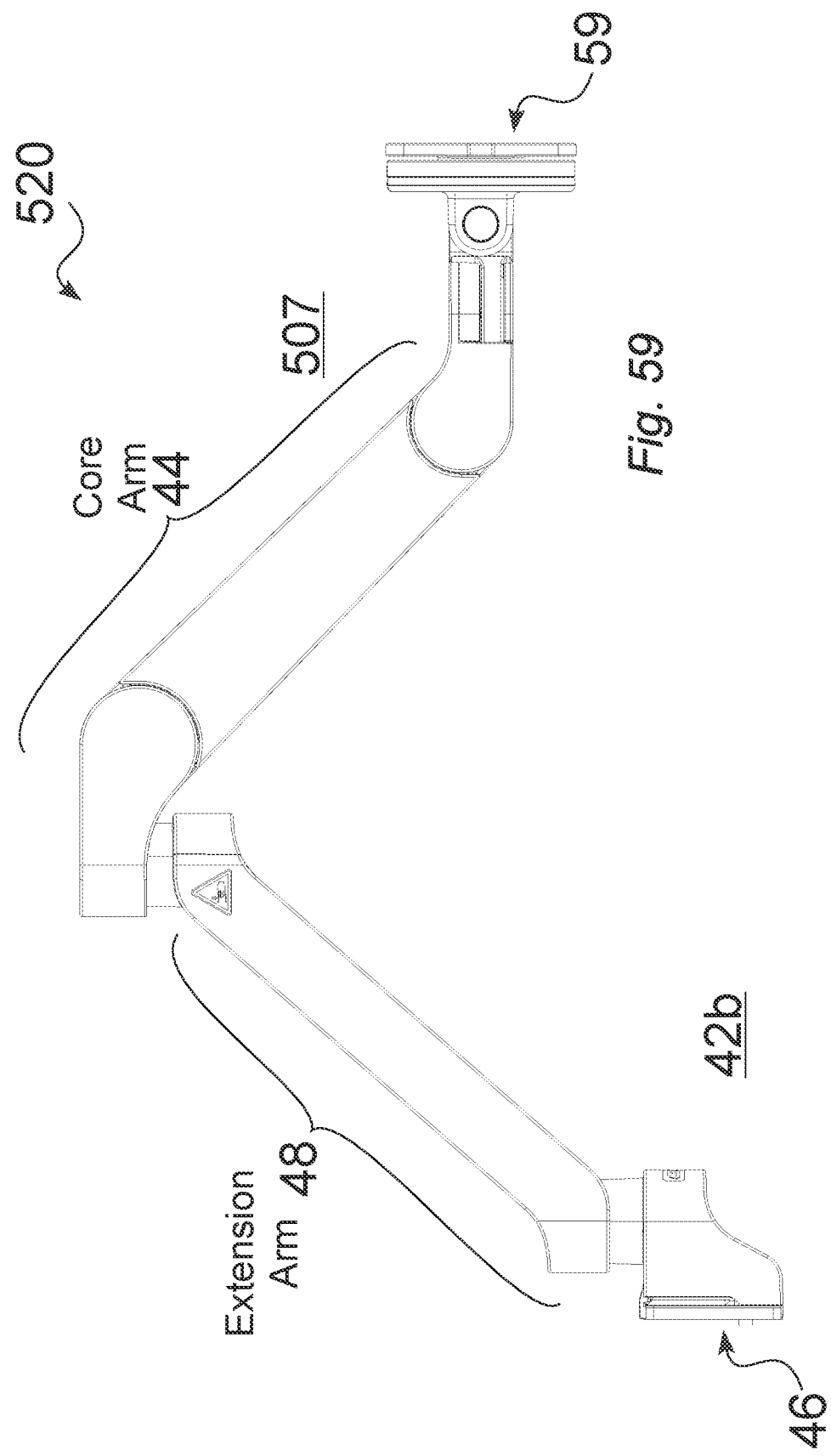
FIG. 59 is a right side view of an illustrative tablet arm, with extension, in a downward position.
Figure 60:
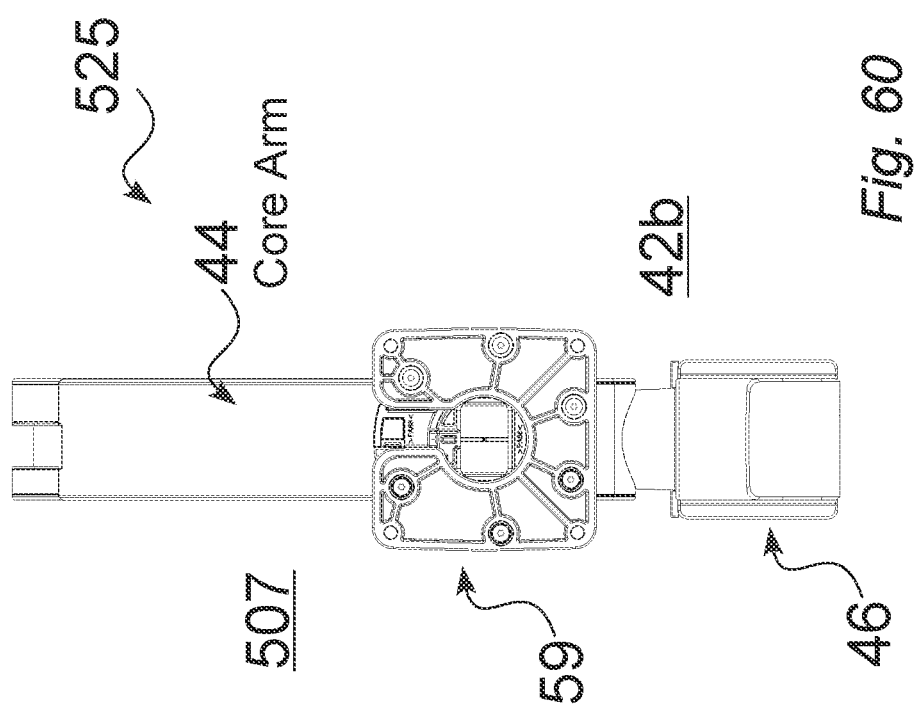
FIG. 60 is a front (tablet-side) view of an illustrative tablet arm, with extension, in a downward position.
Figure 61:
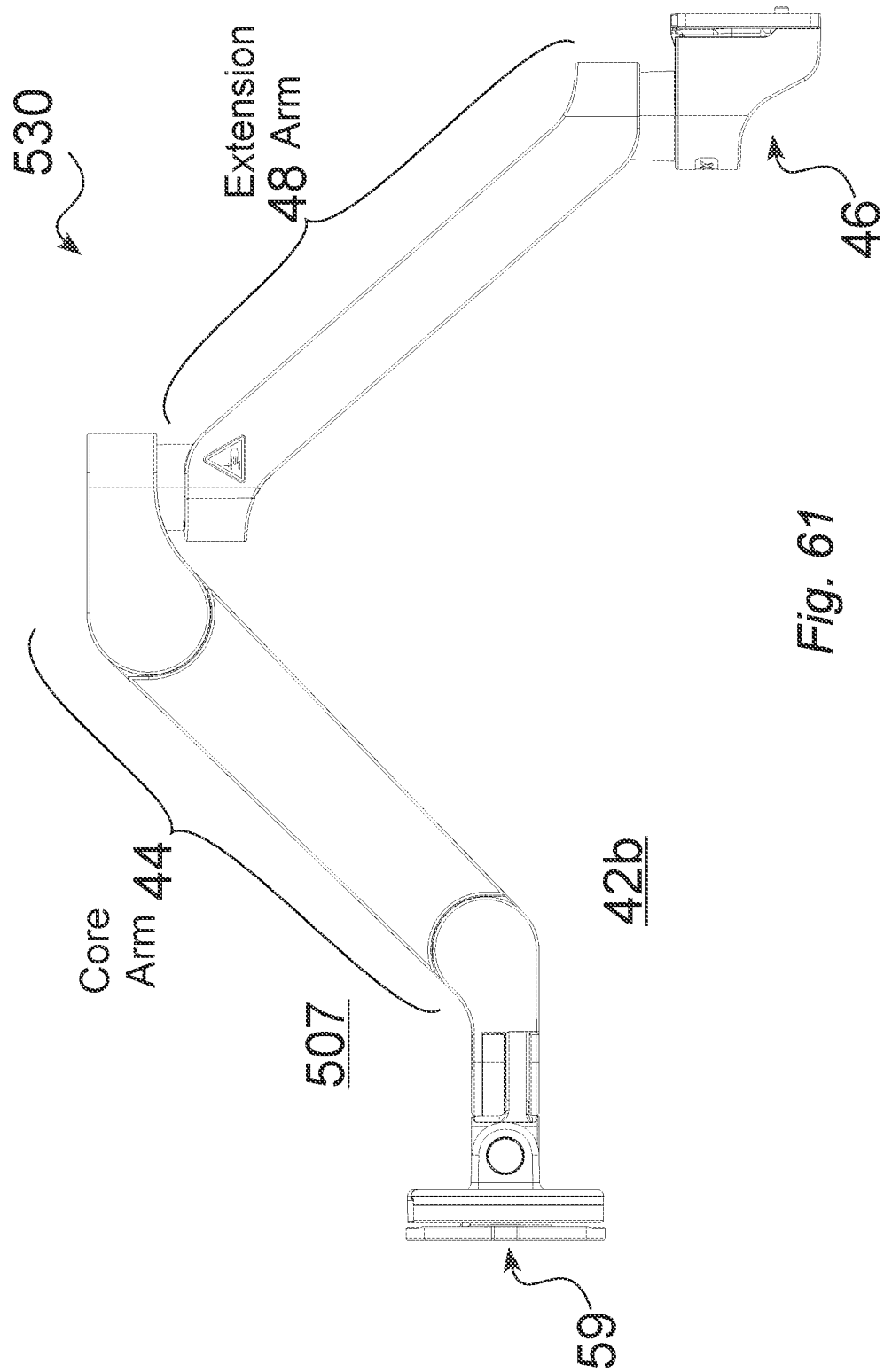
FIG. 61 is a left side view of an illustrative tablet arm, with extension, in a downward position.
Figure 62:
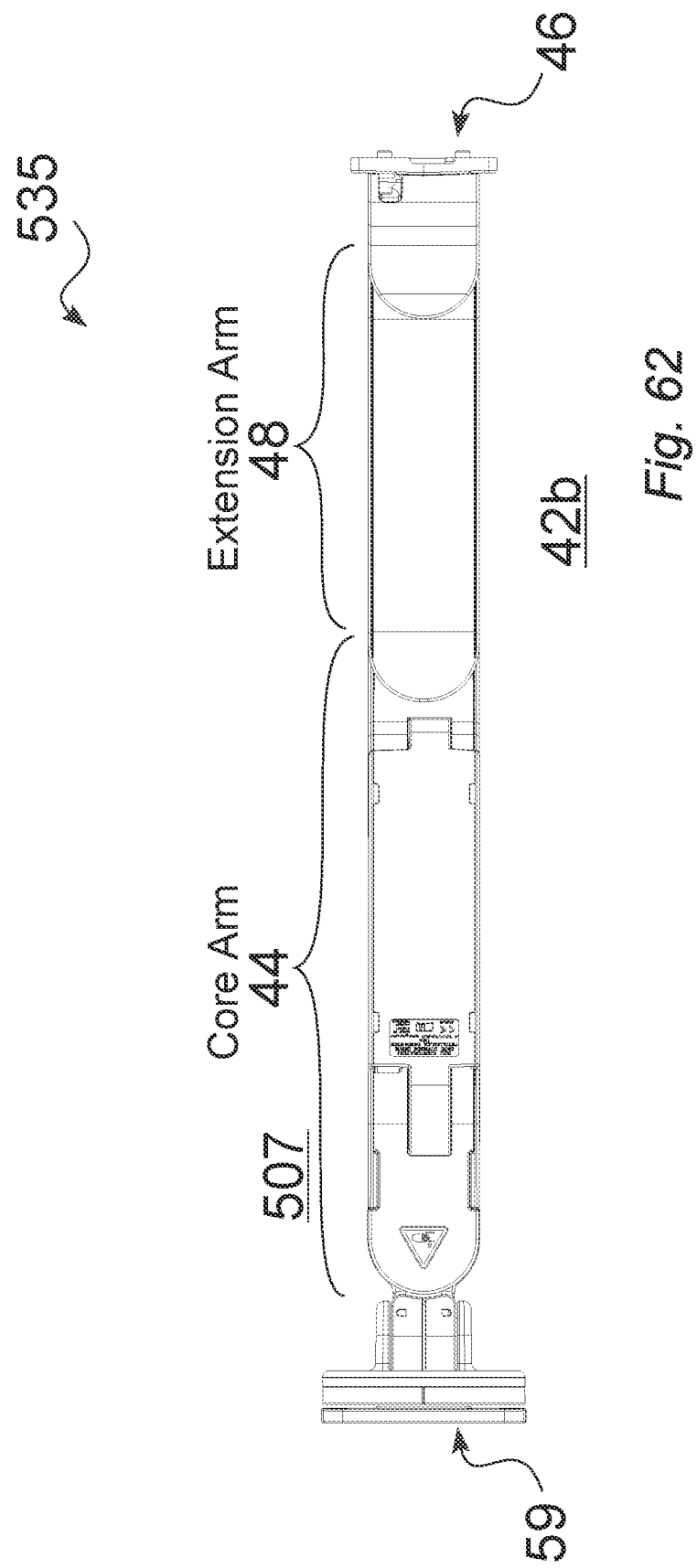
FIG. 62 is a bottom view of an illustrative tablet arm, with extension, in a downward position.

FIG. 56 is a front perspective view 505 of an illustrative tablet arm 42*b*, with extension 48, in a downward position 507. FIG. 57 is a rear perspective view 510 of an illustrative tablet arm 42*b*, with extension 48, in a downward position 507. FIG. 58 is a top view 515 of an illustrative tablet arm 42*b*, with extension 48, in a downward position 507. FIG. 59 is a right side view 520 of an illustrative tablet arm 42*b*, with extension 48, in a downward position 507. FIG. 60 is a front (tablet-side) view 525 of an illustrative tablet arm 42*b*, with extension 48, in a downward position 507. FIG. 61 is a left side view 530 of an illustrative tablet arm 42*b*, with extension 48, in a downward position 507. FIG. 62 is a bottom view 535 of an illustrative tablet arm 42*b*, with extension 48, in a downward position 507.

Figure 63:
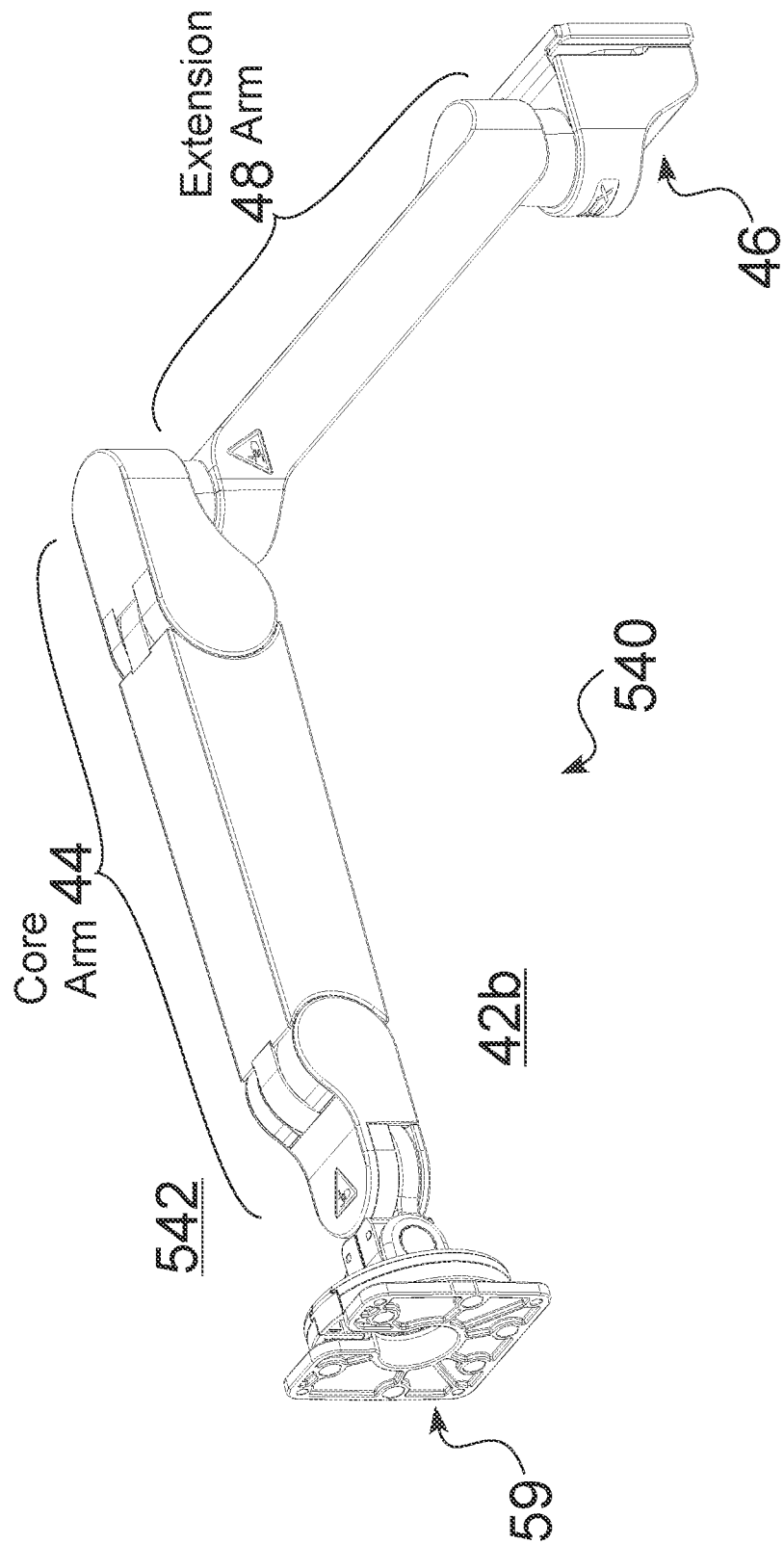
FIG. 63 is a front perspective view of an illustrative tablet arm, with extension, in a horizontal position.
Figure 64:
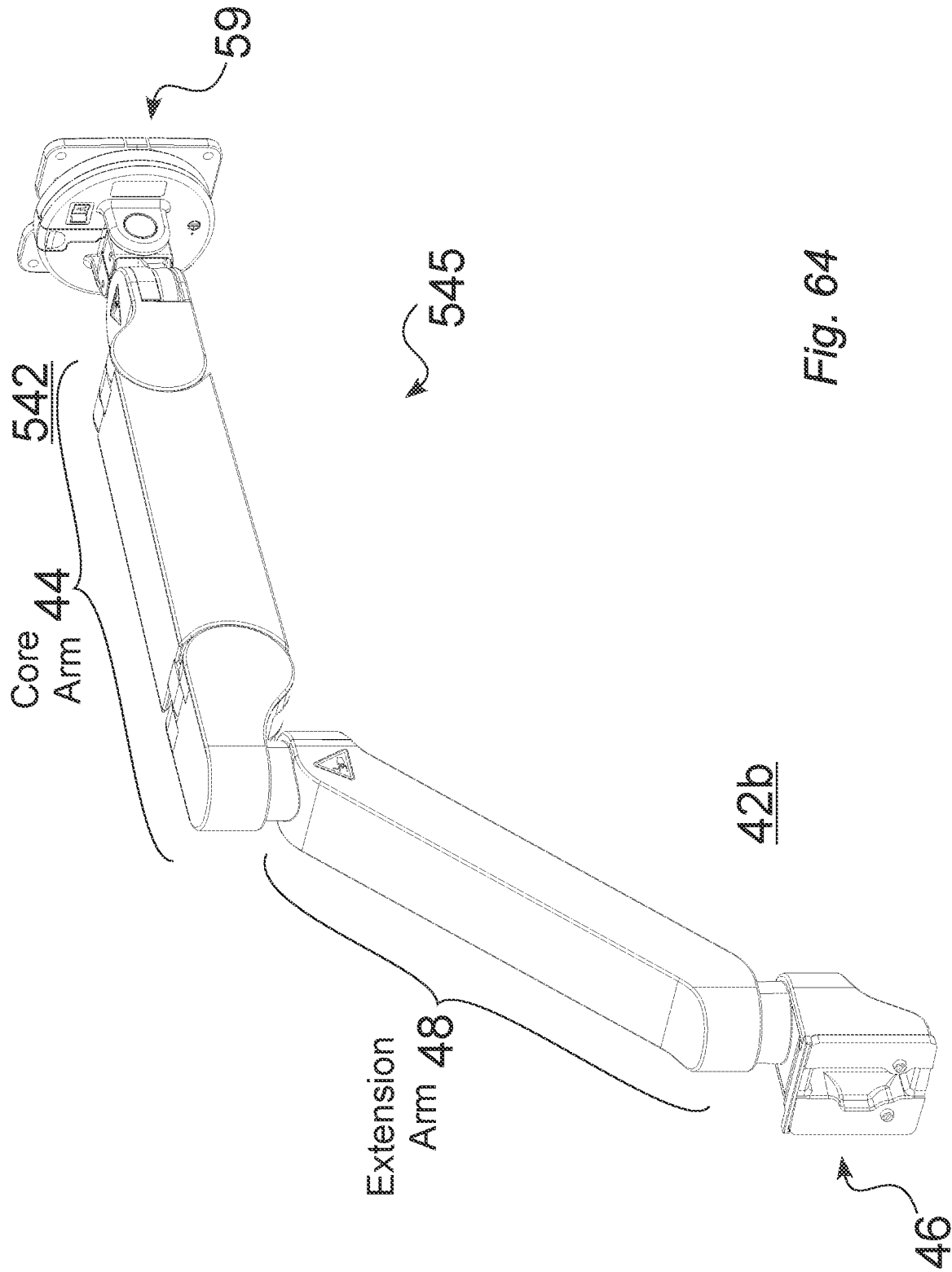
FIG. 64 is a rear perspective view of an illustrative tablet arm, with extension, in a horizontal position.
Figure 65:
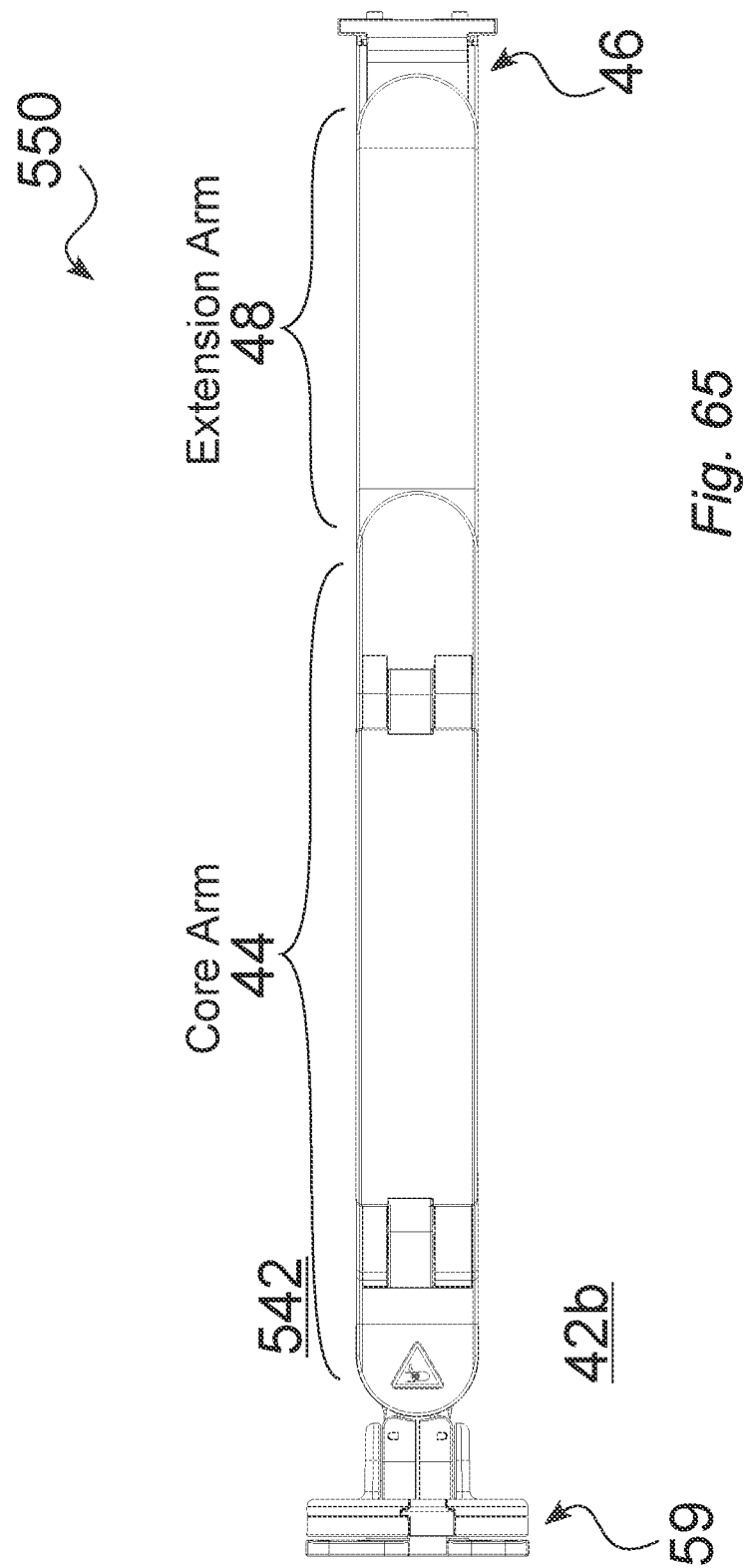
FIG. 65 is a top view of an illustrative tablet arm, with extension, in a horizontal position.
Figure 66:
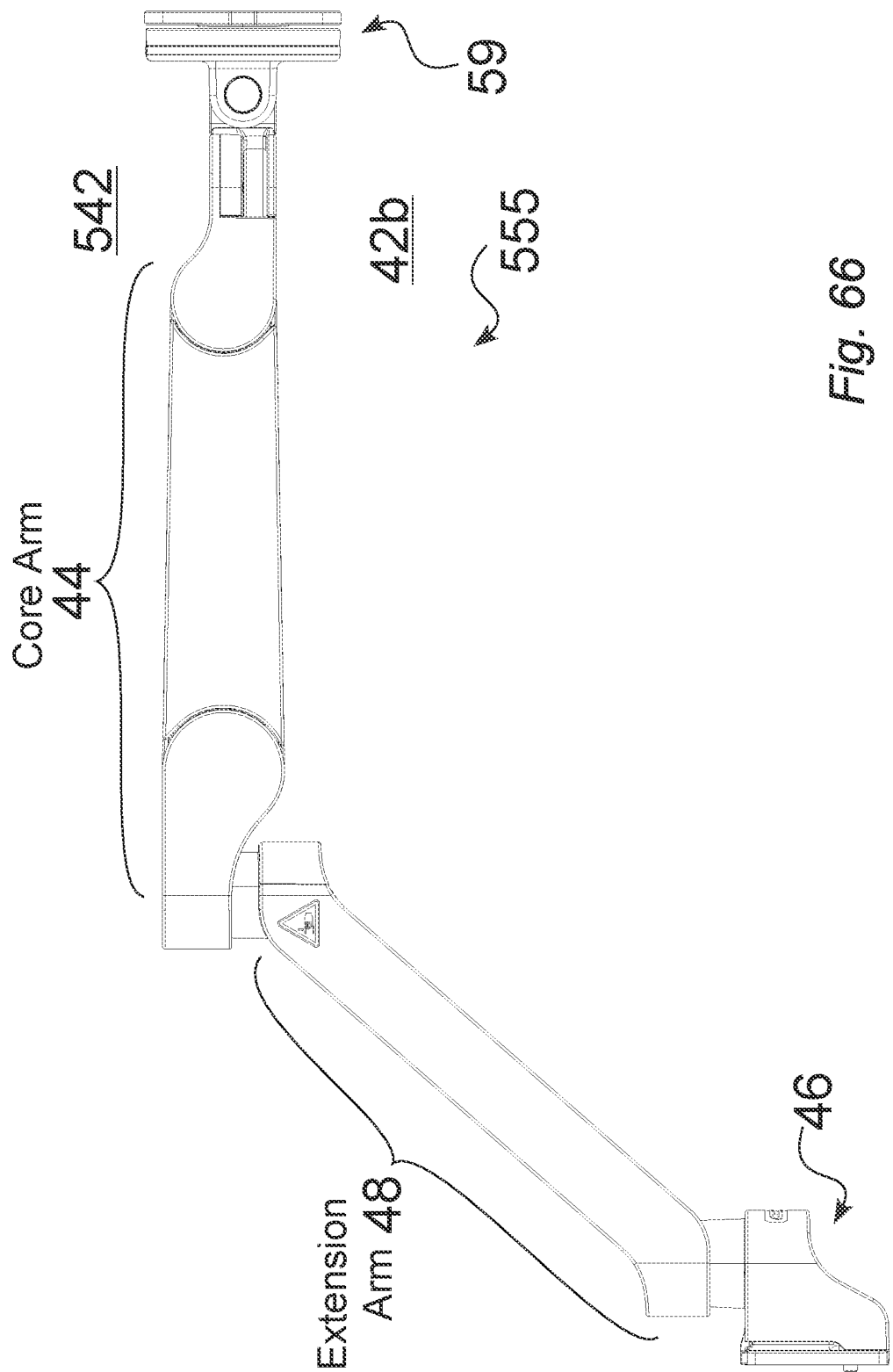
FIG. 66 is a right side view of an illustrative tablet arm, with extension, in a horizontal position.
Figure 67:
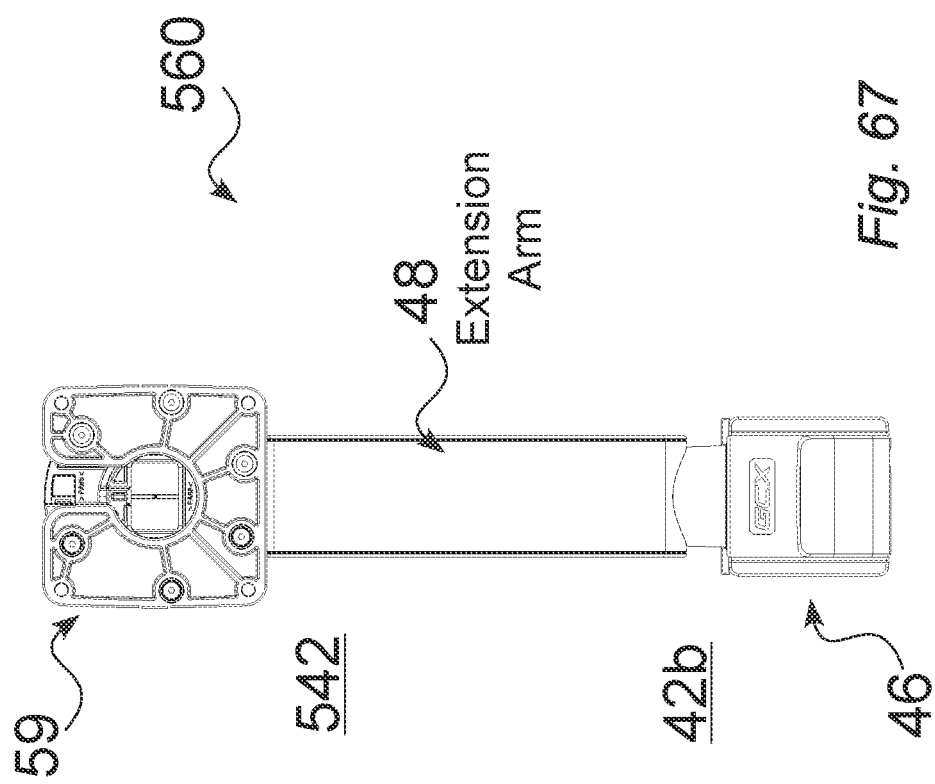
FIG. 67 is a front (tablet-side) view of an illustrative tablet arm, with extension, in a horizontal position.
Figure 68:
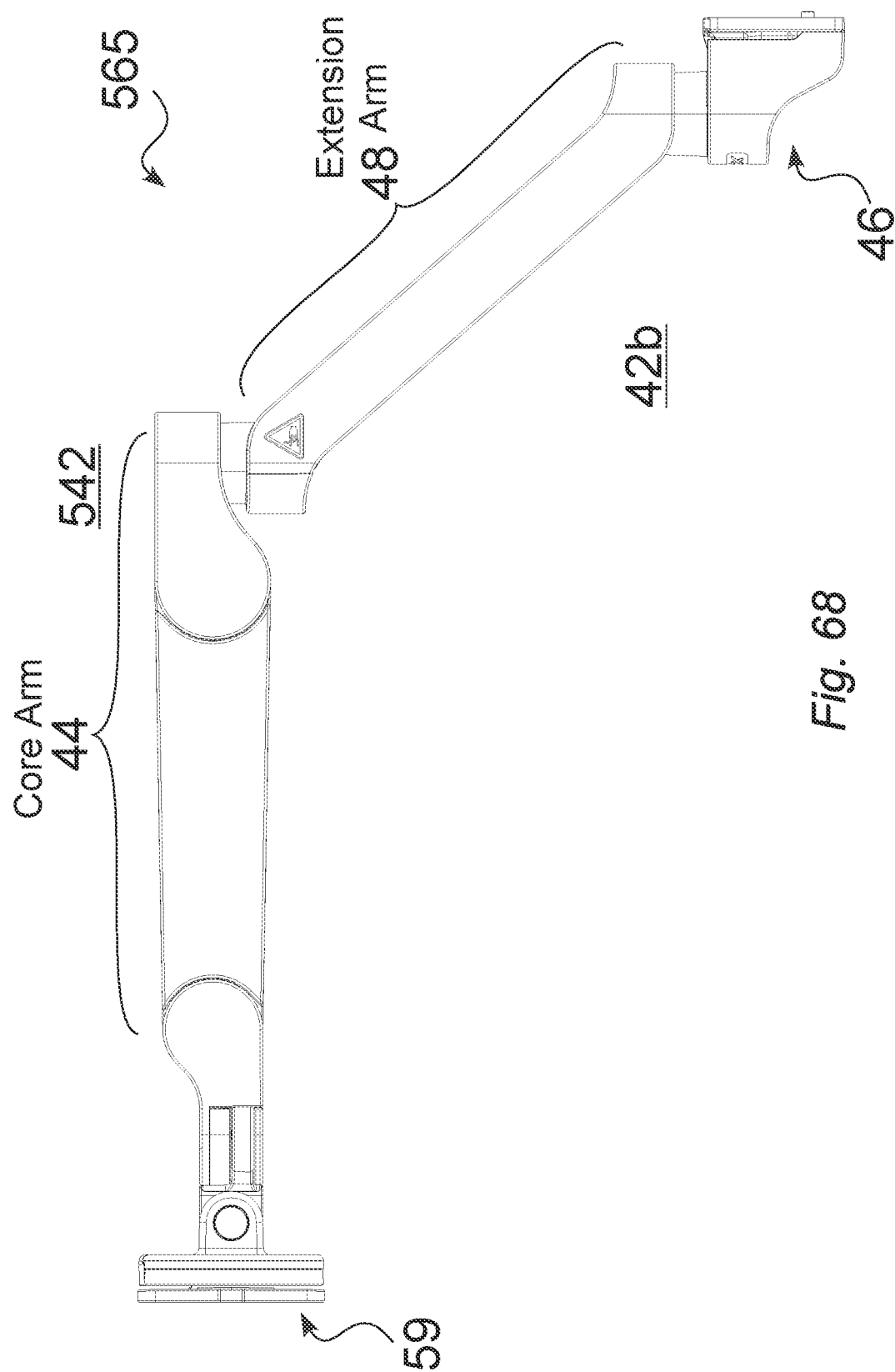
FIG. 68 is a left side perspective view of an illustrative tablet arm, with extension, in a horizontal position.
Figure 69:
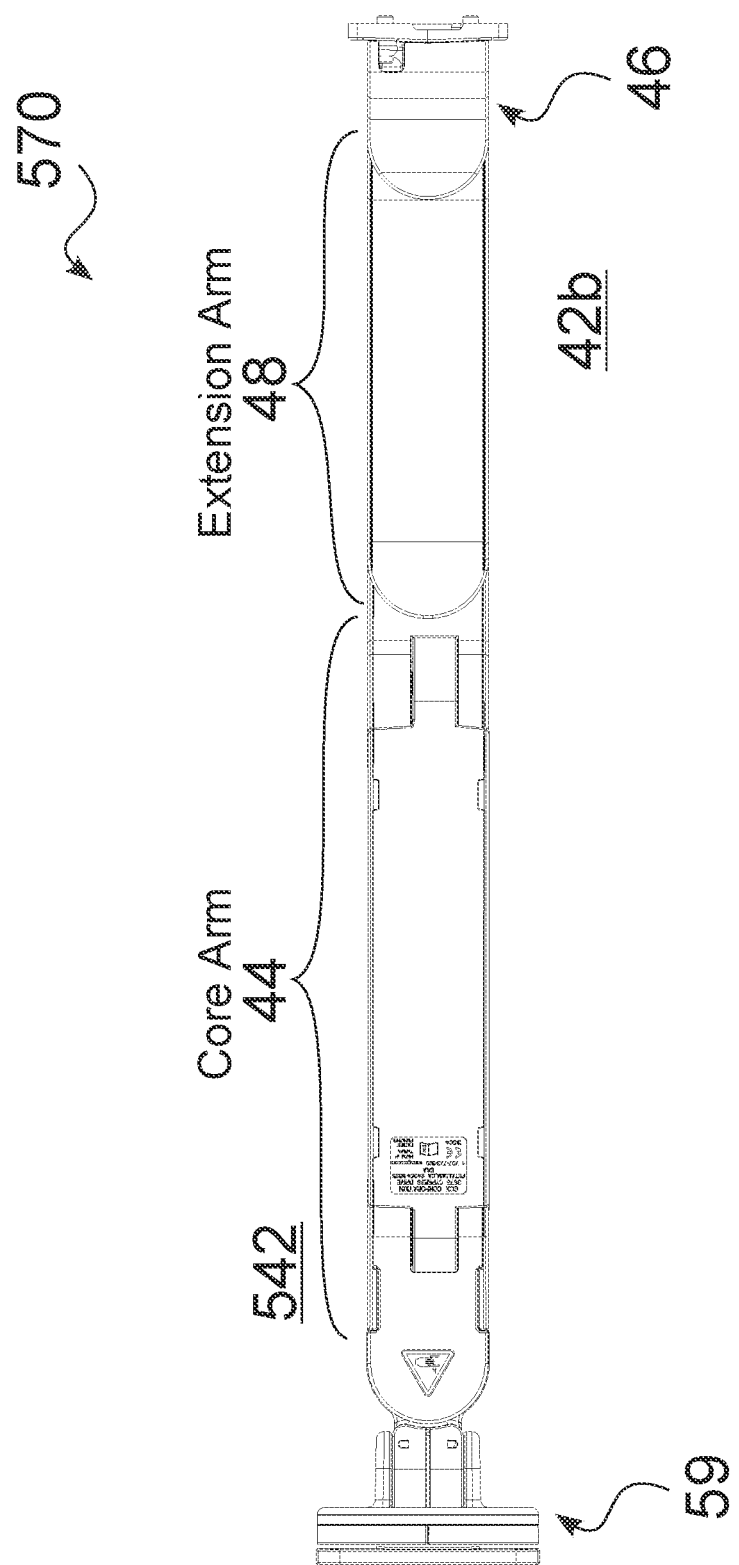
FIG. 69 is a bottom view of an illustrative tablet arm, with extension, in a horizontal position.

FIG. 63 is a front perspective view 540 of an illustrative tablet arm 42*b*, with extension 48, in a horizontal position 542. FIG. 64 is a rear perspective view 545 of an illustrative tablet arm 42*b*, with extension 48, in a horizontal position 542. FIG. 65 is a top view 550 of an illustrative tablet arm 42*b*, with extension 48, in a horizontal position 542. FIG. 66 is a right side view 555 of an illustrative tablet arm 42*b*, with extension 48, in a horizontal position 542. FIG. 67 is a front (tablet-side) view 560 of an illustrative tablet arm 42*b*, with extension 48, in a horizontal position 542. FIG. 68 is a left side perspective view 565 of an illustrative tablet arm 42*b*, with extension 48, in a horizontal position 542. FIG. 69 is a bottom view 570 of an illustrative tablet arm 42*b*, with extension 48, in a horizontal position 542.

Figure 70:
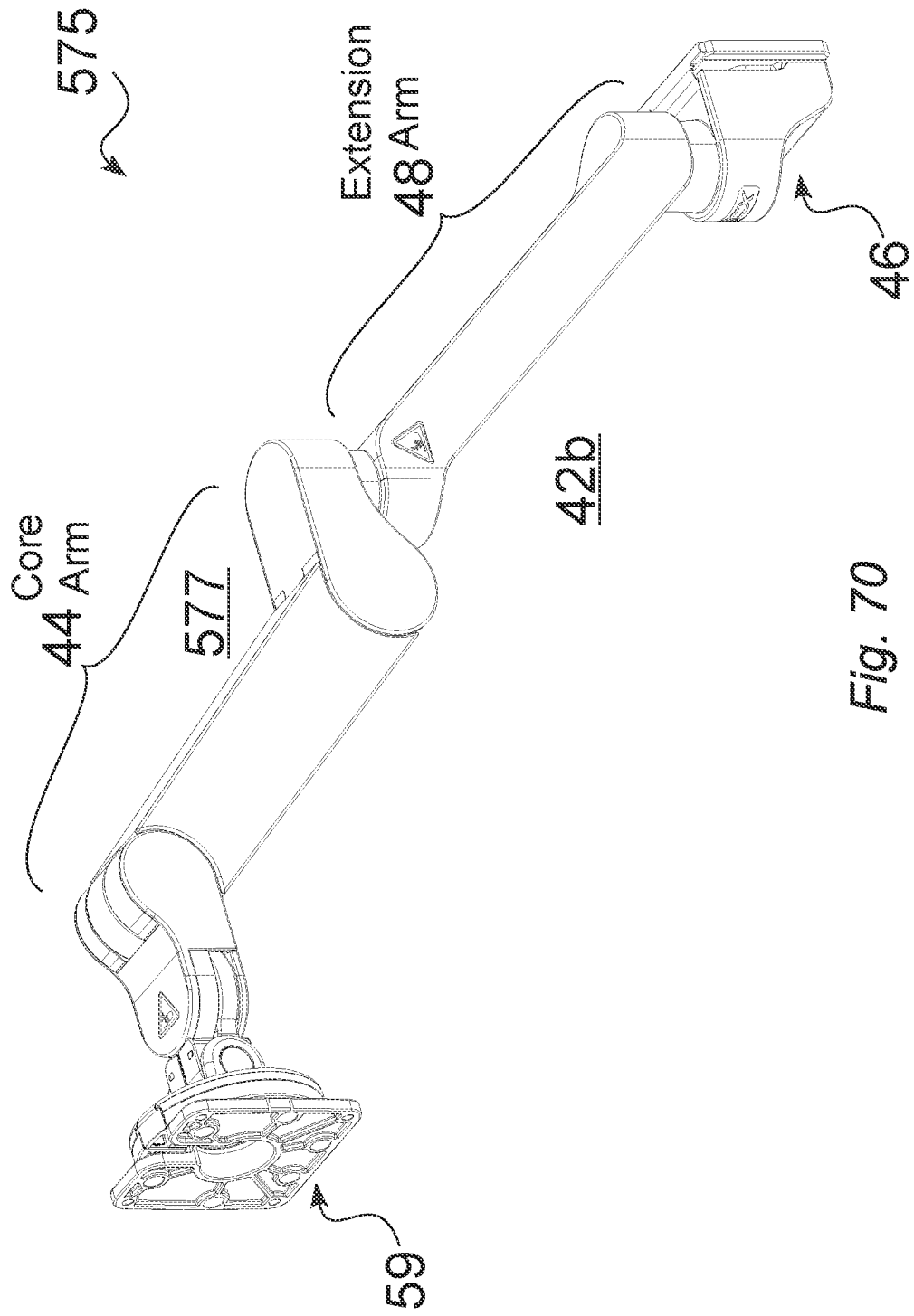
FIG. 70 is a front perspective view of an illustrative tablet arm, with extension, in an upward position.
Figure 71:
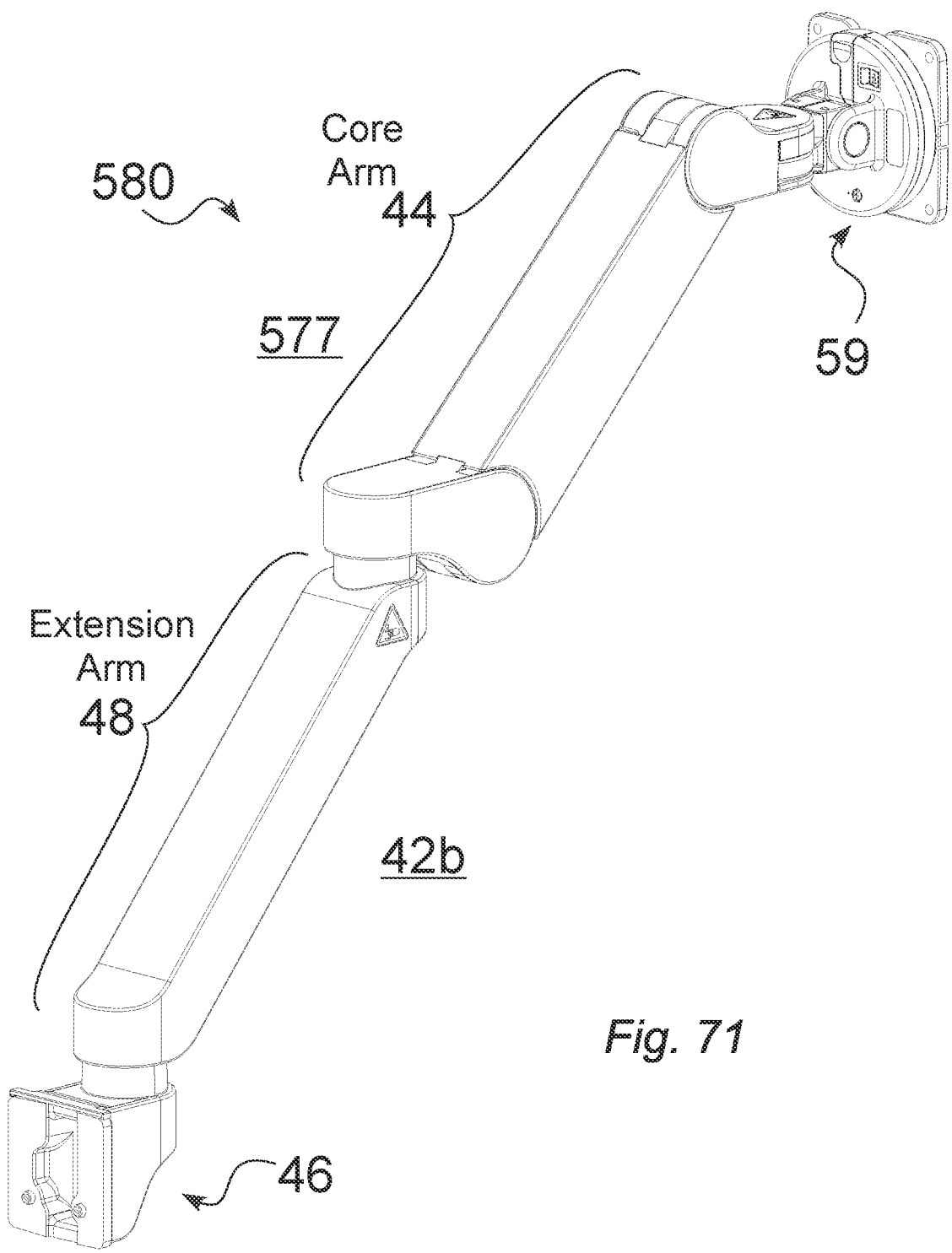
FIG. 71 is a rear perspective view of an illustrative tablet arm, with extension, in an upward position.
Figure 72:
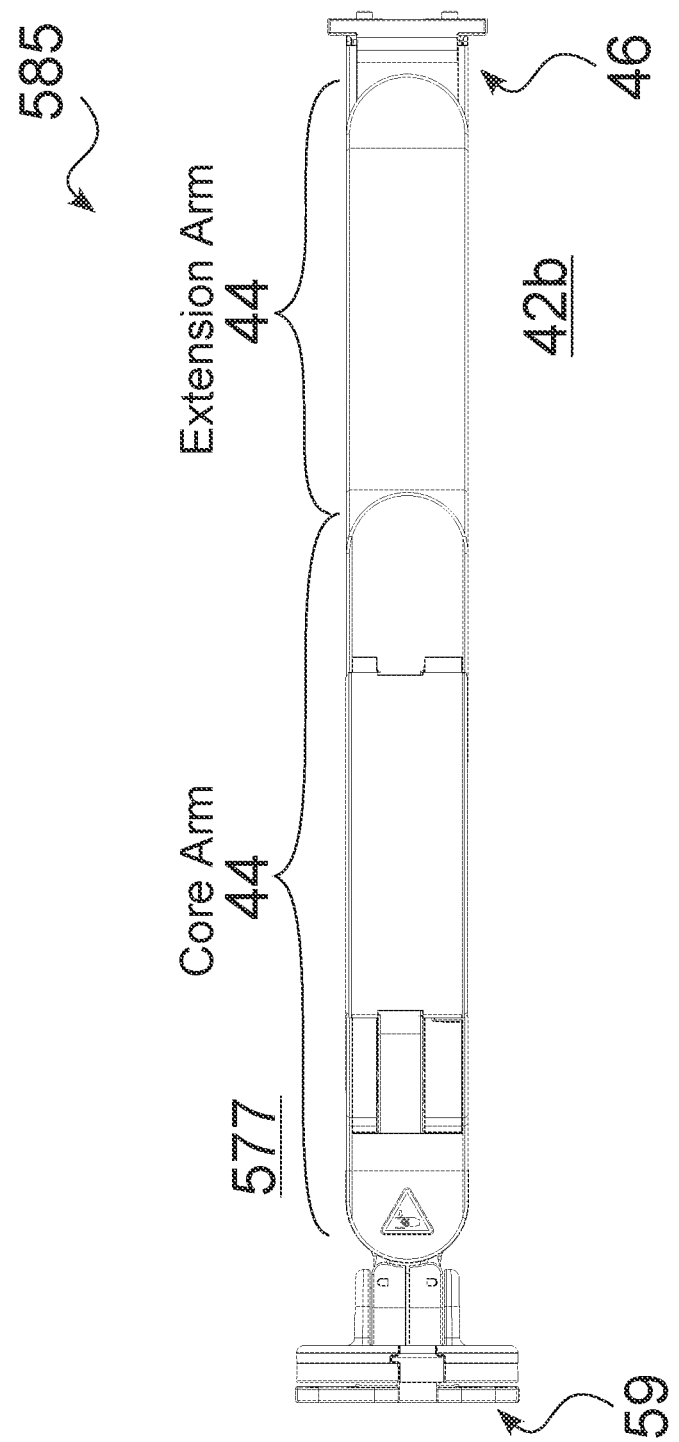
FIG. 72 is a top view of an illustrative tablet arm, with extension, in an upward position.
Figure 73:
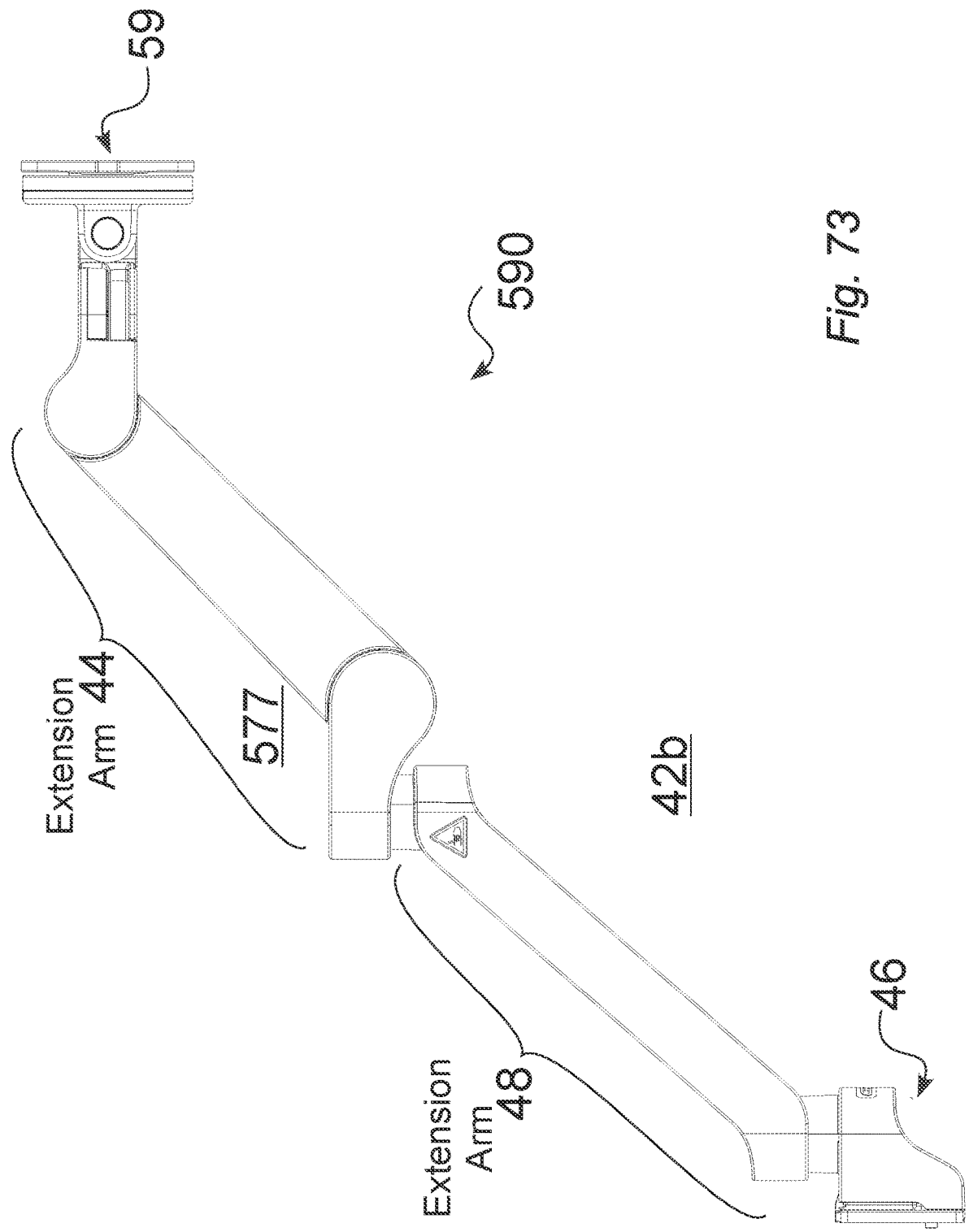
FIG. 73 is a right side view of an illustrative tablet arm, with extension, in an upward position.
Figure 74:
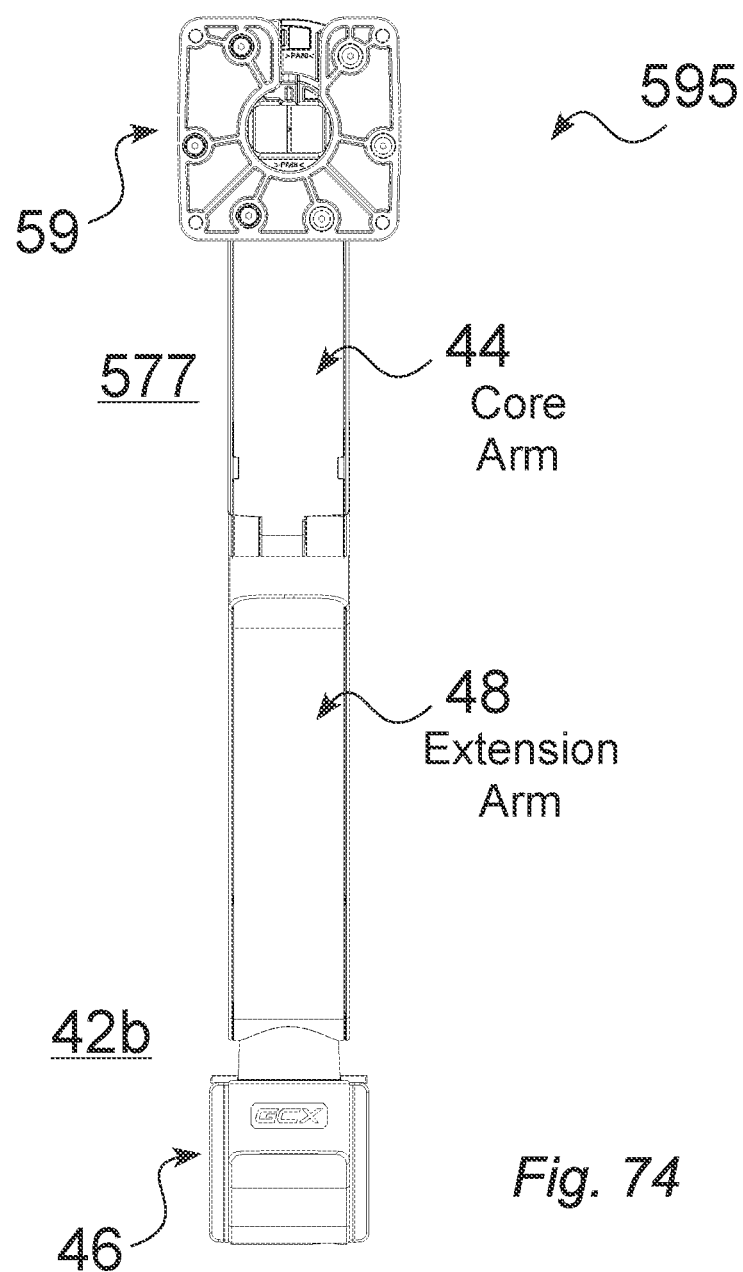
FIG. 74 is a front (tablet-side) view of an illustrative tablet arm, with extension, in an upward position.
Figure 75:
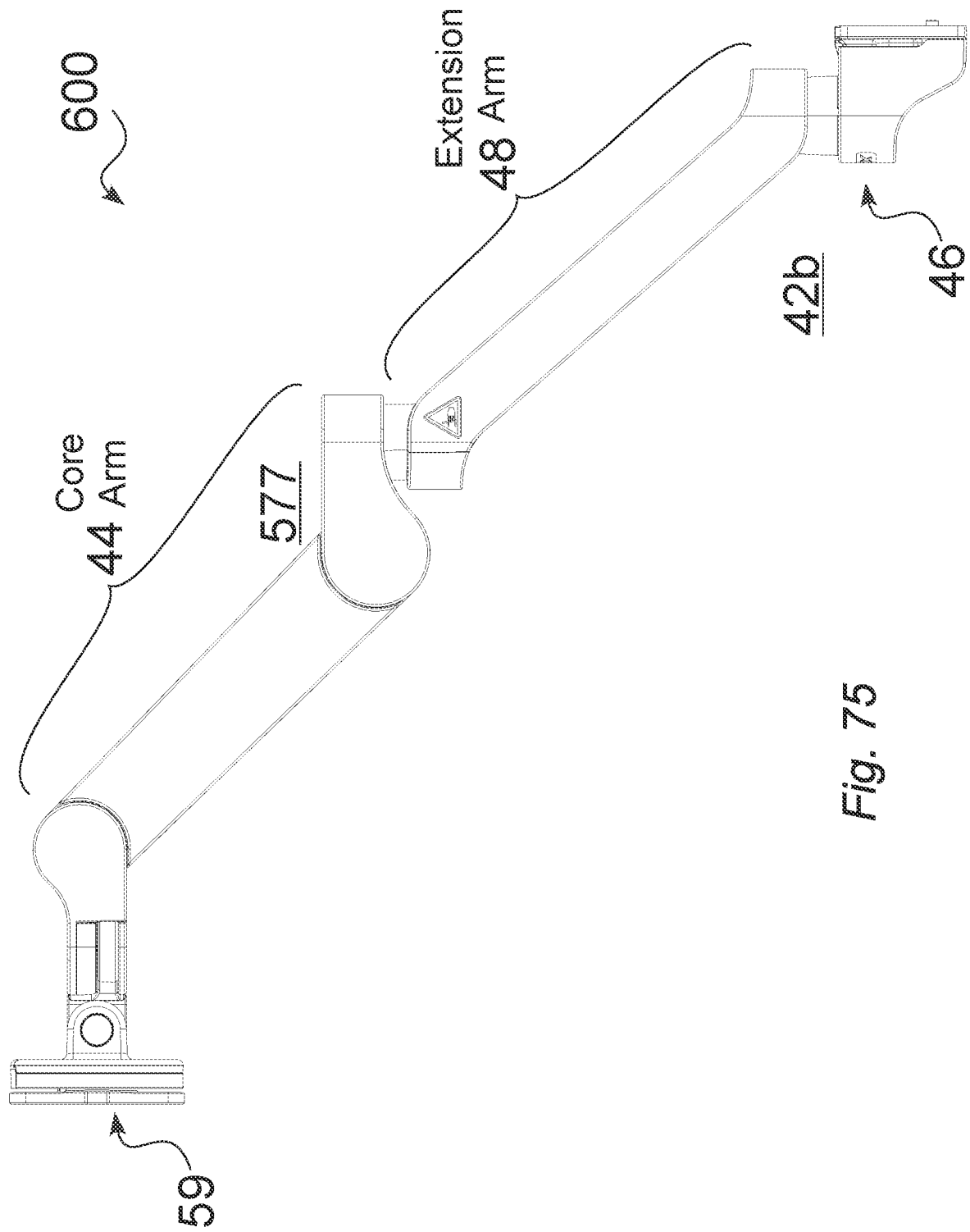
FIG. 75 is a left side perspective view of an illustrative tablet arm, with extension, in an upward position.
Figure 76:
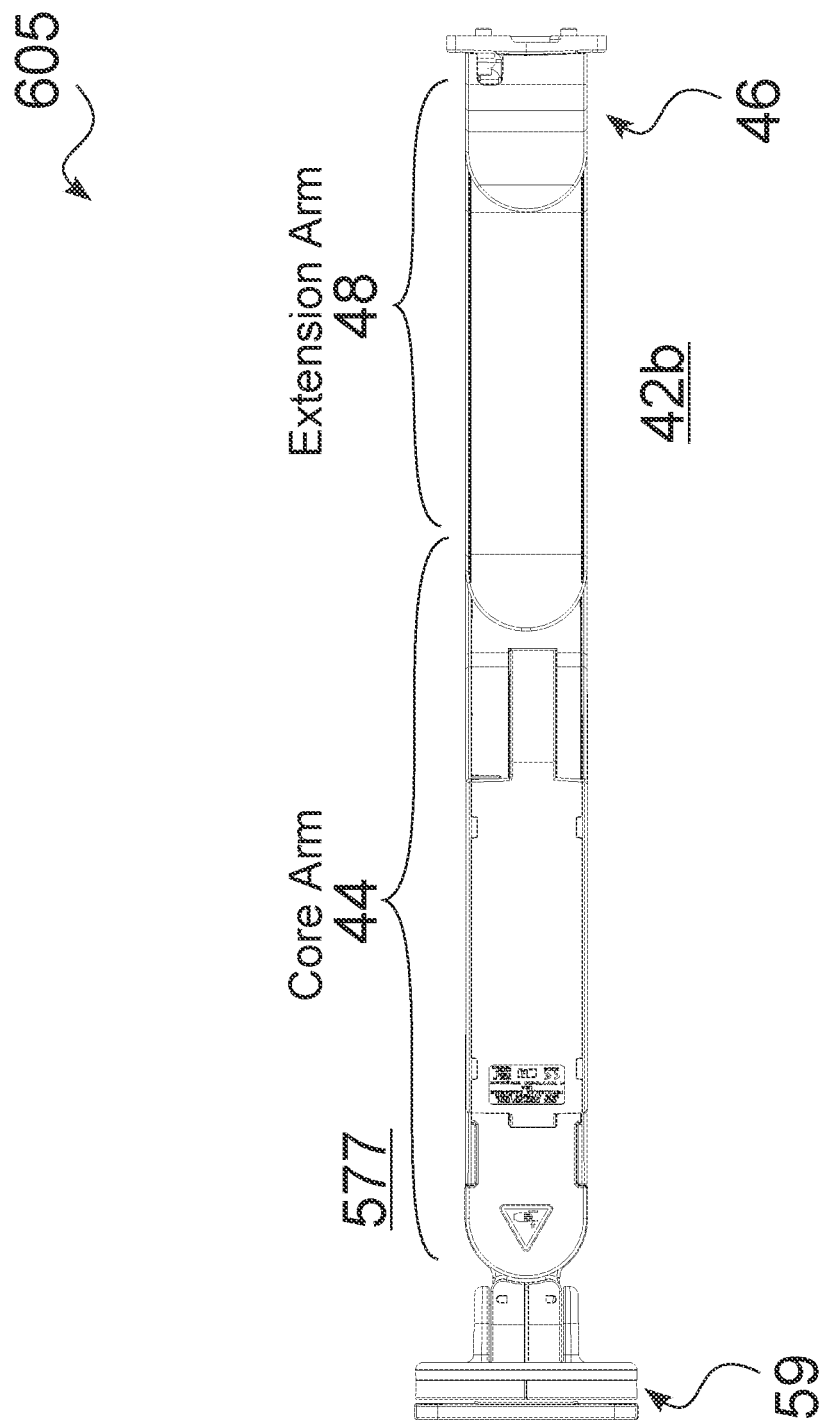
FIG. 76 is a bottom view of an illustrative tablet arm, with extension, in an upward position.

FIG. 70 is a front perspective view 575 of an illustrative tablet arm 42*b*, with extension 48, in an upward position 577. FIG. 71 is a rear perspective view 580 of an illustrative tablet arm 42*b*, with extension 48, in an upward position 577. FIG. 72 is a top view 585 of an illustrative tablet arm 42*b*, with extension 48, in an upward position 577. FIG. 73 is a right side view 590 of an illustrative tablet arm 42*b*, with extension 48, in an upward position 577. FIG. 74 is a front (tablet-side) view 577 of an illustrative tablet arm 42*b*, with extension 48, in an upward position 577. FIG. 75 is a left side perspective view 600 of an illustrative tablet arm 42*b*, with extension 48, in an upward position 577. FIG. 76 is a bottom view 605 of an illustrative tablet arm 42*b*, with extension 48, in an upward position 577.

Figure 77:
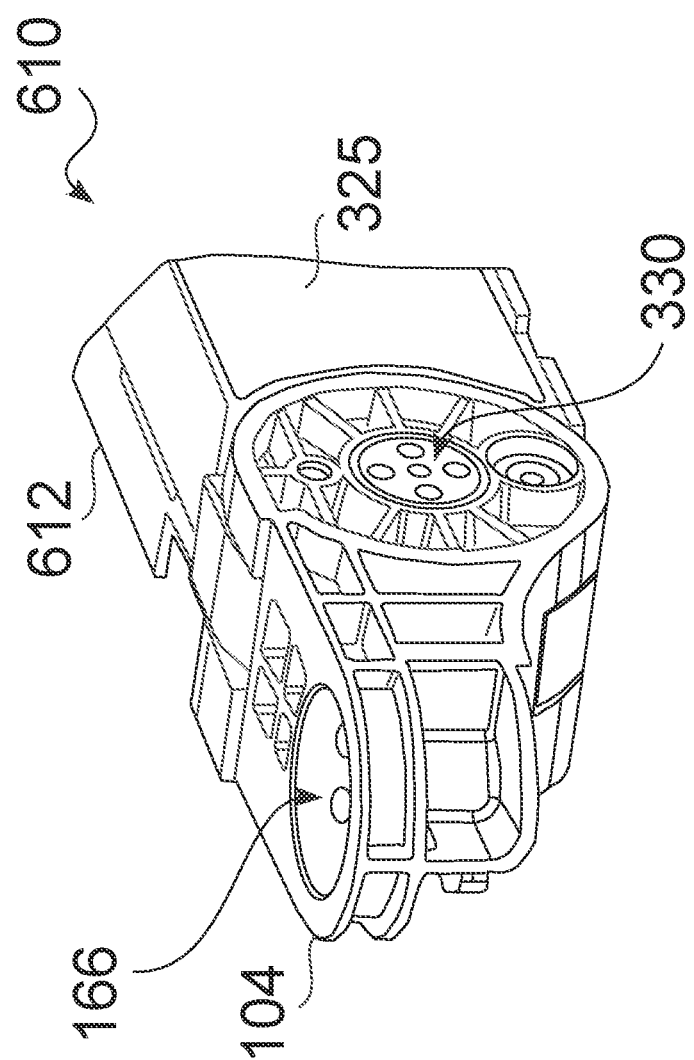
FIG. 77 shows an illustrative torque insert body in relation to the rear hinge of a core arm.
Figures 78, 79:
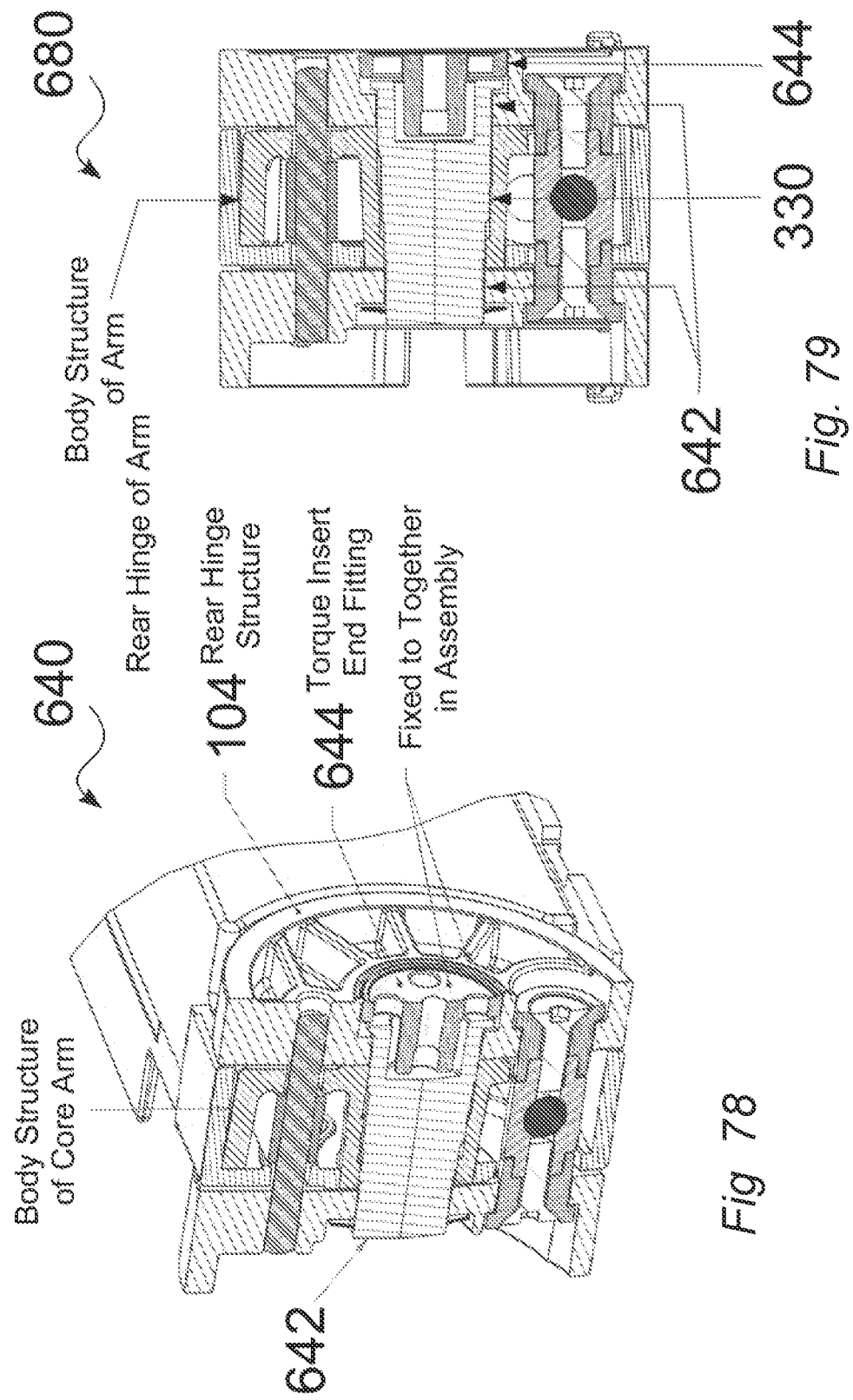
FIG. 78 is a partial cutaway view of an illustrative torque insert body in relation to the rear hinge of a core arm.
FIG. 79 is a side cutaway view of an illustrative torque insert body in relation to the rear hinge of a core arm.

FIG. 77 is a detailed view 610 that shows an illustrative torque insert body 330 in relation to the rear hinge structure 104 of a core arm 44. FIG. 78 is a partial cutaway view 640 of an illustrative torque insert body 330 in relation to the rear hinge structure 104 of a core arm 44. FIG. 79 is a side cutaway view 680 of an illustrative torque insert body 330 in relation to the rear hinge structure 104 of a core arm 44.

The illustrative embodiment seen in FIGS. 77 to 79 present details related to counterbalance and friction for the core arm 44. For instance, the end sections 642 of the torque insert body 330 function as the rear axle 328, while the rear hinge structure 104 pivot on the outer diameter surfaces of the torque insert body 330. The middle section of the torque insert body 330 is fixed to the body structure XX of the core arm 44. As such, the friction insert body is driven rotationally, by lever action, when the core arm 44 is moved up or down. The end fitting 644 of the torque insert body 330 remains fixed on the rear hinge structure 104, which pivots concentrically on the torque insert body 330.

FIG. 80 is a top view 700 showing illustrative body structure details of a core arm 44. FIG. 81 is a partial side cutaway view 720 showing illustrative body structure details of a core arm 44. FIG. 82 is a side view 740 showing illustrative body structure details of a core arm 44.

FIG. 83 is a detailed side view 800 of an illustrative torque insert for a core arm 44. FIG. 84 is a partial cutaway view 820 of an illustrative torque insert for a core arm 44. FIG. 85 is a lead end view 840 of an illustrative torque insert for a core arm 44. FIG. 86 is a head end view 860 of an illustrative torque insert for a core arm 44. FIG. 87 is a detailed view 870 of an illustrative torque insert for a core arm 44. FIG. 88 is an alternate detailed view 880 of an illustrative torque insert for a core arm 44.

The torque insert body end sections function as a rear axle. The rear hinge of the arm pivots on the outer diameter surfaces of the torque insert body. The torque insert body middle section is fixed to the body structure of the arm. As such, the friction insert body is driven rotationally, by lever action, when the arm is moved up or down. The end fitting remains fixed in the rear hinge, which is configured to pivot concentrically on the torque insert body. The torque insert end fitting is fixed to the rear arm hinge.

In some embodiments, the torque insert contains internal friction elements. A shaft is engaged in the friction elements. The shaft is configured to rotate in the housing only after a specific amount of minimum torque is applied. That is, differential rotation of the housing and end shaft results in pivoting friction at a specific torque between the two. Some of the unique features about the implementation of the torque insert is the design of the housing and end fitting, which allows the housing to also function as an axle, e.g., the rear axle 328, of the support arm 34. The end fitting is held fixed as the housing is rotated, and this results in a specific amount of friction torque in the rear axle joint. In some embodiments, the friction insert is available through Reell Precision Manufacturing Corporation, of St. Paul, MN.

Figure 89:
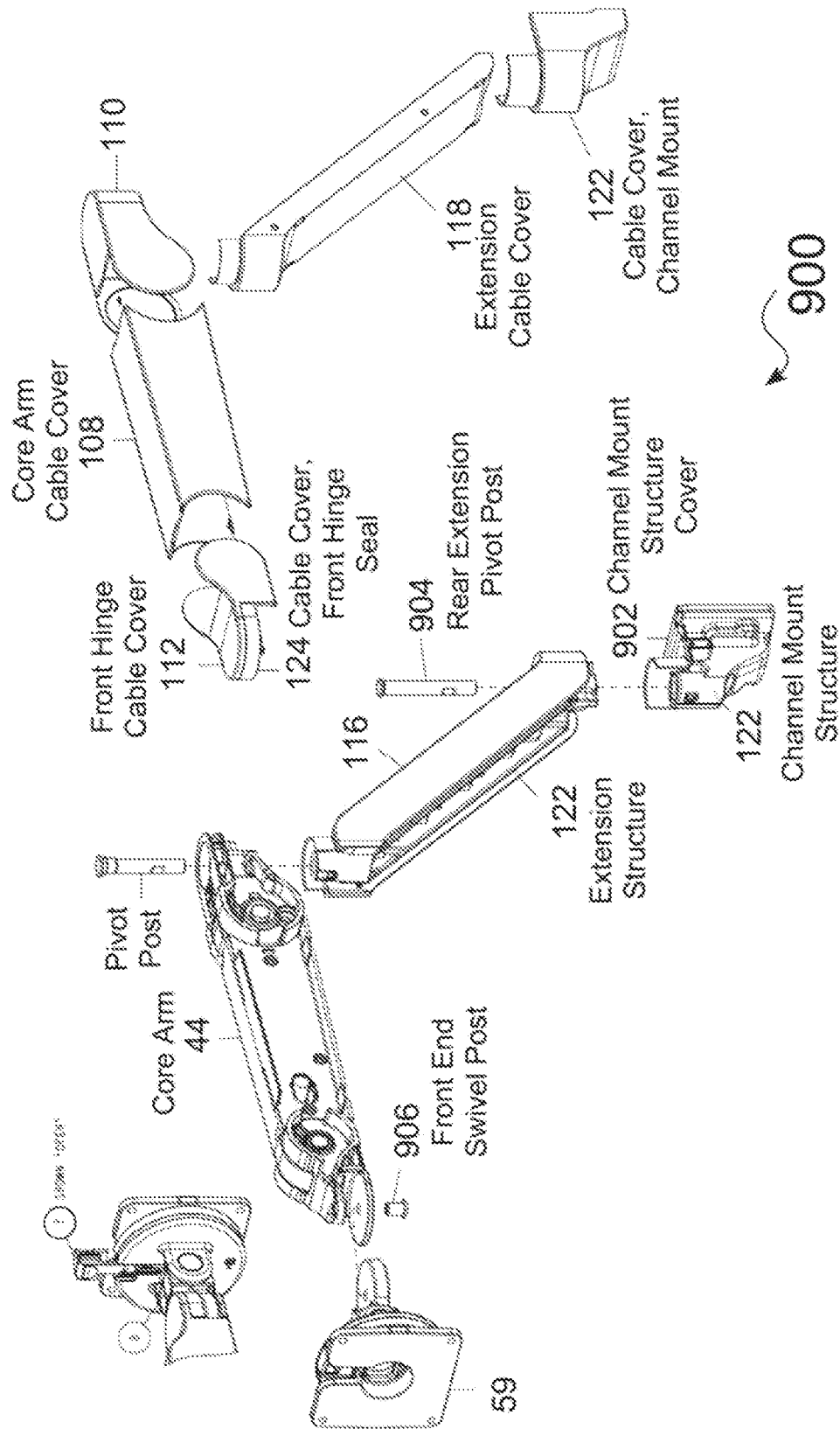
FIG. 89 shows expanded structural and out cover assembly views for an illustrative embodiment of a tablet arm that includes a rear extension and a channel mount.

FIG. 89 shows expanded structural and out cover assembly views 900 for an illustrative embodiment of a tablet arm 42*b* that includes a rear extension 48 and a channel mount 46. As seen in FIG. 89, a channel mount structure cover 902 can be mounted on the channel mount structure, while a rear extension pivot post 904 can be used to pivotably mount the extension structure 122 to the channel mount structure 122.

Figure 90:
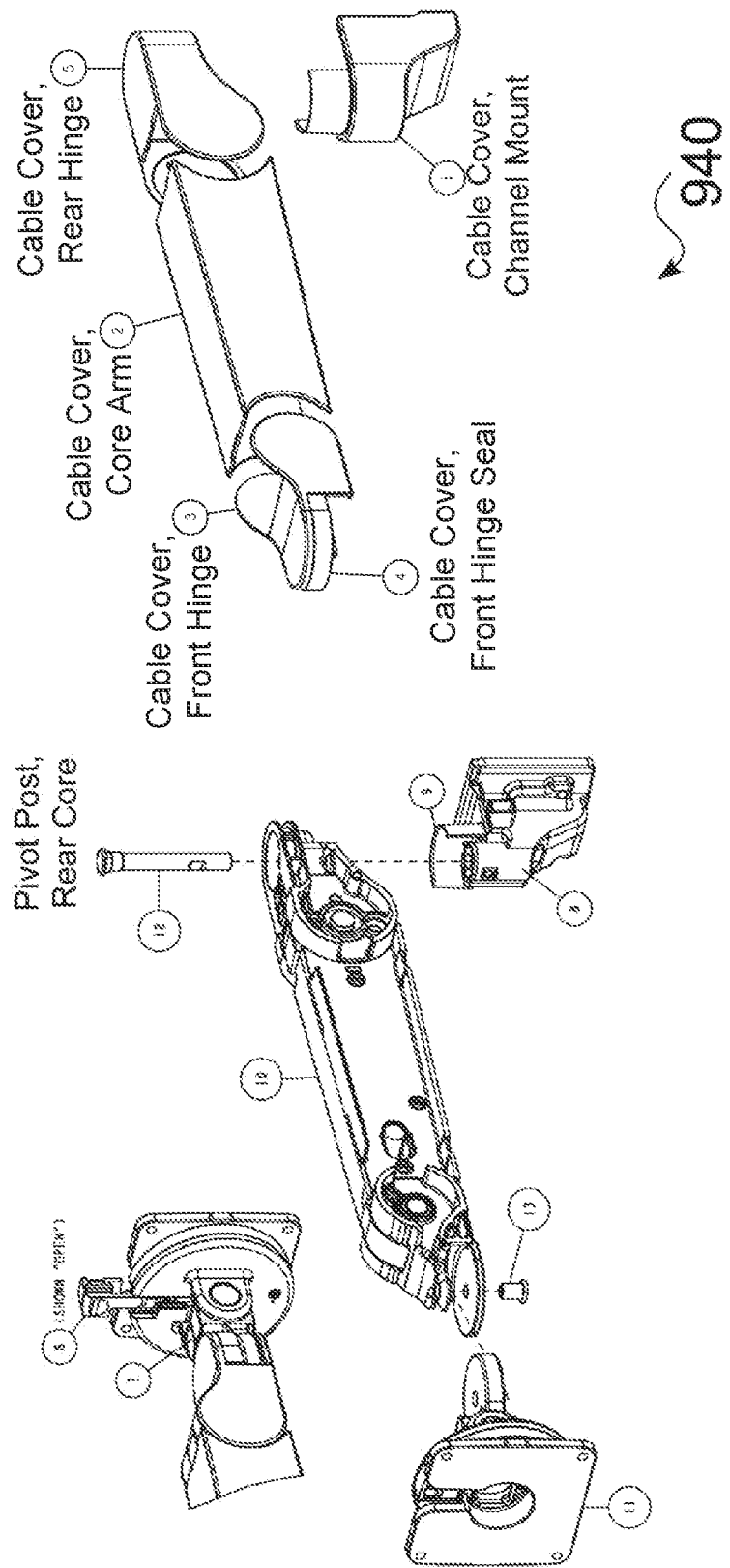
FIG. 90 shows expanded structural and out cover assembly views for an illustrative embodiment of a tablet arm, without a rear extension, having a channel mount.

FIG. 90 shows expanded structural and out cover assembly views for an illustrative embodiment of a tablet arm 42*a*, without a rear extension 48, having a channel mount 46.

Figure 93:
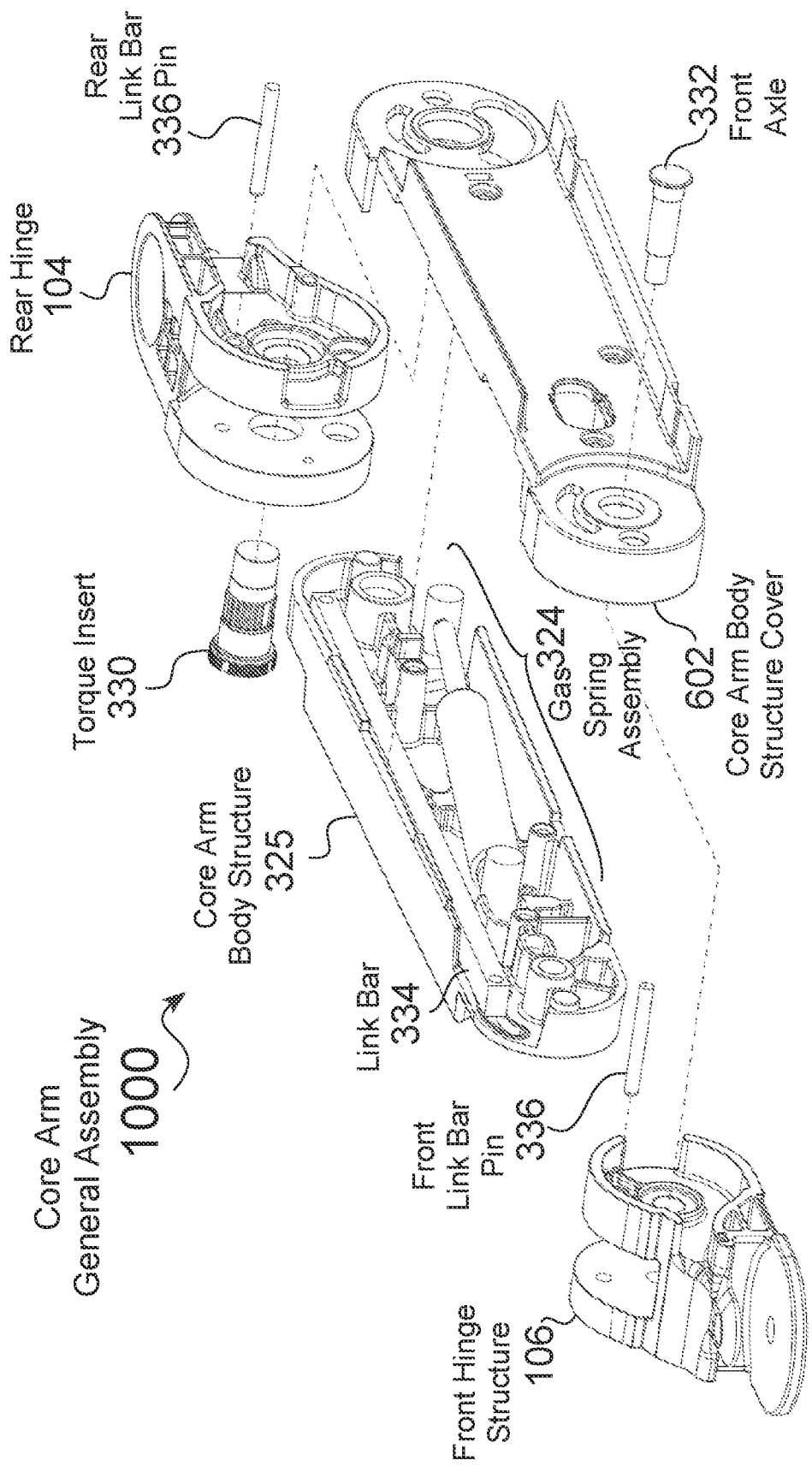
FIG. 93 is an expanded assembly view of an illustrative embodiment of a core arm.

FIG. 91 is a first completed assembly view 960 of an illustrative core arm 44. FIG. 92 is a second completed assembly view 980 of an illustrative core arm 44. FIG. 93 is an expanded assembly view 1000 of an illustrative embodiment of a core arm.

Figure 94:
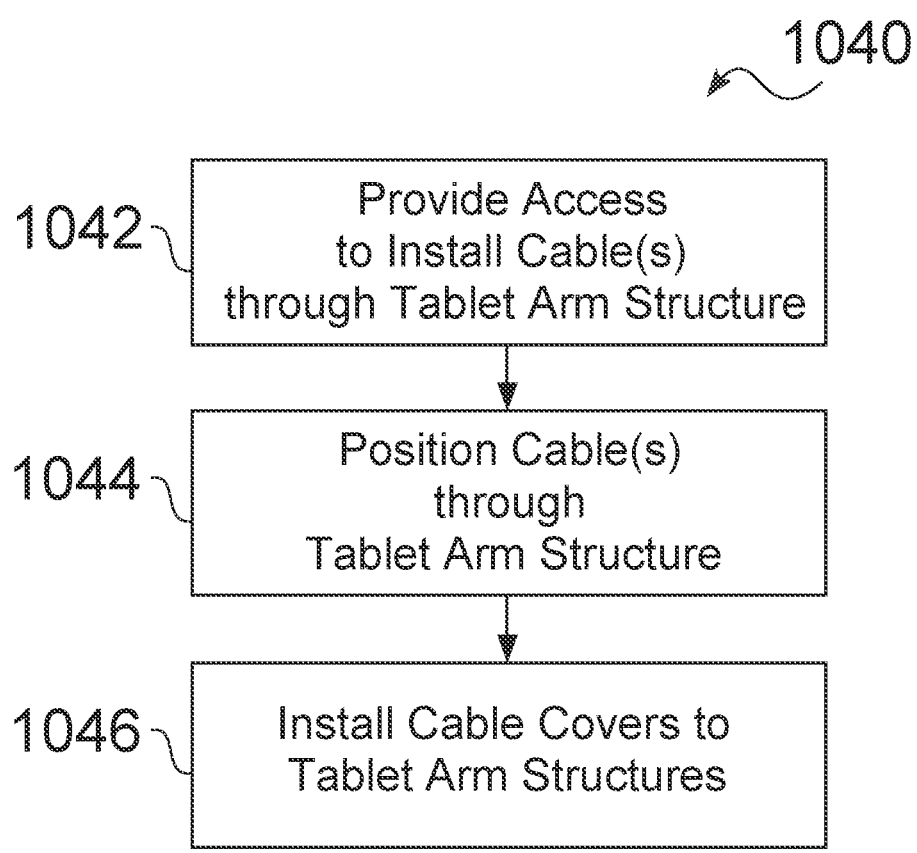
FIG. 94 is a flowchart of an illustrative method for installing a cable for a tablet arm.

FIG. 94 is a flowchart of an illustrative method 1040 for installing a cable 130 for a tablet arm 42, for either embodiments 42b that include an extension arm 48, as shown, or similarly for embodiments 42a that do not include an extension arm 48. For instance, during the installation of a tablet arm 42, the user U can attach the rear mount 46, such as to a corresponding channel mount, such that the user U can access the structures of the tablet arm, with the cable covers removed. A wall-channel mounted tablet support arm 42 readily provides access to install or remove an interconnecting cable 130, when the outer covers are removed.

One or more components can include compliant rubber or polymer seals, such as around the rotating edges of the covers, and/or in relation to the routing of one or more cables. A user, such as during manufacturing or on site, can readily install a cable 130 through a mount arm structure, for either embodiments that include an extension arm 48, as shown, or similarly for embodiments that do not include an extension arm 48.

In the illustrative method 1040 shown in FIG. 94, once the user U can access 1042 to the tablet arm structures, the user can then position the cable 130 through the structures, such as between the front mount 58, i.e., the tablet end of the support structure, and the rear mount 46, i.e., the mounting end of the support structure.

In some embodiments, the cables 130 can generally pass through the axes of joint rotation (or as near to as possible within other design constraints). In some embodiments, there are no exposed cable service loops, which can keep them clean, out of harm's way, out of patients' (especially children's) reach allowing more effective and safe technology deployment to a broader demographic. In some embodiments, the asymmetrical arrangement of gas spring mechanism 324 (FIG. 33) allows space on "side" to run the cables 130.

In some embodiments, easily attachable/detachable covers allow efficient installation and maintenance. On some embodiments, access and maintenance can be accomplished in a matter of minutes. In contrast, for embodiments of structural arms that have all-internal cabling, the process of installing or replacing cable is so onerous that it is restricted to factory work or hours of field work. Embodiments having an asymmetrical arrangement disclosed herein can effectively isolate the cables 130 from the "works" of the tablet arm 42, so as to minimize their exposure to harm/damage.

In the illustrative method 1040 shown in FIG. 94, once the cable 130 is positioned 144 through the structure, the cable covers can be installed. For instance, for an illustrative embodiment of a tablet arm 42a that includes an extension arm 48, a user U can sequentially install the cable mount channel cover 122 (FIG. 8), the extension arm cable cover 118, the rear hinge cable cover 110, the core arm cable cover 108, the front hinge cable cover 112, the front hinge cable cover seal 124, and a cable channel seal 134 (FIG. 8). In some embodiments, one or more components can include compliant rubber or polymer seals, such as around the rotating edges of the covers, and/or in relation to the routing of one or more cables 130. The illustrative method 140 shown in FIG. 94 can readily be performed during manufacturing or on site. In some current embodiments, the outer covers can snap in place, without fasteners, and can be configured to prevent or resist contamination within the environment in which the support arm is used.

The above description and drawings are illustrative and are not to be construed as limiting. Numerous specific details are described to provide a thorough understanding of the disclosure. However, in certain instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed above, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any term discussed herein is illustrative only, and is not intended to further limit the scope and meaning of the disclosure or of any exemplified term. Likewise, the disclosure is not limited to various embodiments given in this specification.

Unless contrary to physical possibility, it is envisioned that (i) the methods/steps described above may be performed in any sequence and/or in any combination, and that (ii) the components of respective embodiments may be combined in any manner.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the claims disclosed herein. Accordingly, the specification and drawings are to be regarded in an illustrative sense rather than a restrictive sense.

What is claimed is:

1. A pivoting display screen support arm, comprising:
an arm structure that houses a power cable channel that fully conceals a cable from view as the cable tracks a length of the pivoting display screen support arm, the aim structure including removable panels that enable access to arrangement of the cable within the arm structure; and a lateral swivel joint and a vertical swivel joint that joins the arm structure to a base aim structure including a pivot post concealed within a hinge structure, wherein the power cable channel continues to pass through the axes of joint rotation or adjacent thereto of the lateral swivel joint and the vertical swivel joint, and the pivot post including a swivel stop disc, wherein a stop face of the swivel stop disc acts as a rotation limiter in a circular track or tunnel.

2. The pivoting display screen support arm of claim 1, wherein the circular track or tunnel is dynamically formed based on the swivel stop disc.

3. The pivoting display screen support arm of claim 2, wherein the lateral swivel joint includes the hinge structure, and a floating stop key.

4. The pivoting display screen support arm of claim 3, wherein a range of rotation of the lateral swivel joint is defined by a difference between a sum of an angle length of the circular track or tunnel and an angle length of the swivel stop disc, and twice an angle length of the floating stop key.

5. The pivoting display screen support arm of claim 1, further including a spring element.

6. The pivoting display screen support arm of claim 5, wherein the spring element is configured to provide a gas spring counterbalance force.

7. The pivoting display screen support arm of claim 5, wherein the spring element is a non-adjustable gas spring counterbalance force including a non-adjustable friction pack element.

8. The pivoting display screen support arm of claim 7, wherein the non-adjustable friction pack element provides resistance to offset a sink or float caused by a weight of a payload.

9. The pivoting display screen support arm of claim 7, wherein the non-adjustable friction pack element is integrated with either or both of a rear axle or a front axle of the arm structure.

10. The pivoting display screen support arm of claim 1, further comprising:
a front mount structure that is operable to rotate clockwise or counterclockwise with respect to the pivoting display screen support arm.

11. A method of using the pivoting display screen support arm of claim 1, comprising:
installing the cable in the power cable channel; and
rotating the pivoting display screen support arm about the lateral swivel joint 360 degrees without tangling the cable via a sliding action of components on the circular track or tunnel.

12. A pivoting display screen support arm, comprising:
an arm structure that houses a power cable channel that fully conceals a cable from view as the cable tracks a length of the pivoting display screen support arm, the arm structure including removable panels that enable access to arrangement of the cable within the arm structure; and
a lateral swivel joint that has a range of rotation that cannot exceed 360 degrees based on an angle length of a track or tunnel, an angle length of a joint rotation stop structure, and an angle length of a floating stop key, wherein the floating stop key is movable within the track or tunnel, and wherein the power cable channel continues to pass adjacent to axes of rotation of a concealed pivot post of the lateral swivel joint.

13. The pivoting display screen support arm of claim 12, wherein the circular track or tunnel is dynamically formed based on the floating stop key and the joint rotation stop structure.

14. The pivoting display screen support arm of claim 12, further including a spring element.

15. The pivoting display screen support arm of claim 14, wherein the spring element is configured to provide a gas spring counterbalance force.

16. The pivoting display screen support arm of claim 14, wherein the spring element is a non-adjustable gas spring counterbalance force including a non-adjustable friction pack element.

17. The pivoting display screen support arm of claim 16, wherein the non-adjustable friction pack element provides resistance to offset a sink or float caused by a weight of a payload.

18. The pivoting display screen support arm of claim 16, wherein the non-adjustable friction pack element is integrated with either or both of a rear axle or a front axle f the arm structure.

19. The pivoting display screen support arm of claim 12, further comprising:
a front mount structure that is operable to rotate clockwise or counterclockwise with respect to the pivoting display screen support arm.

\* \* \* \* \*